US010508358B2

United States Patent

(12) United States Patent
Josell et al.

(10) Patent No.: US 10,508,358 B2
(45) Date of Patent: Dec. 17, 2019

(54) PROCESS FOR FORMING A TRANSITION ZONE TERMINATED SUPERCONFORMAL FILLING

(71) Applicant: Government of the United States of America, as Represented by the Secretary of Commerce, Gaithersburg, MD (US)

(72) Inventors: Daniel Josell, N. Potomac, MD (US); Thomas P. Moffat, Gaithersburg, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 38 days.

(21) Appl. No.: 15/489,089

(22) Filed: Apr. 17, 2017

(65) Prior Publication Data

US 2018/0298514 A1 Oct. 18, 2018
US 2019/0284714 A9 Sep. 19, 2019

Related U.S. Application Data

(63) Continuation of application No. 15/146,888, filed on May 4, 2016, which is a continuation-in-part of (Continued)

(51) Int. Cl.
*C25D 21/12* (2006.01)
*C25D 7/12* (2006.01)
(Continued)

(52) U.S. Cl.
CPC ............... *C25D 21/12* (2013.01); *C25D 3/12* (2013.01); *C25D 3/48* (2013.01); *C25D 5/02* (2013.01);
(Continued)

(58) Field of Classification Search
CPC . C25D 21/12; C25D 3/48; C25D 3/12; C25D 7/123; H01L 21/2885
See application file for complete search history.

(56) References Cited

U.S. PATENT DOCUMENTS 6,776,891 B2 8/2004 Chen et al.
8,273,233 B2 9/2012 Chen et al.
(Continued)

OTHER PUBLICATIONS

D. Josell, D. Wheeler, and T. P. MoffatModeling Extreme Bottom-Up Filling of Through Silicon ViasJ. Electrochem. Soc. 2012 159(10): D570-D576; doi:10.1149/2.009210jes (Year: 2012).*
(Continued)

*Primary Examiner* — Louis J Rufo
(74) *Attorney, Agent, or Firm* — Office of Chief Counsel for National Institute of Standards and Technology

(57) ABSTRACT

Forming a transition zone terminated superconformal filling in a recess includes: providing an electrodeposition composition including: a metal electrolyte including a plurality of metal ions, solvent, and suppressor; providing the article including: a field surface and the recess that includes a distal position and a proximate position; exposing the recess to the electrodeposition composition; potentiodynamically controlling an electric potential of the recess with a potential wave form; bifurcating the recess into an active metal deposition region and a passive region; forming a transition zone; decreasing the electric potential of the recess by the potential wave form; progressively moving the transition zone closer to the field surface and away from the distal position; and reducing the metal ions and depositing the metal in the active metal deposition region and not in the passive region to form the transition zone terminated superconformal filling in the recess of the substrate.

18 Claims, 41 Drawing Sheets

Related U.S. Application Data application No. 14/012,830, filed on Aug. 28, 2013, now Pat. No. 9,580,828, and application No. 15/489,089, which is a continuation-in-part of application No. 14/812,134, filed on Jul. 29, 2015.

(60) Provisional application No. 62/165,360, filed on May 22, 2015, provisional application No. 61/701,818, filed on Sep. 17, 2012, provisional application No. 62/194,320, filed on Jul. 20, 2015.

(51) Int. Cl.

| | |
|---|---|
| ***C25D 3/12*** | (2006.01) |
| ***C25D 3/48*** | (2006.01) |
| ***C25D 5/02*** | (2006.01) |
| ***C25D 5/18*** | (2006.01) |
| ***H01L 21/288*** | (2006.01) |

(52) U.S. Cl.

CPC ............... *C25D 5/18* (2013.01); *C25D 7/123* (2013.01); *H01L 21/2885* (2013.01)

(56) References Cited

U.S. PATENT DOCUMENTS

| | | | | |
|---|---|---|---|---|
| 2003/0178315 | A1* | 9/2003 | Taylor ...................... | C25D 5/18 205/103 |
| 2006/0175201 | A1* | 8/2006 | Hafezi ..................... | C25D 5/18 205/102 |
| 2006/0213778 | A1* | 9/2006 | Cheng ...................... | C25D 5/02 205/105 |
| 2009/0018805 | A1 | 1/2009 | Weber et al. | |
| 2009/0166804 | A1 | 7/2009 | Gardner et al. | |
| 2011/0284386 | A1* | 11/2011 | Willey ..................... | C25D 3/38 205/96 |
| 2013/0140681 | A1 | 6/2013 | Kelly et al. | |

OTHER PUBLICATIONS

Hoe Chul Kim, Myung Jun Kim, Youngran Seo, Yoonjae Lee, Seunghoe Choe, Young Gyu Kim, Sung Ki Cho, and Jae Jeong KimBottom-up Filling of TSV-Scaled Trenches by Using Step Current ElectrodepositionECS Electrochem. Lett. 2015 4(10): D31-D34; doi:10.1149/2.0061510eel (Year: 2015).*

Kim et al., Electrodeposition of Ni in Submicrometer Trenches, J. of the Electrochemical Society, 2007, D443-D451, 155 (9).

Y. Sverdlov et al., The electrodeposition of cobalt-nickel-iron high aspect ratio thick film structures for magnetic MEMS applications, Microelectronic Engineering, 2004, 258-265, 76.

C. H. Lee et al., Magnetic Materials for Three-Dimensional Damascene Metallization: Void-Free Electrodeposition of Ni and Ni70Fe30 Using 2-Mercapto-5-benzimidazolesulfonic Acid, J. of the Electrochemical Society, 2008, D499-D507, 155 (7).

C. H. Lee et al., Superconformal Electrodeposition of Co and Co—Fe Alloys Using 2-Mercapto-5-benzimidazolesulfonic Acid, 2009, D301-D309, 156 (8).

* cited by examiner

PROCESS FOR FORMING A TRANSITION ZONE TERMINATED SUPERCONFORMAL FILLING

STATEMENT REGARDING FEDERALLY SPONSORED RESEARCH

This invention was made with United States Government support from the National Institute of Standards and Technology. The Government has certain rights in the invention.

BRIEF DESCRIPTION

Disclosed is a process for forming a transition zone terminated superconformal filling in a recess of an substrate by electrodepositing metal, the process comprising: providing an electrodeposition composition comprising: a metal electrolyte comprising a plurality of metal ions and a solvent; and a suppressor disposed in the solvent; providing the substrate comprising: a field surface; and the recess disposed in the substrate, the recess comprising a distal position and a proximate position relative to the field surface of the substrate; exposing the recess to the electrodeposition composition; potentiodynamically controlling an electric potential of the recess with a potential wave form; bifurcating the recess into an active metal deposition region and a passive region in response to potentiodynamically controlling the electric potential; forming, in response to bifurcating the recess, a transition zone at an interface of the active metal deposition region and the passive region; decreasing the electric potential of the recess by the potential wave form; progressively moving the transition zone closer to the field surface and away from the distal position in response to decreasing the electric potential; and reducing the metal ions to form metal and depositing the metal in the active metal deposition region and not in the passive region to form the transition zone terminated superconformal filling in the recess of the substrate, the transition zone terminated superconformal filling being: void-free, disposed in the recess in the active metal deposition region from the distal position to the transition zone, and absent in the passive region between the proximate position and the transition zone.

Also disclosed is a process for forming a transition zone terminated superconformal filling in a recess of a substrate by electrodepositing metal, the process comprising: providing an electrodeposition composition comprising: a metal electrolyte comprising a plurality of metal ions and a solvent; and a suppressor disposed in the solvent; providing the substrate comprising: a field surface; and the recess disposed in the substrate, the recess comprising a distal position and a proximate position relative to the field surface of the substrate; exposing the recess to the electrodeposition composition; galvanodynamically controlling an electric current between the recess and a counter electrode with a current wave form; bifurcating the recess into an active metal deposition region and a passive region in response to galvanodynamically controlling the electric current; forming, in response to bifurcating the recess, a transition zone at an interface of the active metal deposition region and the passive region; changing the electric current at the recess by the current wave form; progressively moving the transition zone closer to the field surface and away from the distal position in response to changing the electric current; and reducing the metal ions to form metal and depositing the metal in the active metal deposition region and not in the passive region to form the transition zone terminated superconformal filling in the recess of the substrate, the transition zone terminated superconformal filling being: void-free, disposed in the recess in the active metal deposition region from the distal position to the transition zone, and absent in the passive region between the proximate position and the transition zone.

BRIEF DESCRIPTION OF THE DRAWINGS

The following descriptions should not be considered limiting in any way. With reference to the accompanying drawings, like elements are numbered alike.

Figure 37:
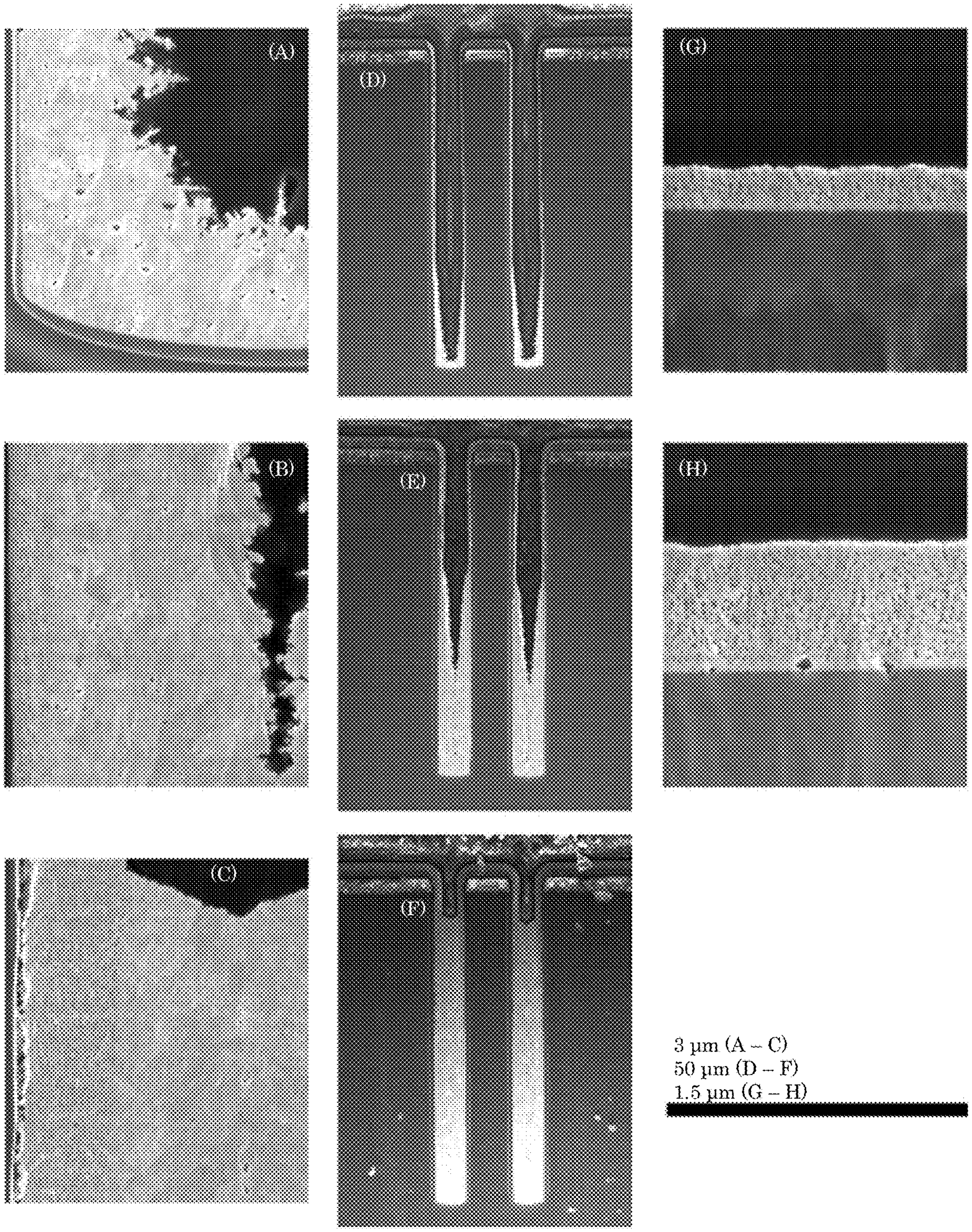
Figure 38:
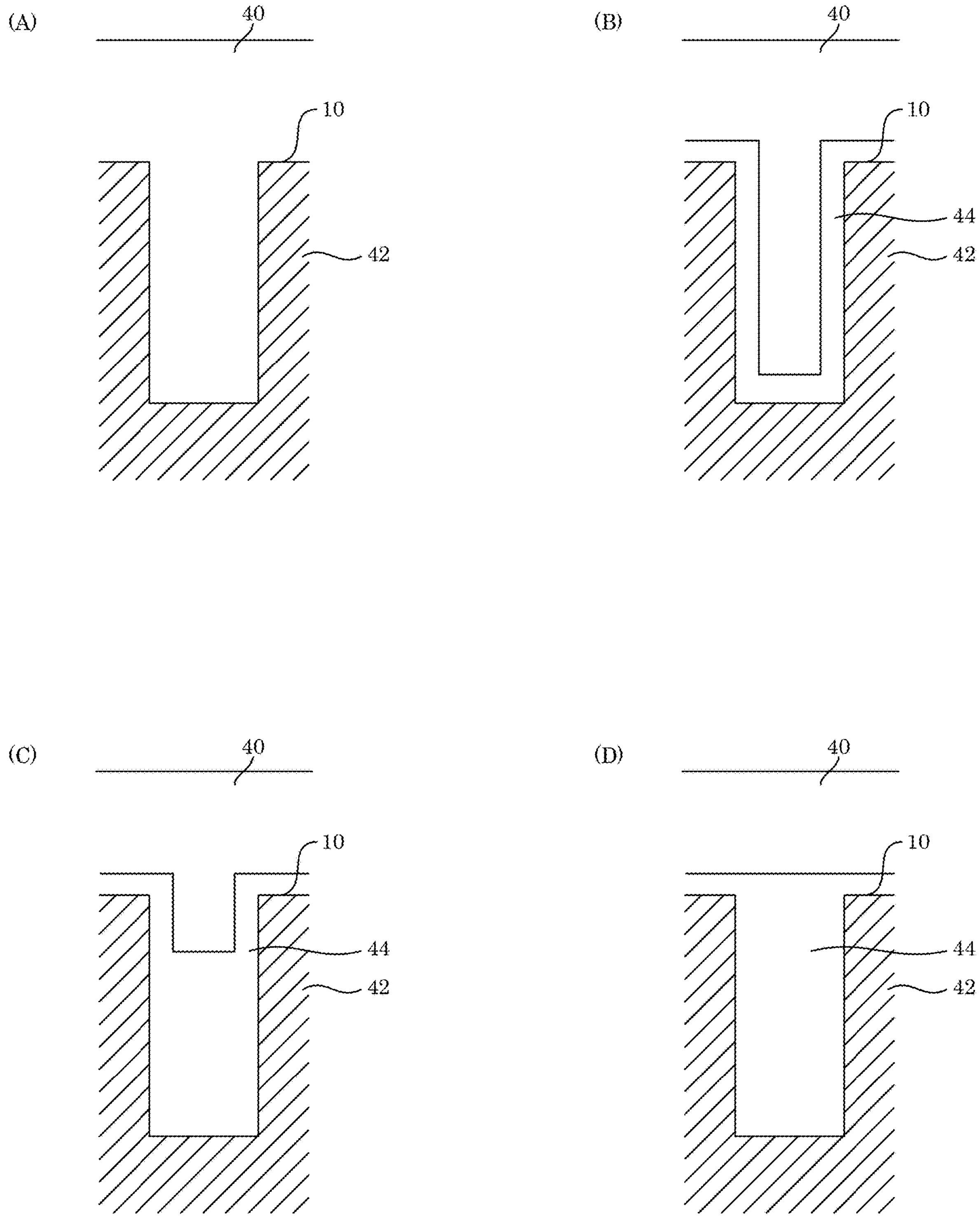
Figure 39:
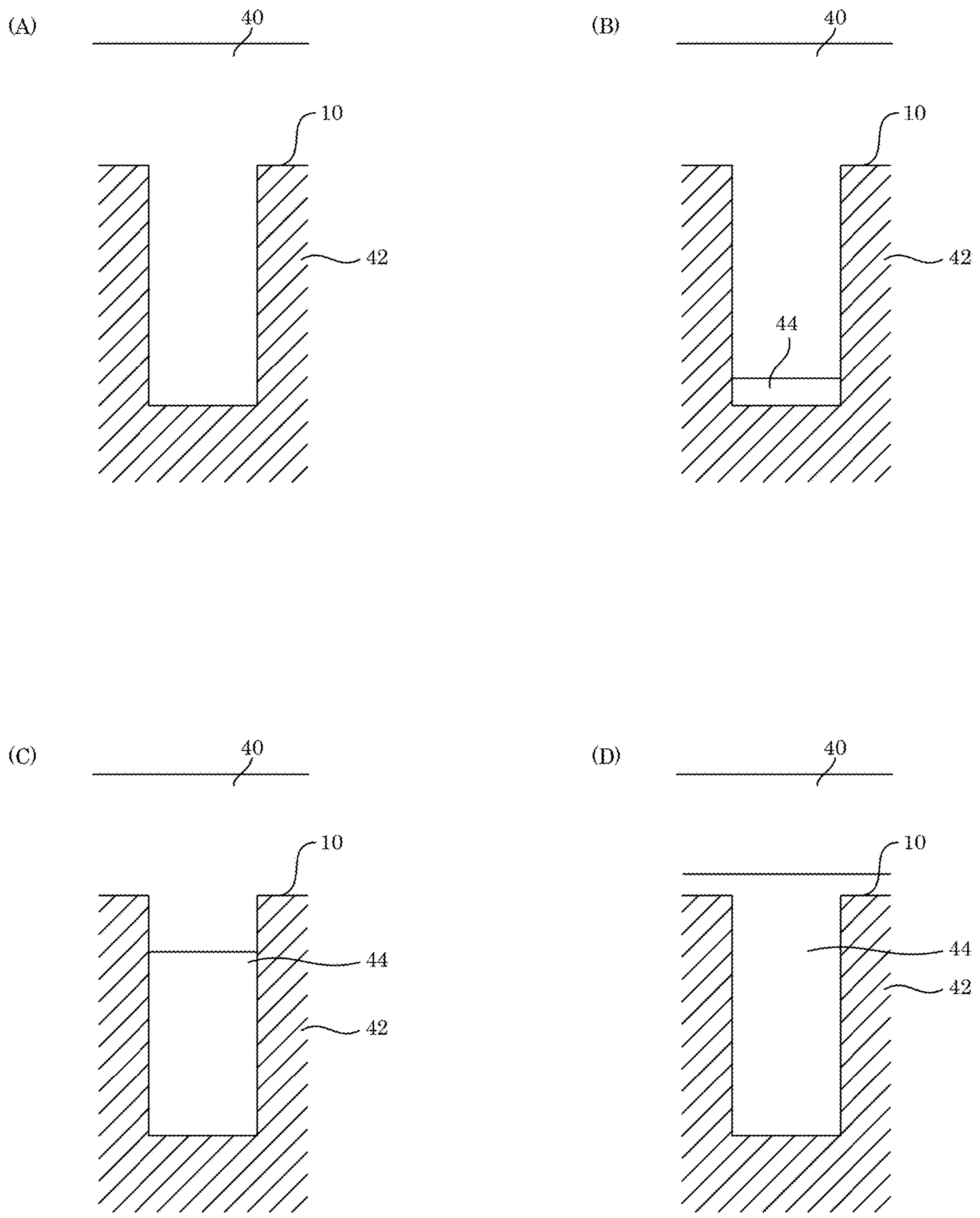
Figure 40:
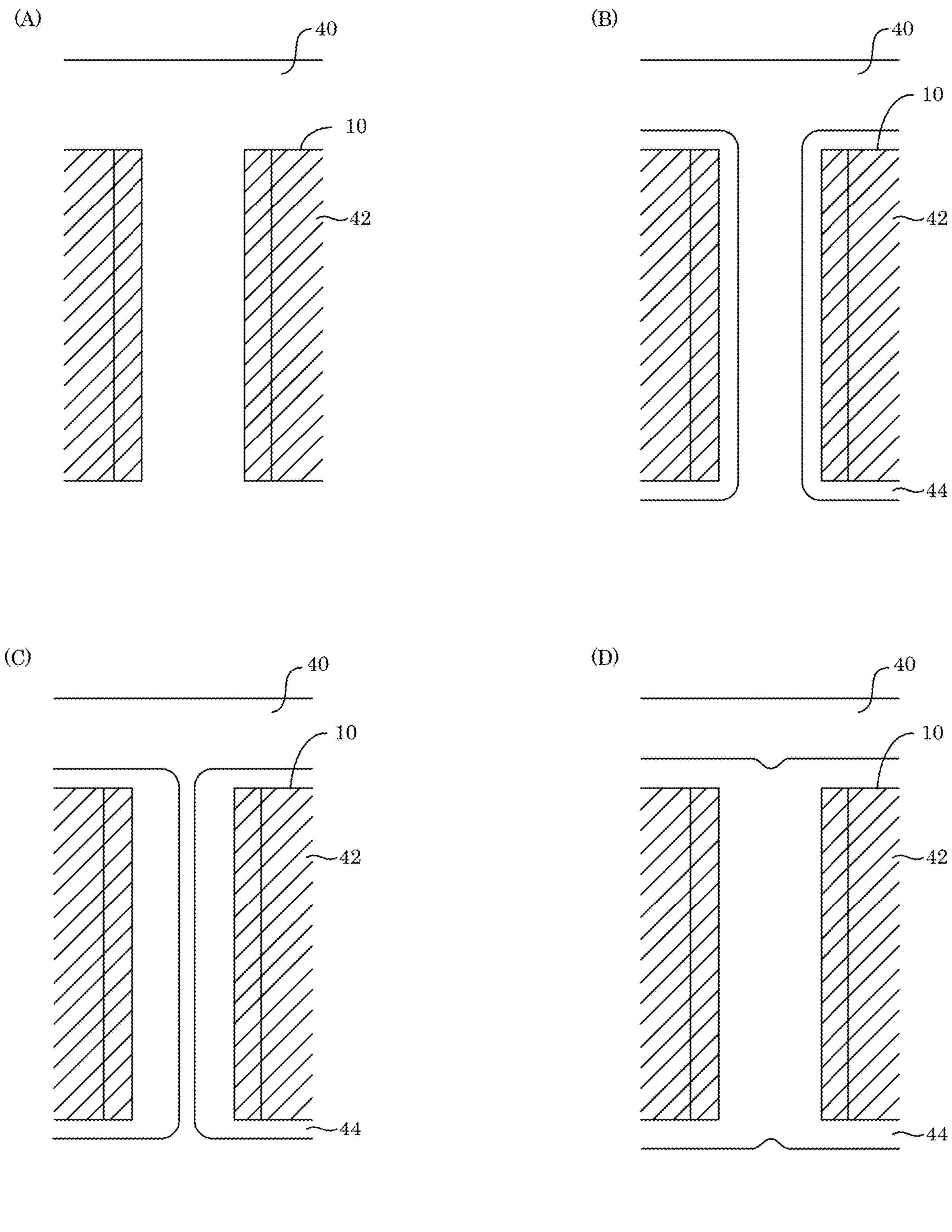

FIG. 37 shows images of a cross-sectioned annular TSV after Au deposition in electrolyte containing 20 μmol/L PEI concentrations showing the progression of superconformal filling for progressively larger ranges of the ramped applied potential, wherein (panel A, D, G) 50 min total: ramped at 0.02 mV/s from −1.09 V to −1.15 V; (panel B, E, H) 100 min total: ramped at 0.02 mV/s from −1.09 V to −1.21 V; (panels C, F) 127 min total: ramped at 0.02 mV/s from −1.09 V to −1.21 V then at 0.025 mV/s from −1.21 V to −1.25 V, and deposition was preceded by a 5 s pulse at −1.5 V to improve nucleation on the Cu seeded surface; panels A, B, and C provide higher magnification views near the position of the deposit at the via midline, and panels G and H show passive deposition on the field with the patterned wafer fragment substrate rotating at 100 rpm during deposition;

FIG. 38 shows comparative deposition of metal in a substrate;

FIG. 39 shows comparative deposition of metal in a substrate;

FIG. 40 shows comparative deposition of metal in a substrate; and

Figure 41:
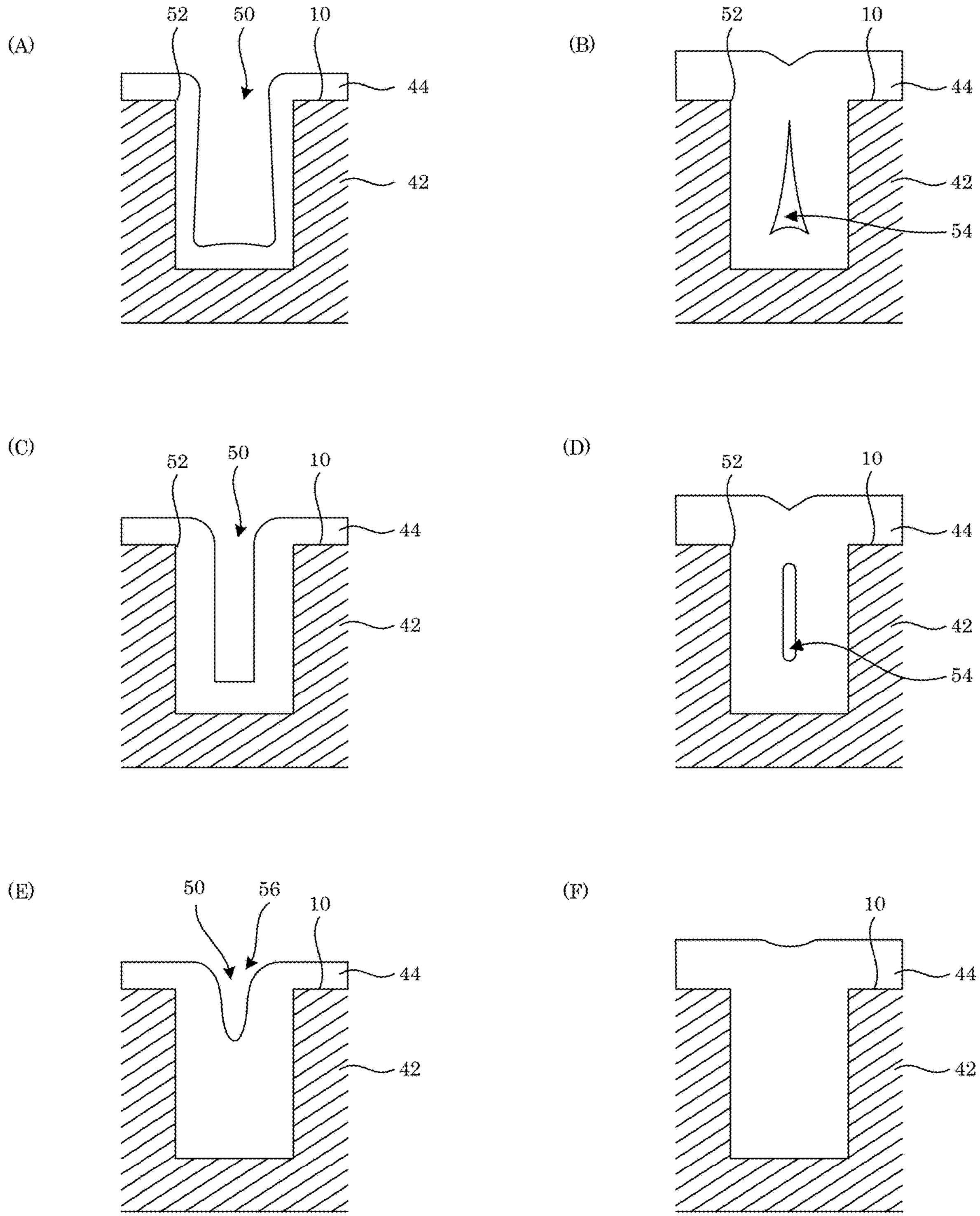

FIG. 41 shows comparative metal disposed in a substrate.

DETAILED DESCRIPTION

A detailed description of one or more embodiments is presented herein by way of exemplification and not limitation.

It has been discovered that a process for forming a transition zone terminated superconformal filling in a recess of a substrate fills features from a distal position (e.g., bottom up) such that the zone terminated superconformal filling is a void-free, seam-free metallic filling. The recess can be a tall and narrow high aspect ratio features such as a through hole (e.g., a pinhole in a metal tube in a steam boiler) or blind hole in the substrate (e.g., a via or trench or TSV on a patterned silicon wafer substrate). Unexpectedly and advantageously, the process includes a suppressor to control a deposition rate of the metal such that active deposition of metal occurs in the recess from a transition zone to the distal position of the recess where a concentration of the suppressor is less than a critical concentration (CC). Beneficially, critical concentration CC of the suppressor increases at more negative values of the potential applied to the recess. Accordingly, for a selected deposition potential, a decrease of suppressor concentration in a recess away from a field surface of a substrate provides deposition of the metal in from the transition zone to distal position in a presence of the concentration of the suppressor that is below the value of critical concentration CC of suppressor. Changing the deposition potential from a more positive value to a more negative value changes a location of the transition zone from progressively toward a proximal position of the recess relative to the field surface and away from the distal position. For a selected initial potential, the recess can be filled entirely in an absence of a void or seam of the deposited metal.

Figure 1:
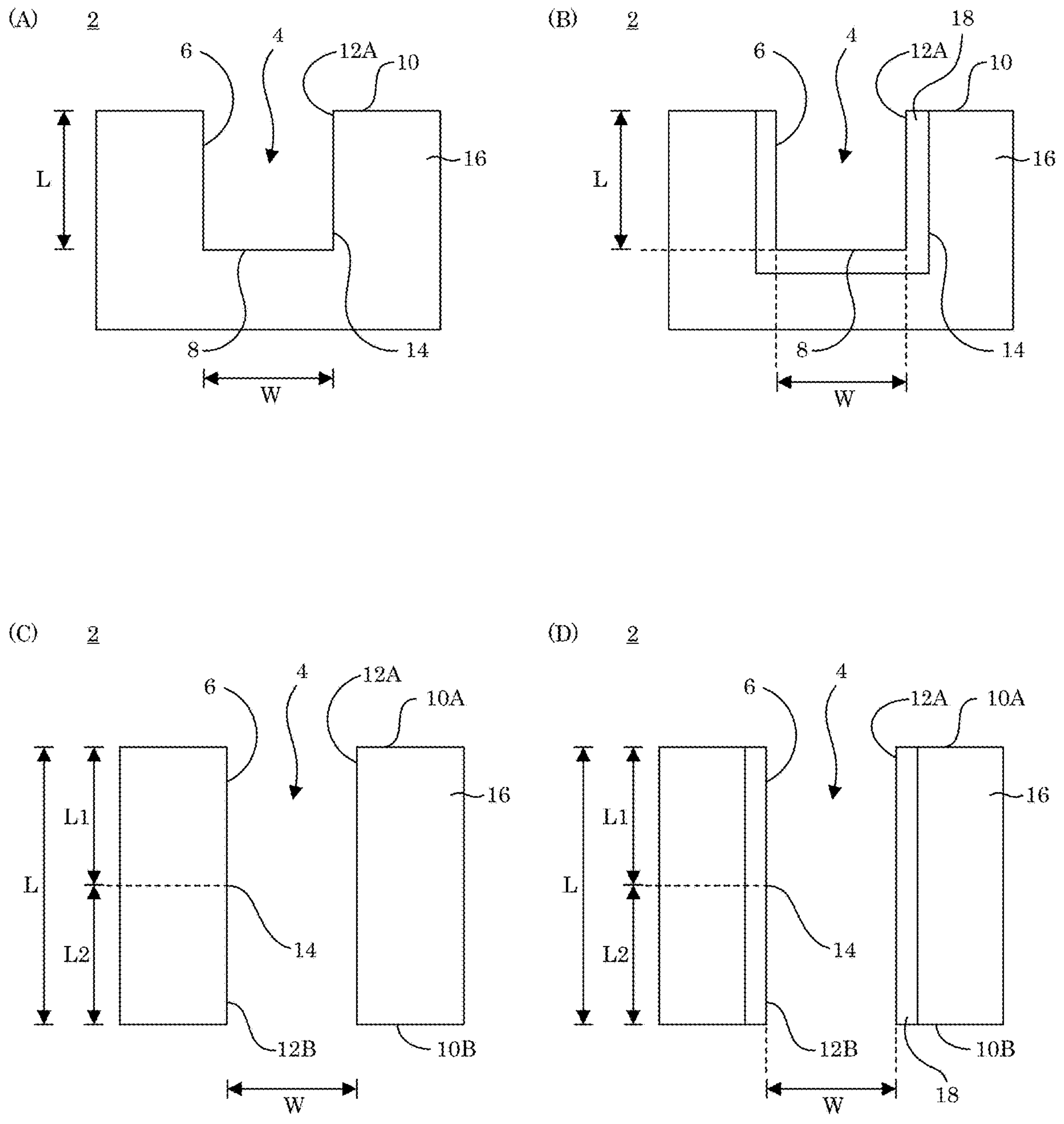
FIG. 1 shows several substrates.

In an embodiment, with reference to FIG. 1, which show cross-sections of substrate 2, substrate 2 includes recess 4 disposed body member 16 and bounded by wall and terminal wall 8 as shown in panel A. Recess 4 extends from proximate position 12A proximate to field surface 10 of body member 16 to distal position 14 distal to field surface 10 but proximate to terminal wall 8. Accordingly, recess 4 has a depth L from field surface 10 to terminal wall 8 and width W. In an embodiment, as shown in panel F of FIG. 2, transition zone terminated superconformal filling 38 is disposed in recess 4 of substrate 2. Formation of transition zone terminated superconformal filling 38 in recess 4 occurs via electrodeposition of metal. Here, wall 6 and terminal wall 8 are electrically conductive. It is contemplated that body member 16 is electrically conductive to provide electrical conductivity to wall 6 and terminal wall 8. In this configuration, recess 4 includes a blind hole.

According to an embodiment, with reference to panel B of FIG. 1, substrate 2 includes body member 16, electrically conductive layer 18 that is recessed with respect to field surface 10, recess 4 bounded by wall 6 and terminal wall 8. Here, body member can be an electrical conductor, electrical semiconductor, or electrically insulator, and electrically conductive layer 18 is electrically conductive to support electrodeposition of transition zone terminated superconformal filling 38 in recess 4.

In an embodiment, as shown in panel C of FIG. 1, recess 4 includes a through hole that extends from first field surface 10A to second field surface 10B. Proximate positions (12A, 12B) are proximate to field surfaces (10A, 10B). Distal position 14 is interposed between proximate positions (12A, 12B) and bisects recess 4. Accordingly, a distance between first field surface 10A and distal position 14 is first length L1. A distance between second field surface 10B and distal position 14 is second length L2, wherein total length L of recess 4 is a sum of first length L1 and second length L2. Moreover, as shown in panel D of FIG. 1, substrate 2 can include electrically conductive layer 18 disposed in body member 16 to provide wall 6 for recess 4.

Figure 2:
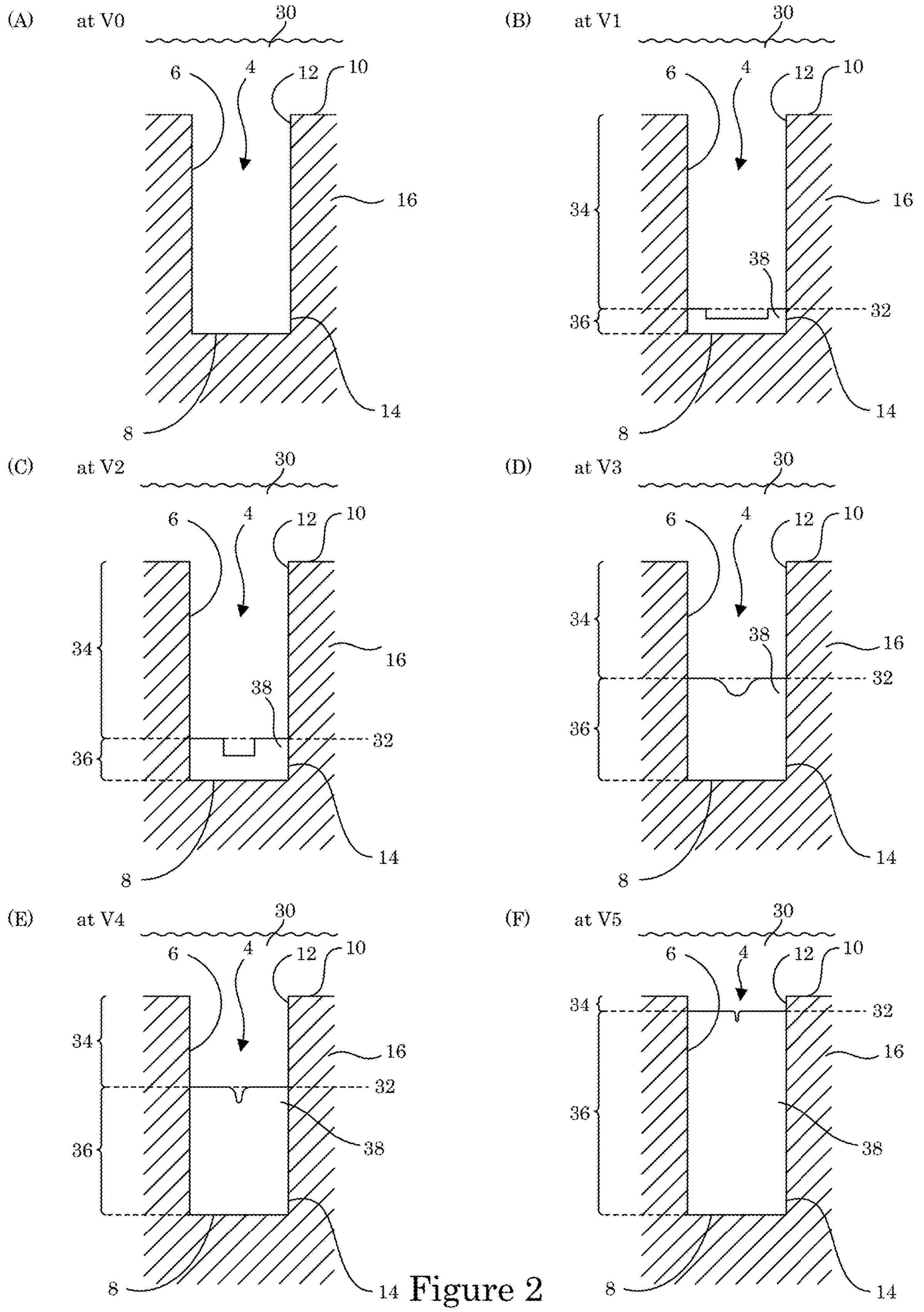
FIG. 2 shows a formation of a transition zone terminated superconformal filling disposed in a substrate.

In an embodiment, with reference to FIG. 2, panels A to F show formation of transition zone terminated superconformal filling 38 in recess 4 of substrate 2 as a function of time and electric potential of wall 6 and terminal wall 8. At time t0 and voltage V0, electrodeposition composition 30 is provided to contact substrate 2 that includes body member 16 such that wall 6 and terminal wall 8 of body member 16 are exposed to electrodeposition composition 30. As shown in panel B of FIG. 2, at time t1, the electric potential decreases to voltage V1, passive region 34 and active metal deposition region 36 are formed at wall 6 and terminal wall 8 with transition zone 32 interposed at an interface of passive region 34 and active metal deposition region 36. In this manner, recess 4 is bifurcated into active metal deposition region 36 and passive region 34 in response to potentiodynamically controlling the electric potential. As a result, metal ions in electrodeposition composition 30 are reduced and form metal that is deposited on wall 6 and terminal wall 8 in active metal deposition region 36 but not deposited or deposited more slowly than in the active metal deposition region in passive region 34. Further, transition zone terminated superconformal filling 38 is void-free, disposed in recess 4 in active metal deposition region 36 from the distal position 14 to transition zone 32, and absent in passive region 34 between proximate position 12 and transition zone 32. Thereafter, with reference to panel C of FIG. 2, at time t2, the electric potential decreases to voltage V2, and transition zone 32 progressively moves closer to field surface 10 and away from distal position 14 in response to decreasing the electric potential. More metal is produced from reduction of the metal ions in electrodeposition composition 30. The metal is deposited in recess 4 on wall 6 and terminal wall 8 in active metal deposition region 36 but not deposited in passive region 34 as transition zone terminated superconformal filling 38 is enlarged to fill more of the volume of recess 4 from transition zone 32 to distal position 14.

With reference to panel D of FIG. 2, at time t3, the electric potential decreases to voltage V3, and transition zone 32 progressively moves closer to field surface 10 and away from distal position 14 in response to decreasing the electric potential. More metal is produced from reduction of the metal ions in electrodeposition composition 30. The metal is deposited in recess 4 on wall 6 and terminal wall 8 in active metal deposition region 36 but not deposited in passive region 34 as transition zone terminated superconformal filling 38 is enlarged to fill more of the volume of recess 4 from transition zone 32 to distal position 14. Similarly, with reference to panel E of FIG. 2, at time t4, the electric potential decreases to voltage V4, and transition zone 32 progressively moves closer to field surface 10 and away from distal position 14 in response to decreasing the electric potential. More metal is produced from reduction of the metal ions in electrodeposition composition 30. The metal is deposited in recess 4 on wall 6 and terminal wall 8 in active metal deposition region 36 but not deposited in passive region 34 as transition zone terminated superconformal filling 38 is enlarged to fill more of the volume of recess 4 from transition zone 32 to distal position 14. Further, with reference to panel F of FIG. 2, at time t5, the electric potential decreases to voltage V25 and transition zone 32 progressively moves closer to field surface 10 and away from distal position 14 in response to decreasing the electric potential. More metal is produced from reduction of the metal ions in electrodeposition composition 30. The metal is deposited in recess 4 on wall 6 and terminal wall 8 in active metal deposition region 36 but not deposited in passive region 34 as transition zone terminated superconformal filling 38 is enlarged to fill more of the volume of recess 4 from transition zone 32 to distal position 14. In this manner transition zone terminated superconformal filling 38 is formed to be disposed in recess 4 of substrate 2.

Figure 3:
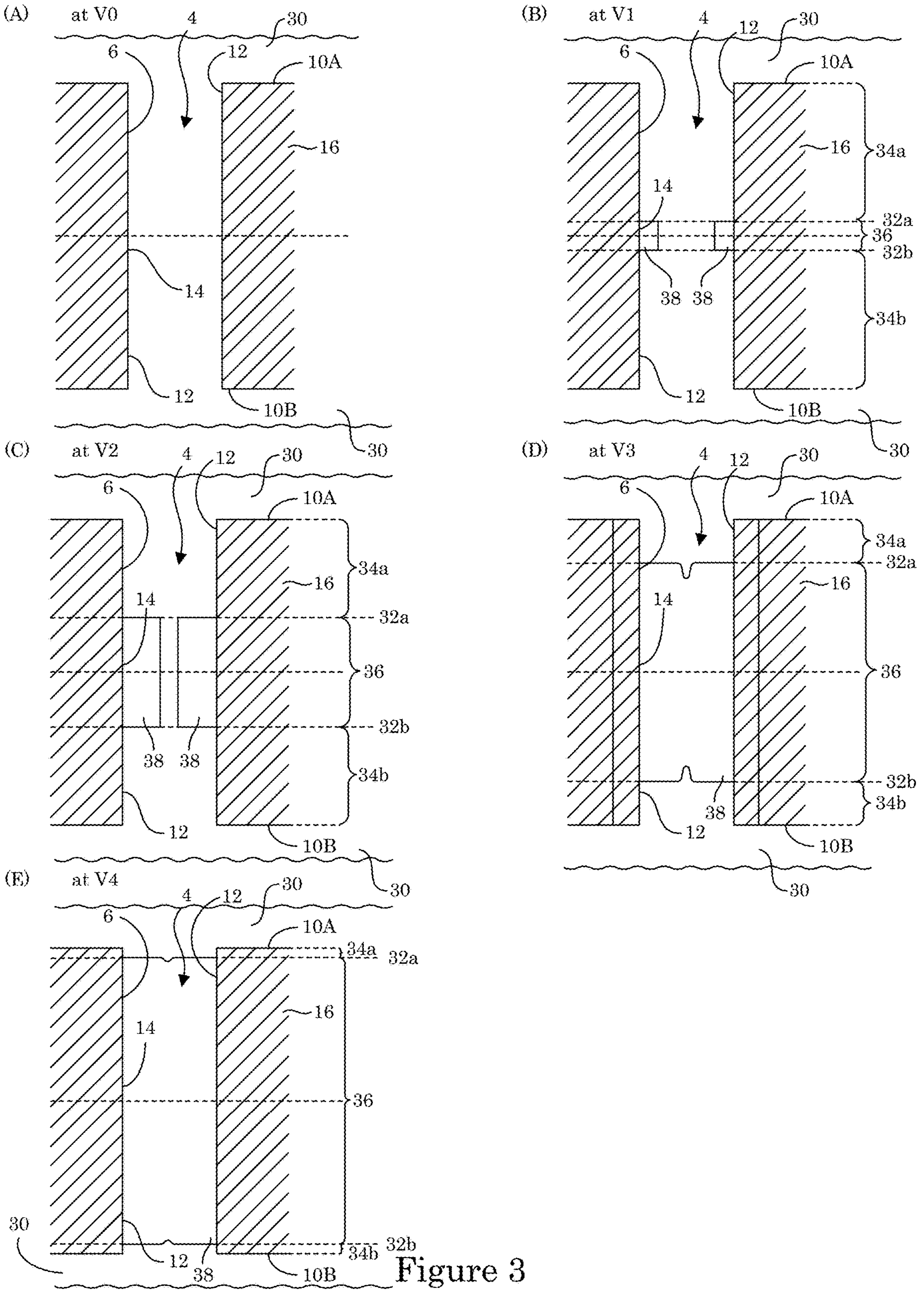
FIG. 3 shows a formation of a transition zone terminated superconformal filling disposed in a substrate.

FIG. 3 shows formation of transition zone terminated superconformal filling 38 disposed in recess 4 of substrate 2, wherein recess 4 includes a through hole in body member 16. Here, substrate 2 also includes first field surface 10A and second field surface 10B, distal position 14 of recess 4 interposed between field surfaces (10A, 10B). As shown in panel A, at time t0 and voltage V0, electrodeposition composition 30 is provided to contact substrate 2 such that wall 6 of body member 16 is exposed to electrodeposition composition 30. As shown in panel B of FIG. 3, at time t1, the electric potential decreases to voltage V1; and recess 4 is bifurcated into passive regions (34*a*, 34*b*), active metal deposition region 36 at wall 6 with transition zones (32*a*, 32*b*) interposed at interfaces of passive regions (34*a*, 34*b*) and active metal deposition region 36 in response to potentiodynamically controlling the electric potential. As a result, metal ions in electrodeposition composition 30 are reduced and form metal that is deposited as transition zone terminated superconformal filling 38 on wall 6 in active metal deposition region 36 but not deposited in passive regions (34*a*, 34*b*). Further, transition zone terminated superconformal filling 38 is void-free, disposed in recess 4 in active metal deposition region 36 from the distal position 14 to transition zones (32*a*, 32*b*), and absent in passive regions (34*a*, 34*b*) between proximate positions (12*a*, 12*b*) and transition zones (32*a*, 32*b*). Thereafter, with reference to panel C of FIG. 3, at time t2, the electric potential decreases to voltage V2, and transition zones (32*a*, 32*b*) progressively move closer to field surfaces (10*a*, 10*b*) and away from distal position 14 in response to decreasing the electric potential. More metal is produced from reduction of the metal ions in electrodeposition composition 30. The metal is deposited in recess 4 on wall 6 in active metal deposition region 36 but not deposited in passive regions (34*a*, 34*b*) as transition zone terminated superconformal filling 38 is enlarged to fill more of the volume of recess 4 from transition zones (32*a*, 32*b*) to distal position 14.

With reference to panel D of FIG. 3, at time t3, the electric potential decreases to voltage V3, and transition zones (32*a*, 32*b*) progressively move closer to field surfaces (10*a*, 10*b*) and away from distal position 14 in response to decreasing the electric potential. More metal is produced from reduction of the metal ions in electrodeposition composition 30. The metal is deposited in recess 4 on wall 6 in active metal deposition region 36 but not deposited in passive region 34 as transition zone terminated superconformal filling 38 is enlarged to fill more of the volume of recess 4 from transition zones (32*a*, 32*b*) to distal position 14. Similarly, with reference to panel E of FIG. 3, at time t4, the electric potential decreases to voltage V4, and transition zones (32*a*, 32*b*) progressively move closer to field surfaces (10*a*, 10*b*) and away from distal position 14 in response to decreasing the electric potential. More metal is produced from reduction of the metal ions in electrodeposition composition 30. The metal is deposited in recess 4 on wall 6 in active metal deposition region 36 but not deposited in passive regions (34*a*, 34*b*) as transition zone terminated superconformal filling 38 is enlarged to fill more of the volume of recess 4 from transition zones (32*a*, 32*b*) to distal position 14. In this manner transition zone terminated superconformal filling 38 is formed to be disposed in recess 4 of substrate 2 in absence of formation of transition zone terminated superconformal filling 38 on field surfaces (10*a*, 10*b*).

Substrate 2 can be electrically conductive, electrically semiconductive, or electrically insulating. It is contemplated that substrate 2 can have a gradient in electrical conductivity. Exemplary electrically conductive substrates 2 include boiler tubes with pinholes, and the like. In an embodiment, substrate 2 is electrically conductive such as steel.

Exemplary electrically semiconductive substrates 2 include patterned silicon wafers with or without features filled with other metals, and the like. In an embodiment, substrate 2 is electrically semiconductive such as silicon.

Exemplary electrically insulating substrates 2 include silicon dioxide or other oxide layers including layers on semiconductor wafers, and the like. In an embodiment, substrate 2 is electrically insulating such as a ceramic.

Substrate 2 can be any shape or size that does not interfere with formation of transition zone terminated superconformal filling 38 in recess. Moreover, substrate 2 can be an element of a larger structure such as a pipe in a boiler, a die on a wafer, a wafer in a stacked wafer structure, and the like. Substrate 2 can be a same or different material as the larger structure. Field surface 10 a substrate 2 can be planar, curved, irregular, corrugated, and the like, or a combination thereof.

Recess 4 disposed in substrate 2 receives electrodeposition composition 30 for formation of transition zone terminated superconformal filling 38 therein, Recess 4 can have a low aspect ratio or high aspect ratio. As used herein, "aspect ratio" refers to a ratio of length L to width W of recess 4. The aspect, ratio can be from 0.5 to 100, specifically from 0.5 to 100, and more specifically from 0.5 to 100. It is contemplated that length. L can be from 10 nanometers (nm) to 1000 micrometers (μm), specifically from 1 nm to 1000 μm, and more specifically from 1 nm to 100 μm. Width W can be from 5 nanometers (nm) to 100 micrometers (μm), specifically from 1 nm to 100 μm, and more specifically from 1 nm to 100 μm.

A shape of recess 4 can be any shape and can include a dendritic arm that extends into substrate 2. Wall 6 and terminal wall that borders recess 4 independently can be curved, linear, irregular, or a combination thereof. Further, recess 4 can be a through hole or blind hole. Recess 4 includes a pinhole, aperture, capillary, fracture, seam, via, trench, through silicon via, and the like.

It is contemplated that substrate 2 can include body member 16, electrically conductive layer 18 that is recessed with respect to field surface 10, and recess 4 bounded by wall 6 and terminal wall 8. Here, electrically conductive layer 18 provides an electrically conductive surface that can be subjected to an electric potential for reducing metal ions in electrodeposition composition to form transition zone terminated superconformal filling 38 in recess 4. Exemplary materials for electrically conductive layer 18 include copper, gold, silver, ruthenium, platinum, palladium, rhodium, iridium, cobalt, nickel, iron, an alloy thereof, and the like. In an embodiment, electrically conductive layer 18 includes copper. Electrically conductive layer 18 can have a thickness selected to support electrodeposition of the metal and can be from 1 nanometers (nm) to 1 micrometers (μm), specifically from 1 nm to 1 μm, and more specifically from 1 nm to 1 μm.

To form transition zone terminated superconformal filling 38 in recess 4, metal ions in electrodeposition composition 30 are reduced at wall 6, terminal wall 8, or combination thereof, Electrodeposition composition 38 can be a fluid such as a gas or liquid. In an embodiment, electrodeposition composition 38 is the liquid and includes metal ions and a suppressor disposed in the solvent. As used herein, "suppressor" refers to an additive that suppresses a rate of electrodeposition of the metal as transition zone terminated superconformal filling 38. Electrodeposition composition 30 also can include additional additives such as an accelerator, leveler, source of halide ions, grain refiner, defoaming agent, alloying metal, solvents such as alcohol, and the like.

The metal ions include ions of nickel ($Ni^{3+}$), ions of cobalt ($Co^{2+}$), gold ($Au^{3+}$), iron ($Fe^{2+}$), copper $Cu^{2+}$, silver ($Ag^{+}$), tin ($Sn^{2+}$), lead ($Pb^{2+}$), or a combination thereof. The source of metal ions can be a metal salt such as a nickel salt, cobalt salt, gold salt, and the like. The metal salt that is soluble in electrodeposition composition 30 can be used.

A nickel salt can be used as a source of nickel ions. Exemplary nickel salts include nickel sulfate, nickel sulfonate, nickel chloride, nickel acetate, nickel gluconate, nickel fluoroborate, nickel halides, nickel nitrate, nickel alkanesulfonates, nickel arylsulfonates, and the like. Suitable nickel alkanesulfonates include nickel methane sulfonate, nickel ethanesulfonate, and nickel propanesulfonate. Suitable nickel arylsulfonates include nickel benzenesulfonate, nickel toluenesulfonate, and nickel phenolsulfonate. The nickel salt can be present in electrodeposition composition 30 in an amount sufficient to provide an amount of nickel ion from 1 grams per liter (g/L) to 100 g/L, specifically from 1 g/L to 100 g/L, and more specifically from 1 g/L to 100 g/L.

A cobalt salt can be used as a source of cobalt ions. Exemplary cobalt salts include cobalt sulfate, cobalt sulfonate, cobalt chloride, cobalt acetate, cobalt gluconate, cobalt fluoroborate, cobalt halides, cobalt nitrate, cobalt alkanesulfonates, cobalt arylsulfonates, and the like. Suitable cobalt alkanesulfonates include cobalt methane sulfonate, cobalt ethanesulfonate, and cobalt propanesulfonate. Suitable cobalt arylsulfonates include cobalt benzenesulfonate, cobalt toluenesulfonate, and cobalt phenolsulfonate. The cobalt salt can be present in electrodeposition composition 30 in an amount sufficient to provide an amount of cobalt ion from 1 grams per liter (g/L) to 100 g/L, specifically from 1 g/L to 100 g/L, and more specifically from 1 g/L to 100 g/L.

An iron salt can be used as a source of iron ions. Exemplary iron salts include iron sulfate, iron sulfonate, iron chloride, iron acetate, iron gluconate, iron fluoroborate, iron halides, iron nitrate, iron alkanesulfonates, iron arylsulfonates, and the like. Suitable iron alkanesulfonates include iron methane sultanate, iron ethanesulfonate, and iron propanesulfonate. Suitable iron arylsulfonates include iron benzenesulfonate, iron toluenesulfonate, and iron phenolsulfonate. The iron salt can be present in electrodeposition composition 30 in an amount sufficient to provide an amount of iron ion from 1 grams per liter (g/L) to 100 g/L, specifically from 1 g/L to 100 g/L, and more specifically from 1 g/L to 100 g/L.

A tin salt, can be used as a source of iron ions. Exemplary tin salts include tin sulfate, tin sulfonate, tin chloride, tin acetate, tin gluconate, tin fluoroborate, tin halides, tin nitrate, tin alkanesulfonates, tin arylsulfonates, and the like. Suitable tin alkanesulfonates include tin methane sulfonate, tin ethanesulfonate, and tin propanesulfonate. Suitable tin arylsulfonates include tin benzenesulfonate, tin toluenesulfonate, and tin phenolsulfonate. The tin salt can be present in electrodeposition composition 30 in an amount sufficient to provide an amount of tin ion from 1 grams per liter (g/L) to 100 g/L, specifically from 1 g/L to 100 g/L, and more specifically from 1 g/L to 100 g/L.

A lead salt can be used as a source of iron ions. Exemplary tin salts include lead sulfate, lead sulfonate, lead chloride, lead acetate, lead gluconate, lead fluoroborate, lead halides, lead nitrate, lead alkanesulfonates, lead arylsulfonates, and the like. Suitable lead alkanesulfonates include lead methane sulfonate, lead ethanesulfonate, and lead propanesulfonate. Suitable lead arylsulfonates include lead benzenesulfonate, lead toluenesulfonate, and lead phenolsulfonate. The lead salt can be present in electrodeposition composition 30 in an amount sufficient to provide an amount of lead ion from 1 grains per liter (g/L) to 100 g/L, specifically from 1 g/L to 100 g/L, and more specifically from 1 g/L to 100 g/L.

A gold salt can be used as a source of gold ions. Exemplary gold salts include gold sulfate, gold sulfite, gold sultanate, gold acetate, gold gluconate, gold fluoroborate, gold halides, gold nitrate, gold alkanesulfonates, gold arylsulfonates, and the like. Suitable gold alkanesulfonates include gold methane sulfonate, gold ethanesulfonate, and gold propanesulfonate. Suitable gold arylsulfonates include gold benzenesulfonate, gold toluenesulfonate, and gold phenolsulfonate. The gold salt can be present in electrodeposition composition 30 in an amount sufficient to provide an amount of gold ion from 1 grams per liter (g/L) to 200 g/L, specifically from 1 g/L to 200 g/L, and more specifically from 1 g/L to 200 g/L.

The metal electrolyte can be alkaline or acidic. An acid that is compatible with the source of metal ions can be present in electrodeposition composition 30. Exemplary acids include sulfuric acid; acetic acid; boric acid; fluoroboric acid; nitric acid; sulfamic acid; phosphoric acid; hydrogen halide acids such as hydrochloric acid; alkanesulfonic acids and arylsulfonic acids such as methanesulfonic acid, ethanesulfonic acid, propanesulfonic acid, toluenesulfonic acid, phenolsulfonic acid and benzenesulfonic acid; halogenated acids such as trifluoromethylsulfonic acid and haloacetic acids such as trifluoroacetic acid; and the like; or combination thereof. The metal electrolyte is present in an amount sufficient to provide electrical conductivity to electrodeposition composition 30. A pH of the acidic electrolyte can have a value of less than 7, and specifically less than 2. Exemplary alkaline electrodeposition compositions can use pyrophosphate in the metal electrolyte although other electrolytes can be present. It should be appreciated that the pH of the metal electrolyte can be adjusted. The acid or alkaline additive species can be present in electrodeposition composition 30 in an amount from 0 to 200 g/L, specifically from 5 to 200 g/L, and more specifically from 0 to 120 g/L.

Exemplary solvents for electrodeposition composition 30 includes water, an alcohol, and the like, or a combination thereof. The solvent can be present in a wide range of amounts.

In electrodeposition composition 30, the suppressor decreases the rate of electrodeposition of the metal. Exemplary suppressors include water soluble non-ionic and cationic surfactants and polymers such as polyethyleneimine, polyethylene glycol, benzimidazole derivatives, or a combination thereof. The polyethyleneimine can have a repeating unit formula (1).

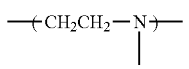

(1)

The polyethyleneimine compound can include from 1 to 15, 4 or more, or 6 or more, of the repeating unit of formula 1. The polyethyleneimine can include nitrogen atoms that are present as a primary amine, secondary amine, or tertiary amine and can include a terminal hydroxyl group, e.g., as a polyhydroxylamine. The polyhydroxylamine can have a structure of formula (2): R"HN—$(CH_2—CH_2—NR)_a$—R', wherein R is a group including the repeating units of formula (1); R' and R" independently are each a hydrogen atom or hydroxyl group, and a is an integer of 4 or greater, e.g., from 6 to 15.

The polyethyleneimine can have a linear structure in which the repeating units of formula (1) are linearly linked or a molecule in which such repeating units are linked in a branched structure. Examples of polyethyleneimine compounds that exhibit linear or branched structures are provided as formulas (3) and (4).

R"HN—$(CH2\text{-}CH2\text{-}NH)_b$—R' (3)

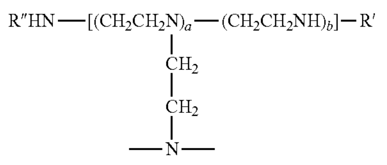

(4)

wherein R' and R" are as described above, and a and b are integers of 4 or greater, specifically 6 or greater. In formula (4), linkage groups of the nitrogen atom are not shown, but the linkage groups can be selected from repeating units of formula (1), hydrogen atoms and hydroxyl groups. In formula (4), repeating units having branches and repeating units not having branches can be linked randomly as desired.

When the polyethyleneimine compounds have a branched structure, branching chains (represented by R in formula (2)) having any length and branching form are bonded to the nitrogen atom in any number of repeating units and at any position from the termini of the side chains in the polyethyleneimine to which multiple units of the aforementioned repeating unit (1) are linked. With regard to bonding format in the branched regions, the bondable carbon atoms in repeating units (1) (carbon atoms that are not bonded to nitrogen atoms in the above repeating units) are bonded to the nitrogen atoms of other repeating units (nitrogen atoms to which R is bonded in formula (2)). Branching chains in the polyethyleneimine (represented by R in formula (2)) also can be chains that have the repeating units of formula (1), or can be chains formed by the linkage of any number of repeating units, where the linkage mode can manifest a branching or linear structure.

In formula (2), R' and R" are each independently hydrogen atoms or hydroxyl groups such that the terminals of the polyethyleneimine will be amino groups or hydroxyamino groups. In addition, the aforementioned branched chains in the polyethyleneimine can be amino groups or hydroxyamino groups.

A molecular weight of the polyethyleneimine can be, e.g., 300-100,000, with 800-20,000 being preferred. The polyethyleneimine can be present in electrodeposition composition 30 in an amount from 0.0001 g/L to 100 g/L, specifically from 0.0001 g/L to 10 g/L, and more specifically from 0.0001 g/L to 100 g/L.

In an embodiment, a process for forming transition zone terminated superconformal filling 38 in recess 4 of substrate 2 by electrodepositing metal includes: providing electrodeposition composition 30 including: a metal electrolyte including a plurality of metal ions in a solvent and a suppressor disposed in the solvent; providing substrate 2 including field surface 10 and recess 4 disposed in substrate 2, recess 4 including distal position 12 and proximate position 14 relative to field surface 10 of substrate 2; exposing recess 2 to electrodeposition composition 30; potentiodynamically controlling an electric potential of recess 4 with a potential wave form; bifurcating recess 4 into active metal deposition region 36 and passive region 34 in response to potentiodynamically controlling the electric potential; forming, in response to bifurcating recess 4, transition zone 32 at an interface of active metal deposition region 36 and passive region 34; decreasing the electric potential of recess 4 by the potential wave form; progressively moving transition zone 32 closer to field surface 10 and away from distal position 14 in response to decreasing the electric potential; and reducing the metal ions to form metal and depositing the metal in active metal deposition region 36 and not in passive region 34 to form transition zone terminated superconformal filling 38 in recess 4 of substrate 2. Transition zone terminated superconformal filling 38 is void-free, disposed in recess 4 in active metal deposition region 36 from distal position 14 to transition zone 32, and absent in passive region 34 between proximate position 12 and transition zone 32. It is contemplated that transition zone terminated superconformal filling 38 is absent on field surface 10. Further, the process can include terminating depositing the metal as transition zone terminated superconformal filling 38 before completely filling recess 4 to field surface 10. In certain embodiments, the process includes terminating depositing the metal as transition zone terminated superconformal filling 38 after completely filling the recess to the field surface while not depositing metal as transition zone terminated superconformal filling 38 on field surface 10.

According to an embodiment, transition zone terminated superconformal filling 38 is disposed in recess 4 by galvanodynamically controlling an electric current between recess 4 and a counter electrode with a current wave form. Here, a process for forming transition zone terminated superconformal filling 38 in recess 4 of substrate 2 by electrodepositing metal includes providing electrodeposition composition 30 including: a metal electrolyte including a plurality of metal ions and a solvent; and a suppressor disposed in the solvent; providing substrate 2 including: field surface 10; and recess 4 disposed in substrate 2, recess 4 including distal position 14 and proximate position 12 relative to field surface 10 of substrate 2; exposing recess 4 to electrodeposition composition 30; galvanodynamically controlling an electric current between recess 4 and a counter electrode with a current wave form; bifurcating recess 4 into active metal deposition region 36 and passive region 34 in response to galvanodynamically controlling the electric current; forming, in response to bifurcating recess 4, transition zone 32 at an interface of active metal deposition region 36 and passive region 34; changing the electric current at recess 4 by the current wave form; progressively moving transition zone 32 closer to field surface 10 and away from distal position 14 in response to changing the electric current; and reducing the metal ions to form metal and depositing the metal in active metal deposition region 36 and not in passive region 34 to form transition zone terminated superconformal filling 38 in recess 4 of substrate 2, transition zone terminated superconformal filling 38 being: void-free, disposed in recess 4 in active metal deposition region 36 from distal position 14 to transition zone 32, and absent in passive region 34 between proximate position 12 and transition zone 32.

In an embodiment, substrate 2 is provided in recess 4 is present. According to an embodiment, recess 4 is formed in substrate 2. Recess 4 can be formed in substrate 2 by etching, laser drilling, cutting, scratching, mechanical deformation, thermal cycling, etching, corrosion, and the like, or a combination thereof.

It is contemplated that substrate 2 can be exposed to electrodeposition composition 30, e.g., by immersing, coating, spraying, and the like substrate 2 with electrodeposition composition 30. Electrodeposition composition 30 can be prepared by dissolving metal salts in solvent and then adding suppressor or suppressor dissolved in a solvent. Exposing recess 4 to electrodeposition composition 30 can be accomplished by placing the substrate containing recess 4 into container of electrolyte before or after making electrical contact to power supply.

Figure 4:
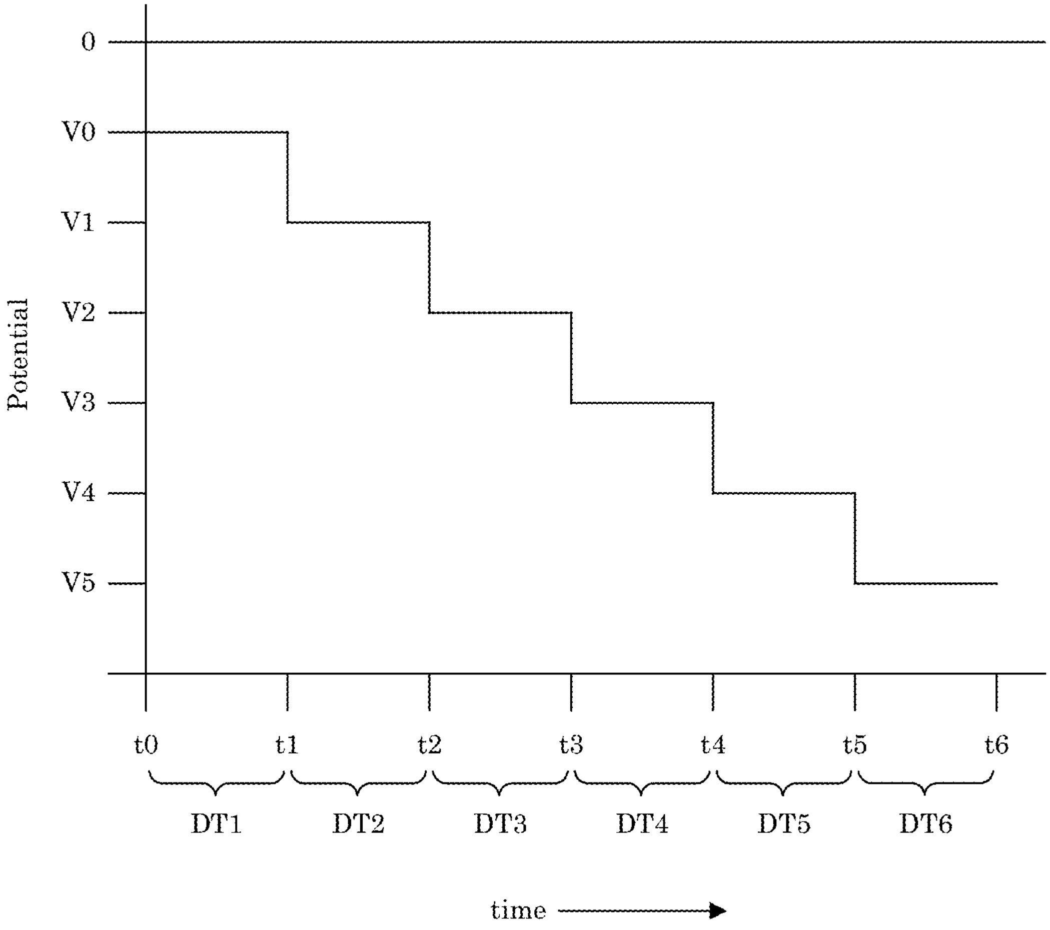
FIG. 4 shows a graph of potential versus time.
Figure 6:
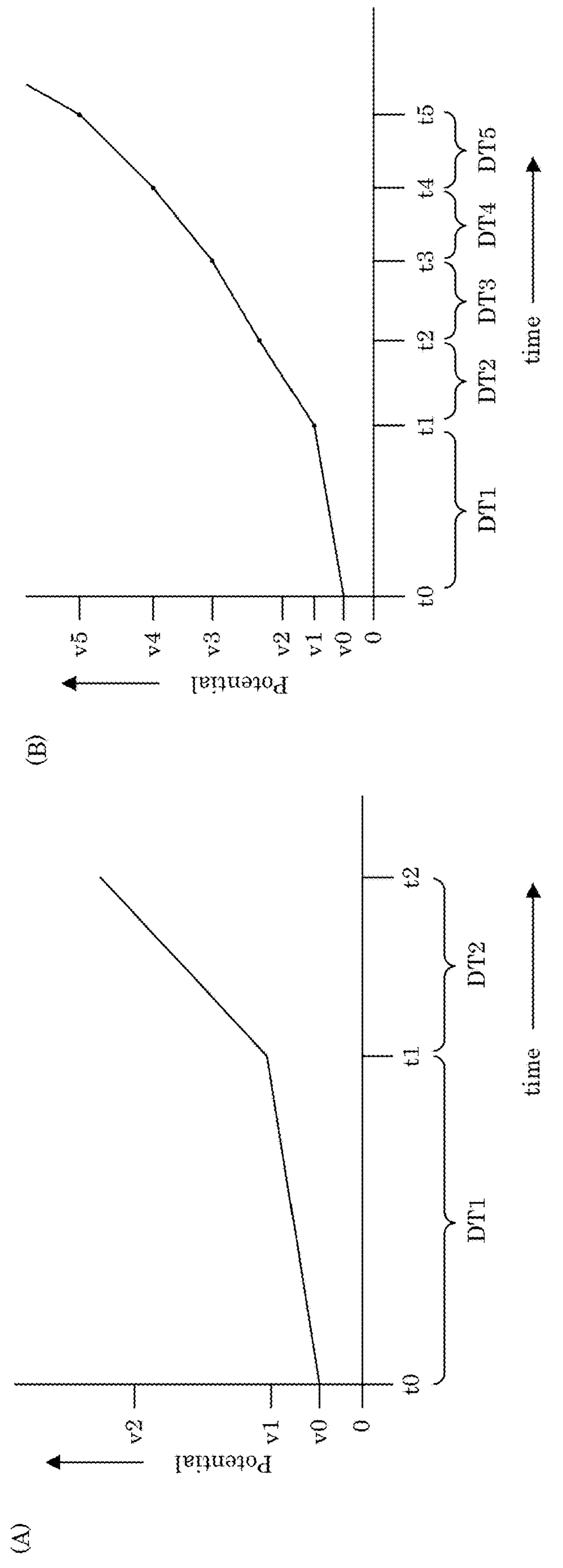
FIG. 6 shows graphs of potential versus time.

It is contemplated that potentiodynamically controlling the electric potential of the recess with a potential wave form can be performed by making electrical contact of substrate 2 wall 6 to a potentiostat with potential control of the work piece relative to a reference electrode placed separately in the container. A potential waveform can include a potential step waveform, potential ramp, or a combination thereof. The potential step waveform can include a first potential with the first dwell time and a second potential with the second dwell time, wherein the second potential is more negative than the first potential. The first dwell time and a second dwell time can be identical, or the first dwell time can be longer than the second dwell time. An exemplary potential step waveform is shown in FIG. 4, wherein at time t0, the potential of the potential step waveform is V0, which is less than 0 V and under which metal ions in electrodeposition composition 30 are reduced to form transition zone terminated superconformal filling 38 in recess 4 while V0 is greater than a suppressor breakdown voltage VB (see, e.g., FIG. 7). The potential can be kept at voltage V0 for dwell time DT1 from time t0 to time t1. At time t1, the potential is reduced to voltage V1 and held at voltage V1 until time t2 during dwell time DT2. Subsequent steps in the potential step waveform further reduce the potential for electrodepositing transition zone terminated superconformal filling 38 while maintaining the potential to be greater than suppressor breakdown voltage VB. Instead of a potential step waveform, the potential can be adjusted by a potential ramp, e.g., as shown in FIG. 6, wherein panel A includes a plurality of ramp rates with a discontinuity at time t1. In some embodiments, the ramp is continuous as shown in panel B.

Figure 5:
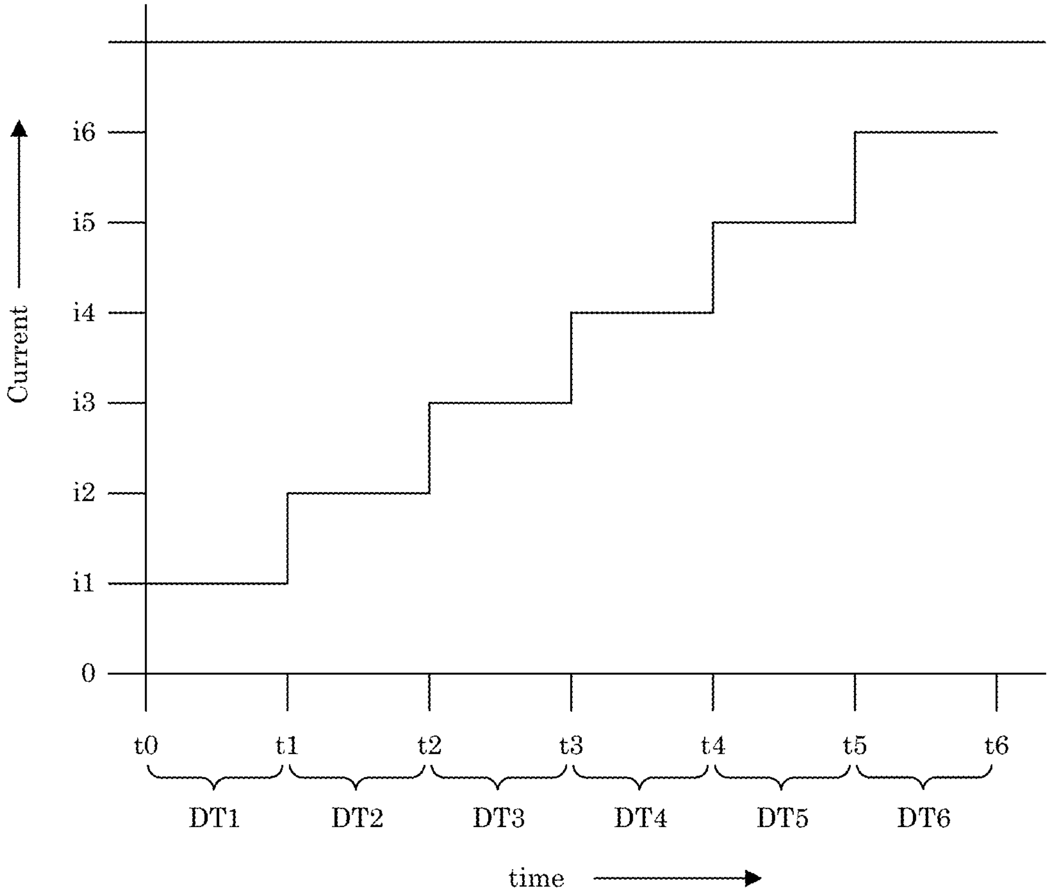
FIG. 5 shows a graph of current versus time.

It is contemplated that galvanodynamically controlling the electric current at recess 4 with a current wave form can be performed by making electrical contact of substrate 2 wall 6 to a power supply and then using the power supply to control the current. The current waveform can include a step waveform, current ramp, or a combination thereof. The current step waveform can include a first step with a first dwell time and a second step with a second dwell time, wherein the second step provides more electric current then the first step. The first dwell time and a second dwell time can be identical, or the first dwell time can be longer than the second dwell time. An exemplary current step waveform is shown in FIG. 5, wherein at time t0, the current of the current step waveform is i0 so that metal ions in electrodeposition composition 30 are reduced to form transition zone terminated superconformal filling 38 in recess 4 while the potential is greater than a suppressor breakdown voltage VB. The current can be kept at current i0 for dwell time DT1 from time t0 to time t1. At time t1, the current is increased to current i1 and held at current i1 until time t2 during dwell time DT2. Subsequent steps in the current step waveform further increase the current for electrodepositing transition zone terminated superconformal filling 38 while maintaining the potential to be greater than suppressor breakdown voltage VB. Instead of a current step waveform, the current can be adjusted by a current ramp that can include a plurality of ramp rates or a single ramp rate.

Figure 7:
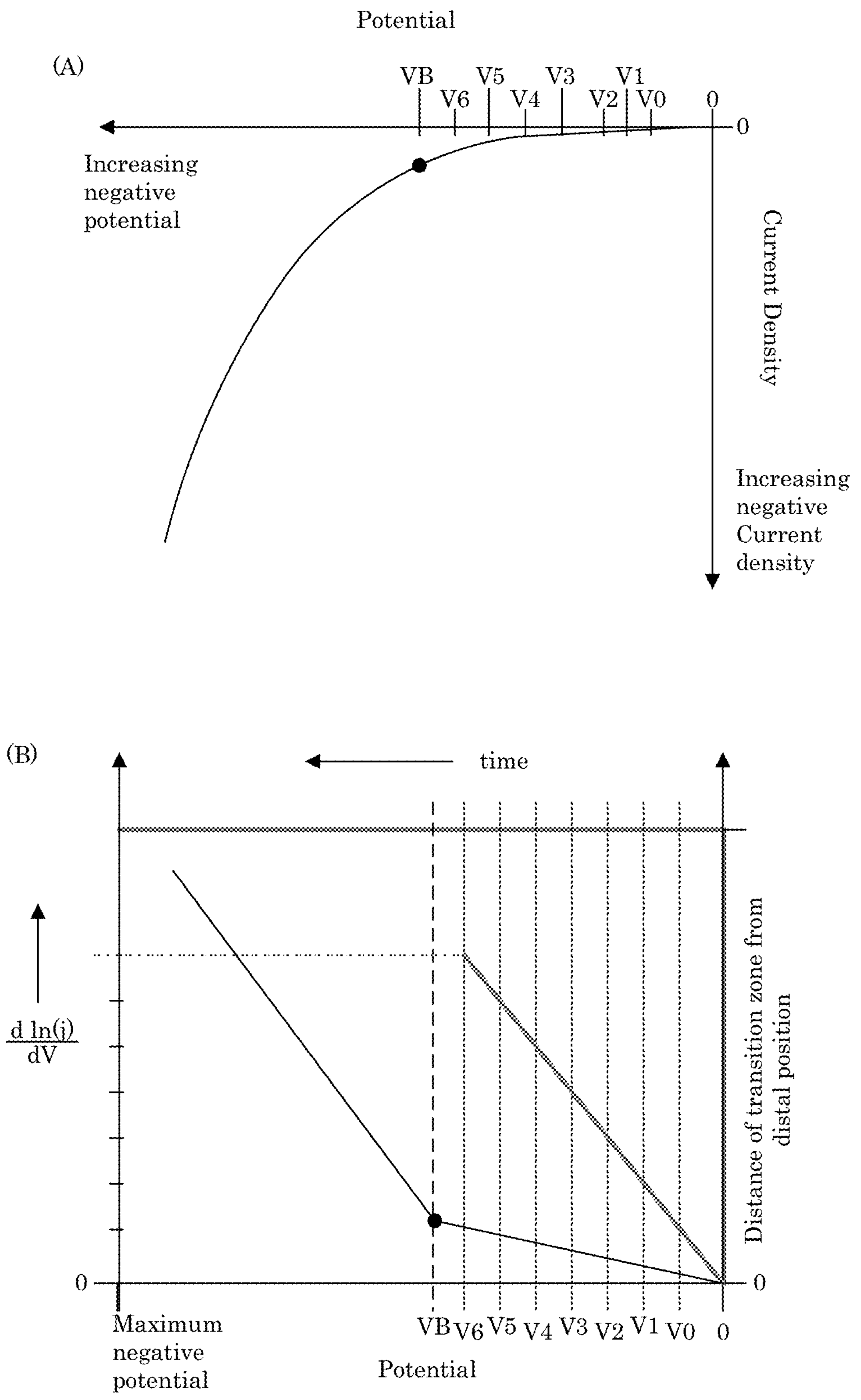
FIG. 7 shows a graph of potential versus current density in panel A, and panel B shows a graph of potential versus derivative of a natural logarithm of current density versus time and also distance of transition zone from distal position versus time.

As shown in panel A of FIG. 7, electrodeposition of the metal as transition zone terminated superconformal filling 38 in recess 4 occurs from a negative potential, e.g., V0, to a more negative potential, e.g., V1 to V6, that is more positive than suppression breakdown voltage VB. As used here in, "suppression breakdown voltage VB" refers to the lowest potential at which metal deposition can occur on field surface 10 in electrodeposition composition 30. Further, as shown in panel B of FIG. 7 (lefty-axis, bottom x-axis), a graph of a derivative of a natural logarithm of current density with respect to potential (i.e., d ln(j)/dV), is continuous at potentials below the suppression breakdown voltage VB. As the potential decreases to a more negative potential, the current density, e.g., at wall 6 or transition zone terminated superconformal filling 38, increases. Moreover, a distance of transition zone 32 from distal position 14 increases as the potential decreases as a function of a time of duration for electrodeposition of transition zone terminated superconformal filling 38 as shown in panel B of FIG.

7 (right y-axis, top x-axis). The potential can be changed to a value, e.g., greater than the reduction potential of the metal ions in electrodeposition composition 30, at a selected time to terminate depositing the metal before completely filling recess 4 to field surface 10 with transition zone terminated superconformal filling 38. In some embodiments, the potential is changed at a selected time to terminate depositing the metal upon or after completely filling recess 4 to field surface 10 with transition zone terminated superconformal filling 38.

Figure 8:
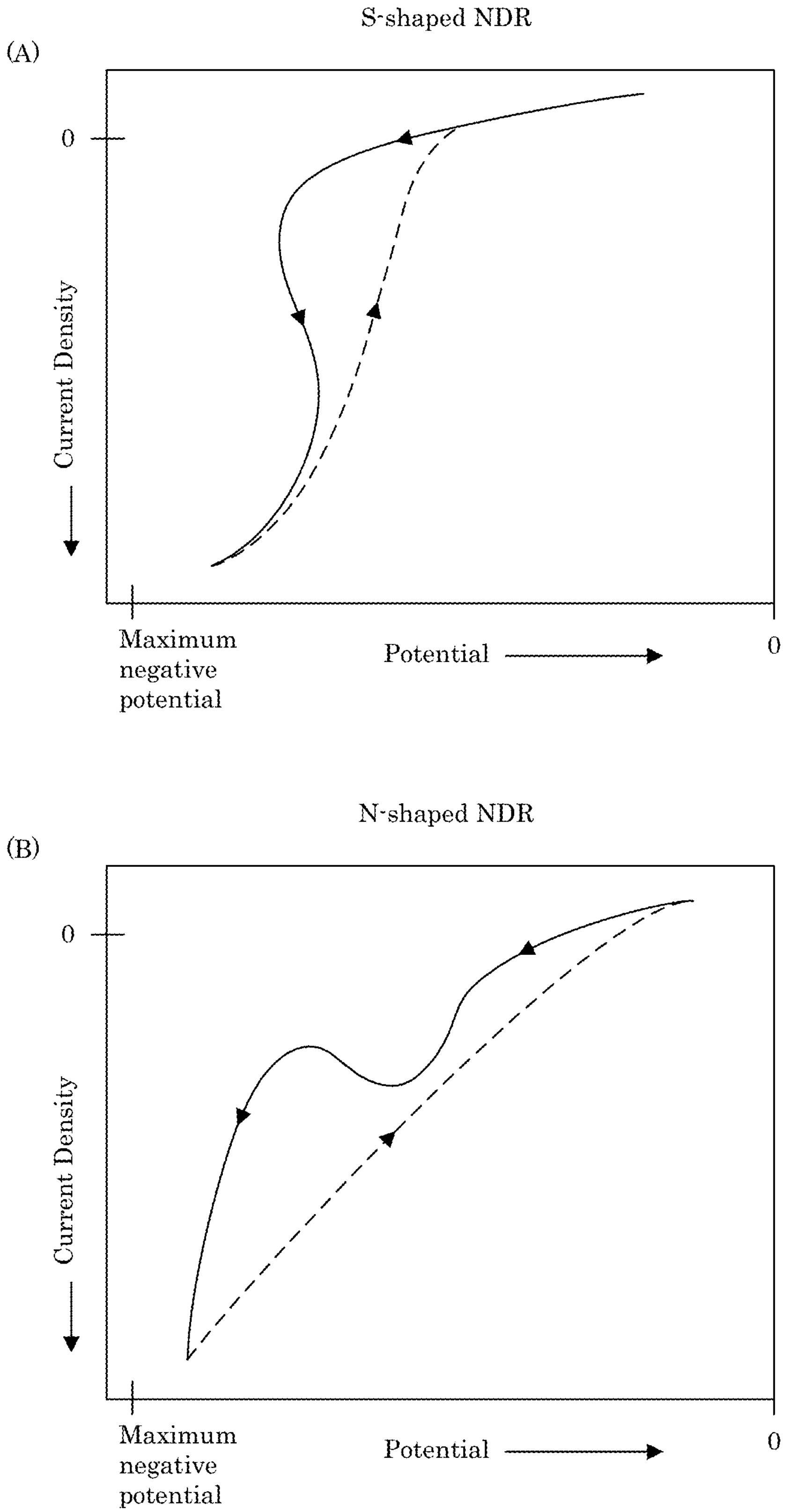
FIG. 8 shows a graph of current density versus potential for a cyclic voltammogram having an S-shaped negative differential resistance (S-NDR) in panel A, and panel B shows a graph of current density versus potential for a cyclic voltammogram having an N-shaped negative differential resistance (N-NDR)

Formation of transition zone terminated superconformal filling 38 from transition zone 32 to distal position 14 in active metal deposition region 36 while formation of transition zone terminated superconformal filling 38 is absent in passive region 34 occurs due to electrodeposition composition 30 in combination with potentiodynamically controlling the electric potential or galvanodynamically controlling the electric current at wall 6 of recess 4. In an embodiment, electrodeposition composition 30 provides an S-shaped negative differential resistance (S-NDR) cyclic voltammogram, e.g., as shown in panel A of FIG. 8. Some combination of metal ions, solvent, or additives provide a N-shaped NDR (N-NDR) as shown in panel B of FIG. 8. The S-NDR and potentiodynamically control of the electric potential above suppression breakdown voltage VB provide selected electrodeposition of transition zone terminated superconformal filling 38 in recess 4 with an absence of transition zone terminated superconformal filling 38 on field surface 10 of substrate 2.

The process for forming transition zone terminated superconformal filling 38 has numerous beneficial uses, including seam-free and void-free of vias, trenches and through vias for interconnects in microelectronics, filling of pinholes in boiler pipes and fabrication of magnetic structures. In an embodiment, transition zone terminated superconformal filling 38 can be used to make high aspect ratio Au interconnects in compound semiconductor devices.

The processes herein have numerous advantageous and beneficial properties. In an aspect, features formed through patterning or through corrosion can be filled without formation of seams or voids in extremely high aspect ratio features.

Advantageously, unexpectedly, and surprisingly, the process deposition can be as rapid as transport of the metal ion concentration permits because there is no, or minimal, deposition higher in the feature that might close off the feature beneath to electrolyte composition 30 and thus form a void lower down.

The articles and processes herein are illustrated further by the following Examples, which are non-limiting.

EXAMPLES

Example 1. Formation of Nickel Transition Zone Terminated Superconformal Filling Equations and this Example start with Eq. 1.

Coupling of suppression breakdown and surface topography provides controlled bottom-up nickel filling of a through silicon via (TSV). As described below, deposition was performed in an electrodeposition composition that included a $NiSO_4$+$NiCl_2$+$H_3BO_3$ metal electrolyte and a branched polyethyleneimine suppressor. The impact of deposition potential and additive concentration on the filling of a recess (e.g., a patterned feature) was examined. Voltammetric measurements, including the impact of rotation rate and suppressor concentration on the rate of metal deposition, were used to quantify the interplay between metal deposition to form a transition zone terminated superconformal filling and suppressor adsorption. The derived kinetics were used to quantitatively predict the observed superconformal filling. Based on this understanding, a strategy of progressively increasing the applied overpotential provided void-free feature filling. Moreover, the electrodeposition composition provides additive derived s-shaped negative differential resistance (S-NDR) in bottom-up superconformal deposition.

Location-dependent metal deposition derives from the competition between surface passivation by suppressor adsorption on depositing metal versus surface activation by suppressor consumption or disruption by depositing metal coupled with the effects of dissipative current flow. Critical behavior associated with suppression breakdown manifests as a negative differential resistance in iR-corrected cyclic voltammetry and underlies highly nonlinear dependence of deposition rate on location within the filling features. Highly localized deposition profiles are distinct from the smooth monotonic dependence of deposition rate on distance down filling features that can be ascribed solely to additive depletion.

The Watts-type $NiSO_4$+$NiCl_2$+$H_3BO_3$ nickel deposition system has suppressor induced critical behavior that occurs for certain additives. Here is examined nickel filling of TSVs in Watts electrolyte using branched polyethyleneimine (PEI) as a suppressor. We also quantify an impact of deposition potential in determining the threshold depth that marks the bifurcation between metal deposition and its suppression within vias. Combining electroanalytical measurements for different suppressor concentrations and deposition potentials with a model based on transport limited suppressor adsorption and its subsequent consumption through incorporation within the growing deposit is shown to predict TSV filling geometry as well as trends with suppressor concentration and deposition potential. Progressively increasing the applied overpotential enables complete feature filling to be accomplished. This strategy is analogous to ramping of the applied current. The transition zone terminated superconformal filling that includes Ni or its alloys have use for producing magnetic devices. By appropriate choice of an alloy, magnetic properties as well as the coefficient of thermal expansion are tunable.

Deposition was conducted at room temperature in a cell containing 40 mL of 1 mol/L $NiSO_4$+0.2 mol/L $NiCl_2$+0.5 mol/L $H_3BO_3$ prepared using 18 Ω·cm water. The pH of the electrolyte was 3.1, as measured using a pH sensor calibrated to buffer solutions of pH 4.0 and pH 7.0. Branched PEI was added to the electrolyte to suppress the Ni deposition reaction. A master solution containing 10 mmol/L PEI 1800 molecular weight (MW) was prepared using 18 Ω·cm water. The effect of small aliquots of PEI on the Ni deposition was examined by voltammetry on a Ni rotating disk electrode while the impact on feature filling was examined using TSV-patterned wafer fragments.

The electrolyte was sparged with nitrogen or argon to remove dissolved oxygen prior to experiments. During electrochemical measurements and feature filling experiments the electrolyte was blanketed by flowing nitrogen or argon in the head space of the cell. A $Hg/Hg_2SO_4$/saturated $K_2SO_4$ reference electrode (SSE) was connected to the working electrode compartment via a fritted salt bridge filled with saturated solution of $K_2SO_4$. All potentials in this paper are relative to this reference. A platinum counter electrode was held in a frit-separated cell immersed within the main cell.

Cyclic voltammetry was performed using a nickel coated rotating disk electrode (RDE) of 0.95 cm diameter (area 0.71 $cm^2$) embedded in epoxy. Because deposition in the additive-containing electrolyte was not uniform across the surface upon the breakdown of suppression, current densities and inferred Ni deposition rates obtained from the measured voltammetric current are ill-defined beyond suppression breakdown.

Feature filling was performed using ≈56 μm deep TSVs of annular cross-section having a 1 μm thick Cu seed in the field and a lesser amount on the side walls. To give definition to the metal ion and additive transport, the patterned substrates rotated about one end from a spindle during deposition, like a helicopter blade, the patterned surface facing up. Based on the ≈1 cm distance between the features and rotational axis for most of the imaged TSVs, the 100 rpm rotation rate corresponds to an estimated 10 cm/s flow rate over the surface. Pre-wetting with ethyl alcohol was used to displace air bubbles that were otherwise trapped in the TSVs during Ni deposition. Following immersion, the specimens were maintained at −1.05 V for 20 s prior to deposition at the desired potential(s) to enable mixing of the electrolyte with the alcohol in the TSVs. TSV filling as detailed in this work was not significantly changed by omission of this dwell potential. However, Ni deposition during the mixing process yielded visible Ni deposition on the field around and downstream of individual TSVs.

Figure 9:
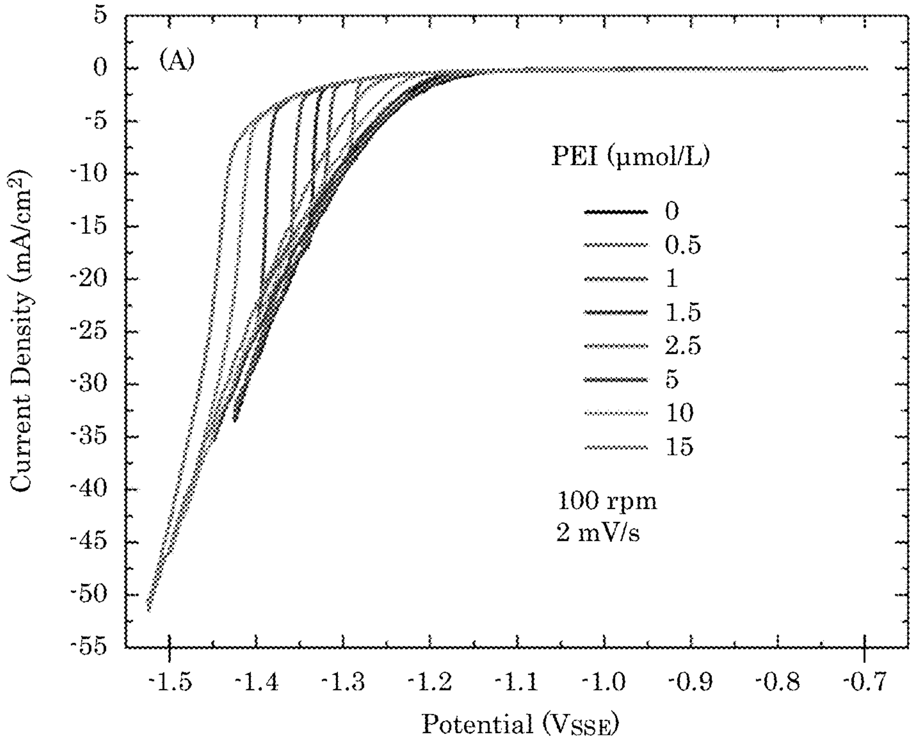
FIG. 9 shows a graphs of current density versus potential for cyclic voltammetry in electrolyte with 1800 molecular weight (MW) polyethyleneimine (PEI) concentrations ranging from 0 μmol/L to 15 μmol/L in which panel A shows data acquired with software correction for 80% of the 9Ω resistance between reference and rotating disc electrode (RDE) determined using the potentiometer's built in software, and panel B shows acquired data corrected for the remaining 20% of cell resistance, wherein the RDE was rotating at 100 rotations per minute (rpm) during deposition and scan rates are 2 millivolts per second (mV/s)
Figure 9:
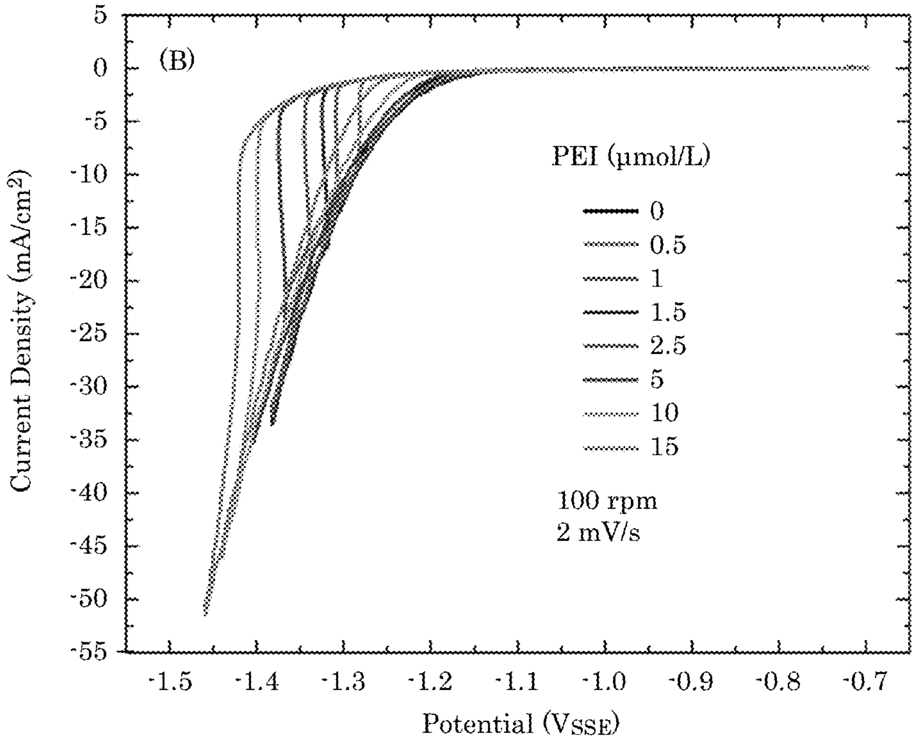

The impact of PEI additions on the Ni electrodeposition was examined using cyclic voltammetry (FIG. 9). Inhibition of metal deposition is immediately evident with even the lowest PEI additions. This is followed by sharp breakdown in the inhibition (suppression breakdown) after which the current merges with that for the additive-free case, yielding a hysteretic voltammogram. The potential where breakdown occurs is increasingly negative with increasing PEI concentration. Following breakdown, the voltammograms for PEI concentrations below 10 μmol/L follow that of the additive-free system. For higher PEI concentrations, some inhibition develops as the current decreases on the return sweep. For potentials negative of −1.3 V a slow rise in the current is evident prior to the breakdown potentials that suggests some leakage process associated with either metal deposition or parasitic electrolyte breakdown. The cyclic voltammograms shown in panel A of FIG. 9 were collected with software compensating for roughly 80% of iR potential drop. Post experiment correction of the potential for the remaining 20% shown in panel B of FIG. 9 makes the S-NDR nature of suppression breakdown unambiguous. Currents have been converted to current densities using the RDE area although the active area is ill-defined after suppression breakdown.

Figure 10:
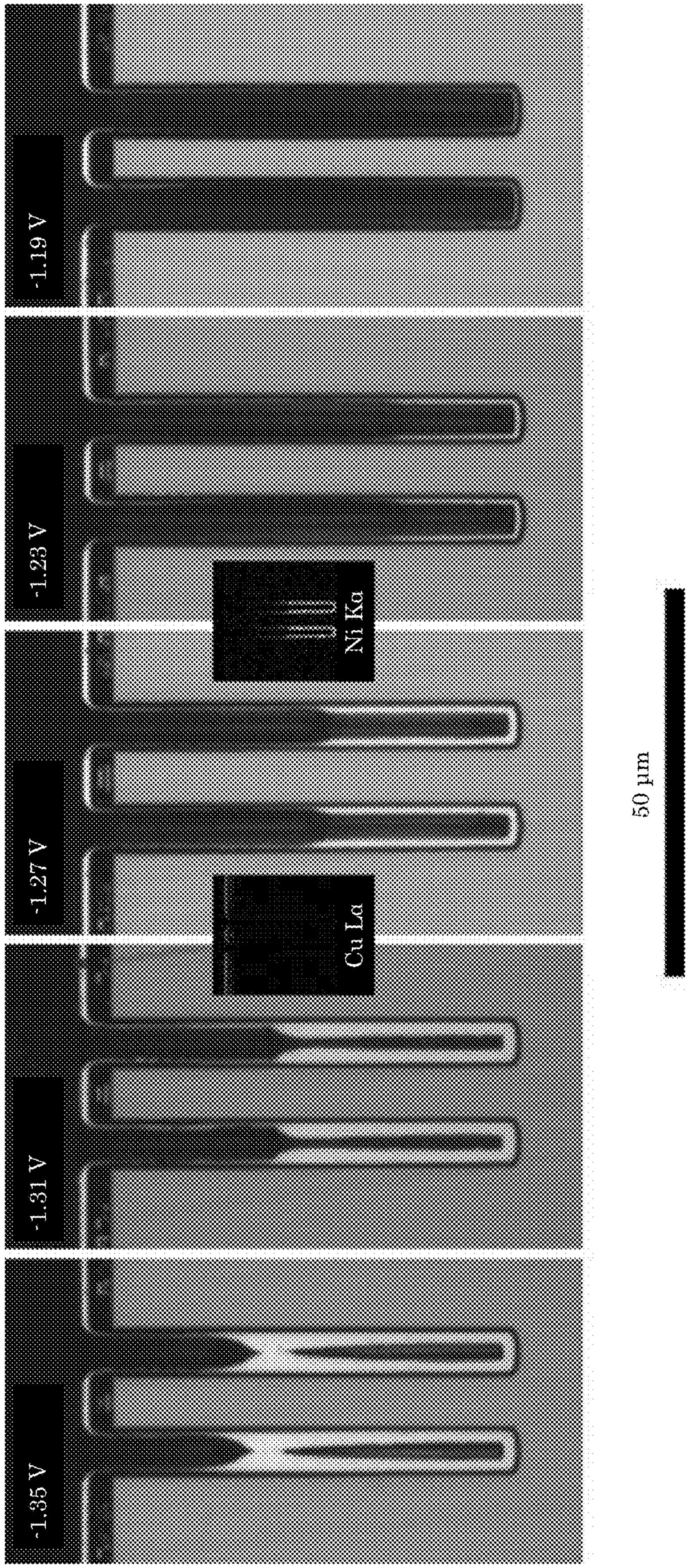
FIG. 10 shows cross-sectioned annular through silicon vias (TSVs) after 10 minutes of Ni deposition at the specified potentials in the presence of 15 μmol/L PEI in which the patterned wafer fragment substrates were rotating at 100 rpm during deposition, and inset composition maps based on the indicated x-ray emission lines for the specimen fabricated at −1.27 V differentiate the Cu seed that is thickest on the field from the Ni deposit localized at the bottom of the TSV.

Ni deposition on a TSV-patterned work piece in additive-free electrolyte results in deposition on all available surfaces. In the presence of PEI for deposition potentials that lie within the hysteretic voltammetric loop, distinctly different deposition behavior is obtained. The impact of applied potential on Ni deposition in the TSV is shown in FIG. 10, the range of Ni deposition in the lower portion of the TSV being progressively more limited with more positive potential. The two smaller x-ray dispersive spectroscopy images distinguish the Cu seed layer on the field from the Ni deposit localized within the vias. There is insignificant Ni deposition on the field in all cases. This observation, consistent with the potentials being positive of that associated with suppression breakdown on the RDE for the 15 μmol/L PEI containing electrolyte (FIG. 9), is significant. The region of complete or partial suppression is sustained for a distance from the top of the TSV that increases as the applied potential is shifted positively. The distance from the top surface (the field surface) to the location within the TSV where the maximum Ni deposition rate is (first) achieved is referred to as $d_s$. Potential fluctuations during deposition on the rotating substrates do not significantly impact this suppression breakdown length as substrates fixed at positions maximizing or minimizing potential drop from cell resistance exhibited indistinguishable values of $d_s$.

Figure 11:
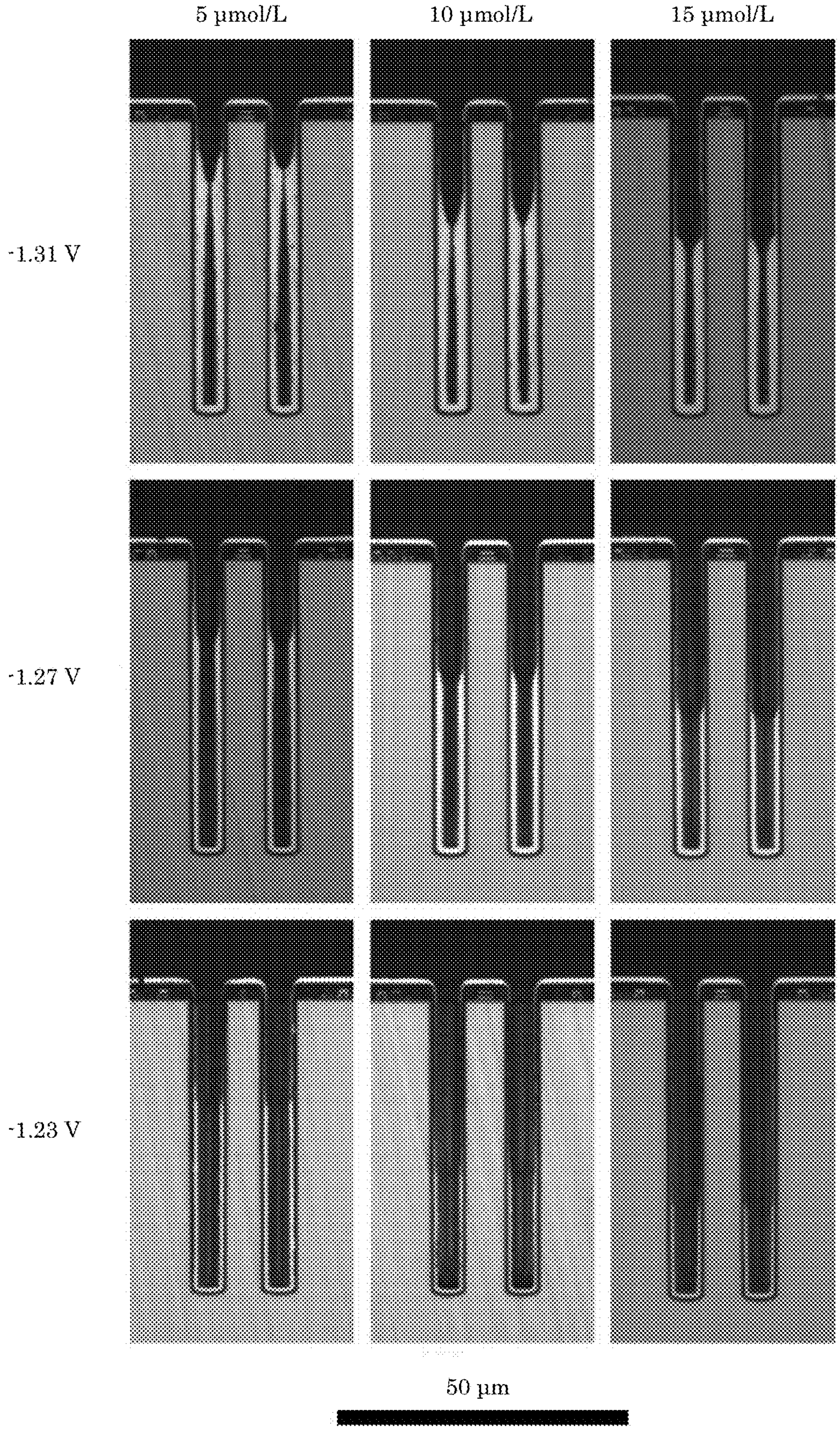
FIG. 11 shows cross-sectioned annular TSVs after 10 minutes of Ni deposition at 100 rpm, wherein an impact of increasing PEI concentration is shown from left to right, and the effect of increasing deposition overpotential from bottom to top.

FIG. 11 captures the impact of suppressor concentration on the suppressed length $d_s$ for three different applied potentials. The depth of the transition, and thereby the length of the suppressed region, increases with suppressor concentration. Likewise, the effect of potential on the depth of the passive-active transition is readily evident.

Figure 12:
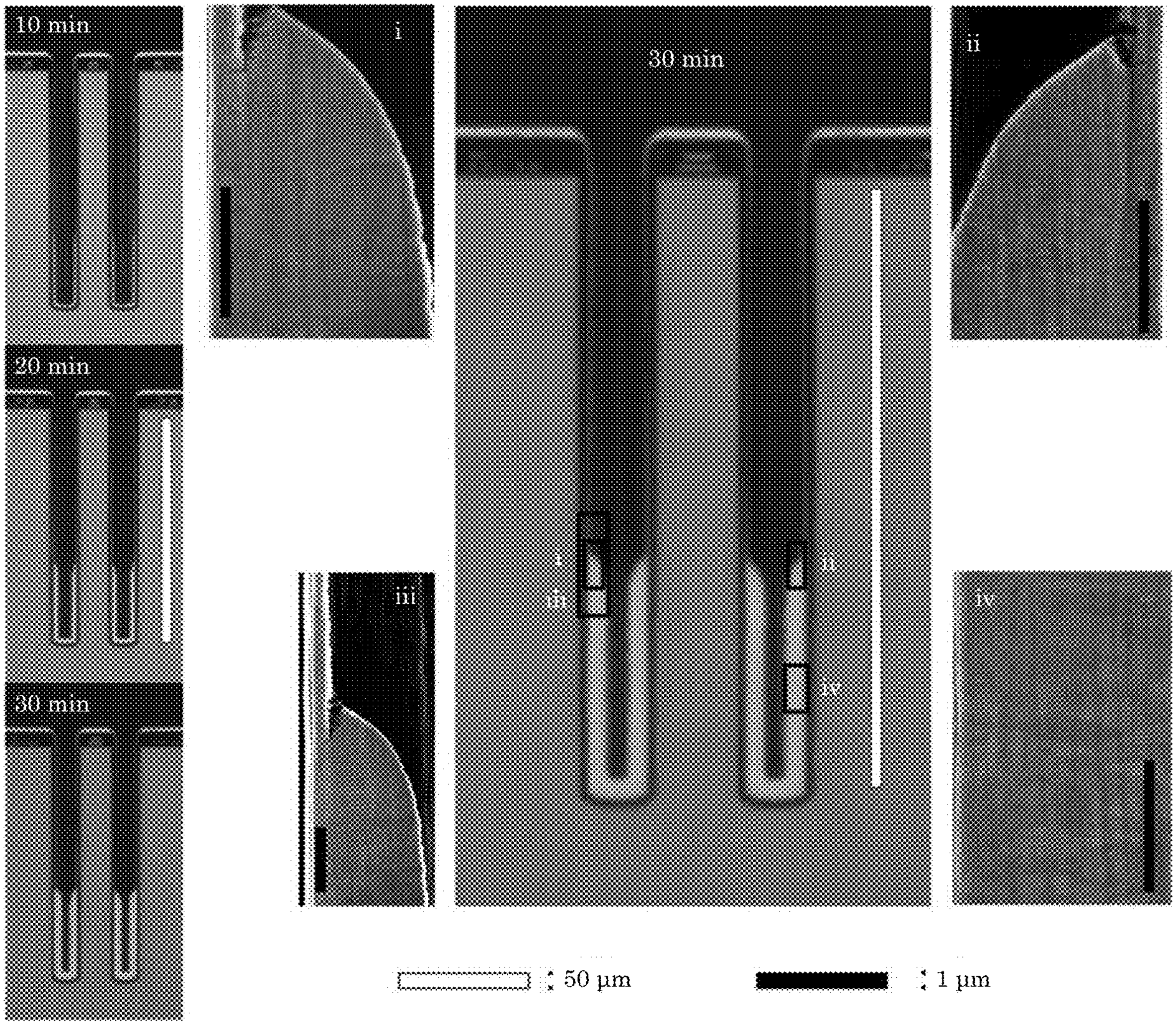
FIG. 12 shows optical images of TSVs after deposition at −1.23 V at 100 rpm with 15 μmol/L PEI for the indicated deposition times shown on the left, wherein scanning electron microscopy highlights of the thickest Ni deposit are shown on the right: (i and ii) finer grain structure in the transition region, (iii) thinner deposit above the transition region, (iv) columnar grains along the growth direction below the transition zone; ripples along the TSV axis are an artifact of specimen preparation, and lengths of the vertical white and black scale bars are 50 μm and 1 μm, respectively.
Figure 13:
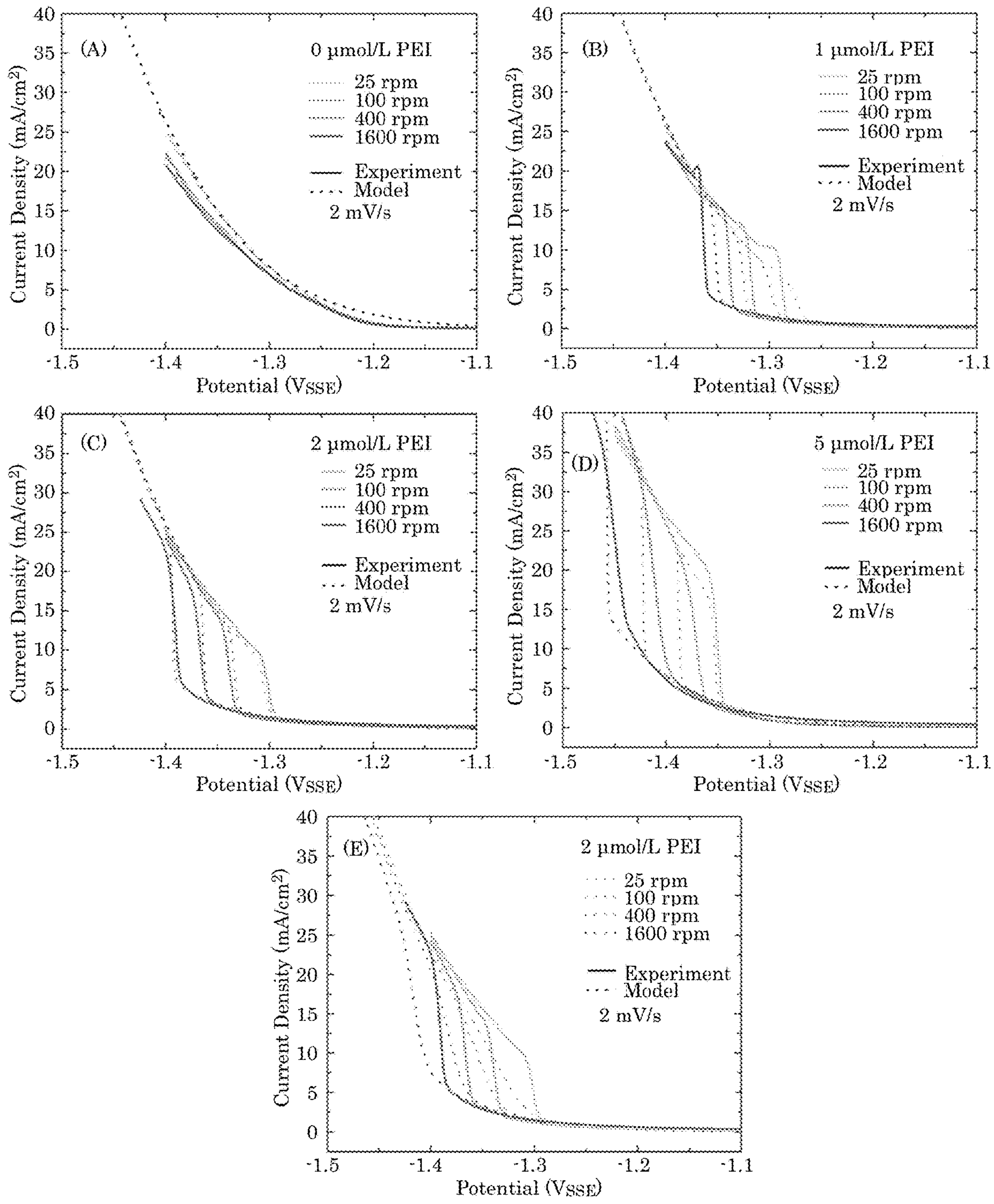
FIG. 13 shows experiment (solid) and simulated (dashed) voltammetry of Ni deposition in electrolytes with different additive concentrations showing the impact of RDE rotation rate on suppression breakdown with a) 0 μmol/L, b) 1 μmol/L, c) 2 μmol/L and d) 5 μmol/L PEI; panel E shows simulations for 2 μmol/L assuming 100% efficiency (with k_ also adjusted as per Table I for best fit); experimental currents are converted to current densities using the 0.71 $cm^2$ RDE area; experimental data was acquired without compensating for 20% of the R≈9Ω cell resistance; simulations utilize a potential history that includes an analogous 20% iR deviation from the applied potential, and data and simulations are both plotted against the applied potential with scan rates of 2 mV/s.

The left side of FIG. 12 captures the general observation that, for fixed convection, deposit thickness scales with deposition time with little change of the vertical range of active deposition. The suppressed length $d_s$ is defined by the available PEI flux (i.e., concentration and hydrodynamics) and applied potential. Close inspection by scanning electron microscopy shows that there is still Ni deposition for a limited distance above the visible transition, but the growth rate is more than an order of magnitude slower than that below the transition and decreases farther up the TSV. Columnar grains oriented along the growth direction normal to the sidewalls are evident in the thicker deposit while there appears to be a much finer grain structure within the transition zone that marks the onset of active deposition.

In the RDE studies, as in feature filling, the fractional suppressor coverage θ is assumed to evolve through adsorption from the electrolyte and consumption in the deposit according to $$\frac{d\theta}{dt} = k_+ C_S(1-\theta) - k_- v\theta \qquad [1]$$

where $k_+$ and $k_-$ are kinetic rate constants defining the suppressor adsorption and consumption or disruption, respectively, for metal deposition rate v and local suppressor concentration $C_S$. The metal deposition rate is assumed to be proportional to the local Ni ion concentration $C_{Ni}$ and a linear function of the suppressor coverage θ

$$v(\theta, \eta) = \frac{\Omega}{nF}[j_{\theta=0}(1-\theta) + j_{\theta=1}\theta]\frac{C_{Ni}}{C_{Ni}^o} \qquad [2]$$

expressed here in terms of the current density on unsuppressed ($j_{\theta=0}$) and suppressed ($j_{\theta=1}$) surfaces at the bulk Ni concentration $C_{Ni}^o$ where Faraday's constant F=96485 C/mol, n is the ionic charge and Ω is the molar volume. The respective current densities are assumed to exhibit standard dependence on overpotential η (relative to the reversible potential of ≈−0.75 V estimated from the cyclic voltammetry)

$$j_{\theta=0} = j_{\theta=0}^o e^{-\frac{\alpha_{\theta=0}F\eta}{RT}} \qquad [3]$$

$$j_{\theta=1} = j_{\theta=1}^o e^{-\frac{\alpha_{\theta=1}F\eta}{RT}} \qquad [4]$$

where the back reaction has been ignored as its contribution is insignificant at the large overpotentials used in the feature filling experiments. A quantitative and predictive description of TSV filling requires knowledge of the suppressor adsorption and consumption kinetics $k_+$ and $k_-$, the deposition rate constants $j_{\theta=0}^o$ and $j_{\theta=1}^o$ and the kinetic factors $\alpha_{\theta=0}$ and $\alpha_{\theta=1}$.

Values for $j_{\theta=0}^o$ and $\alpha_{\theta=0}$ were determined by fitting voltammetric data from additive-free electrolyte. In a similar fashion $j_{\theta=1}^o$ and $\alpha_{\theta=1}$ were estimated by fitting the negative-going sweeps for the PEI-containing electrolytes up to the sharp onset of suppressor breakdown. The consistent suppressed current density for the different PEI concentrations (see FIG. 9) suggests that the surfaces are saturated with PEI prior to the breakdown event. While this current can represent leakage current associated with Ni deposition and/or a parasitic process such as proton reduction, $j_{\theta=1}^o$ and $\alpha_{\theta=1}$ as used in Eq. 2 represent only the portion of the current density associated with the Ni deposition.

Values for $k_+$ and $k_-$ were obtained by fitting the dependence of suppression breakdown potential on the suppressor concentration and RDE rotation rate. Given the relatively slow 2 mV/s potential ramp rate and specified hydrodynamics, a pseudo steady state solution having a uniform gradient of the suppressor concentration (i.e., a linear decrease) across the boundary layer was used to model the voltammetric response. In the case of critical phenomena, the pseudo steady-state boundary model, with the suppressor gradient always across the full hydrodynamic boundary layer, will underestimate the suppressor flux available after suppression breakdown during the relaxation time $t_r$ required for the thickness of the suppressor depletion gradient $(D_S t)^{1/2}$ to evolve to the hydrodynamic boundary layer thickness δ, i.e., $t_r=\delta^2/D_S$. It is expected that fitting the model to the 2 mV/s voltammetry with its sharp breakdown of inhibition will therefore yield a slight overestimate of $k_+$ and/or underestimate of $k_-$. The small errors arising from the model simplification do not, however, obscure the essential nature of the model nor, as is shown next, prevent it from successfully capturing the experimental TSV filling data.

Simulations were obtained by integrating Eq. 1 to determine θ(t), with Eqs. 2 to 4 providing v(θ, η) while the balance of flux across the hydrodynamic boundary layer and adsorption onto the surface was captured by Eq. 5.

$$D_s\frac{C_S^o - C_S}{\delta} = \Gamma k_+ C_S(1-\theta) \quad [5]$$

Using estimated values listed in Table I for areal density of sites Γ and suppressor diffusion coefficient $D_S$ (taken from previous modeling of Cu bottom-up filling) and boundary layer thickness δ (scaling with rotation rate ω as $\omega^{-0.5}$), $k_+$ and $k_-$ were adjusted to fit the experimental breakdown potentials. Negligible metal ion depletion was assumed so that $C_{Ni}^o=C_{Ni}$. FIG. 13A-D shows the experimental voltammetric data used for the parameterization. Only 80% iR compensation was used during acquisition of the data. Thus, while the data is plotted against the applied potential, the workpiece potential deviated from the applied value by a time-dependent value −0.2×iR. Potential histories in the simulations are therefore adjusted by −0.2×iR from the applied 2 mV/s ramp and plotted against the applied potential for comparison. Fitting involved adjusting $k_+$ and $k_-$ to best capture the dependence of suppression breakdown potential on rotation rate and suppressor concentration. Fitted curves (dashed lines) are overlaid on the experimental results (solid lines). The fits, shown for 10% efficiency of the metal deposition reaction on the suppressed surface, include both the current density associated with metal deposition $j_{\theta=0}(1-\theta)+j_{\theta=1}\theta$ and the parasitic term $9j_{\theta=1}$.

TABLE I

| Parameter | Name | Units | Value |
|---|---|---|---|
| TSV inner radius | $r_i$ | m | $4\times10^{-6}$ |
| TSV outer radius | $r_o$ | m | $9.5\times10^{-6}$ |
| TSV height | h | m | $56\times10^{-6}$ |
| Diffusion coefficient, suppressor[11] | $D_S$ | $m^2/s$ | $9.2\times10^{-11}$ |
| Bulk concentration, Ni | $C_{Ni}^o$ | $mol/m^3$ | 1200 |
| Boundary layer thickness for rotation rate ω = 50π rad/s (25 rpm) | δ | m | $46\times10^{-6}$ |
| Saturation suppressor coverage[11] | Γ | $mol/m^2$ | $2.5\times10^{-7}$ |
| Suppressor adsorption kinetics | k+ | $m^3/mol\cdot s$ | $1\times10^4$ |
| Suppressor burial kinetics: 10% efficiency (100% efficiency) | k− | 1/m | $3\times10^8$ ($5\times10^7$) |
| Unsuppressed Ni exchange rate constant | $j_{\theta=0}^o$ | $A/m^2$ | $1.3\times10^{-3}$ |
| Suppressed Ni exchange rate constant: 10% efficiency (100% efficiency) | $j_{\theta=1}^o$ | $A/m^2$ | $2.5\times10^{-5}$ ($2.5\times10^{-4}$) |
| Unsuppressed charge transfer coefficient | $\alpha_{\theta=0}$ | — | 0.4 |
| Suppressed deposition charge transfer coefficient | $\alpha_{\theta=1}$ | — | 0.4 |
| Ni ionic charge | n | — | 2 |
| Ni molar volume | Ω | $m^3/mol$ | $6.59\times10^{-6}$ |

While a higher deposition efficiency is suggested by deposits visible immediately above the location of suppression breakdown (e.g., FIG. 12), the low deposition efficiency used in the simulations is consistent with the absence of Ni deposits on the field and uppermost regions of the TSVs. The lower efficiency is also required to fit the sharply defined experimental suppression breakdown. Specifically, the exchange rate constant $j_{\theta=1}^o$ for the passivated surface based on the full measured current differs from $0)_{=0}$ for the active surface by only a factor of ≈5 (Table 1). Therefore, if 100% efficiency is assumed, change of the adsorbate consumption rate with coverage is similarly modest (Eq. 1) yielding prediction of gradual suppression breakdown (FIG. 13E). The impact on model predictions of the assumed efficiency of electrical current to metal deposition rate is detailed later.

Absent direct measurements of the suppressor surface coverage and the partitioning of the leakage current between metal deposition versus parasitic processes on the suppressed surface, the rate constants given in Table 1 are understood to represent only one example of the locus of parameters providing similar quality of fit to the voltammetric response. In addition, due to possible PEI deactivation through complexation with the $Ni^{2+}$ ions or dilute metal impurities in the Ni salts, the experimental suppressor concentrations are upper bounds on the actual values.

As fit, the increasingly negative potential of suppression breakdown at higher rotation rates results from increased transport of suppressor that enables inhibition to be maintained to the higher rates of adsorbate consumption that accompany the higher leakage current at more negative potentials. Dependence of the breakdown potential on hydrodynamics is thus a measure of the potential dependent suppressor consumption during deposition reflected in the leakage current on the passivated surface.

The sharp breakdown of inhibition evident in the voltammetric curves (see FIG. 13) reflects a two-state active-passive system. The critical potential represents the point at which balance is achieved between the rate of suppressor adsorption from the electrolyte and the rate at which the adsorbed suppressor is consumed by the potential-dependent metal deposition. Active deposition at more negative potentials rapidly disrupts and buries the adsorbed suppressor while at more positive potentials deposition is effectively blocked by the suppressor-passivated surface. The potential at the electrode is offset from the applied potential by the dissipative resistive losses associated with the total current flux to the electrode that is, itself, intimately coupled with the available electroactive area. It is this combination that, coupled with suppressor diffusion, gives rise to the S-NDR voltammetric behavior. For the recessed TSV geometry, the decrease of suppressor concentration within the feature effectively introduces a position-dependent shift of the critical potential toward more positive values compared to that of the free-surface (see FIG. 9). This accounts for passivation breakdown being localized within the feature where the height of the passive-to-active transition zone is determined by the transport constrained suppressor flux. The deposit in the actively plated region of the TSV, uniformly thick and essentially independent of suppressor concentration, reflects the active state of the bifurcated system.

The Ni deposition rate is generally uniform in the active region within the features, indicating minimal nickel ion depletion, at least for early deposition times. The analysis sets the concentration of $Ni^{2+}$ to the bulk value everywhere ($C_{Ni}=C_{Ni}^{o}$ in Eq. 1) and considers the suppressor concentration $C_s$ as a function of height within the TSV. Furthermore, although iR drop between the reference and substrate plays a role in initially localizing deposition, as already noted, the 20 s idling potential used for pretreatment prior to deposition in the TSVs passivated the free surface before Ni filling was initiated. As a result, the currents from the working electrode during TSV filling are modest and iR drop shifts the electrode potential only minimally, so impact of the current distribution on the applied filling potential is also neglected in this analysis.

Given the inner radius $r_i$ and outer radius $r_o$ of the annular TSV, mass balance requires that divergence of the suppressor flux down the cross-sectional area $a_f=\pi(r_0^2-r_i^2)$ equal the rate of suppressor adsorption on the surrounding sidewall perimeter $p_f=2\pi(r_o+r_i)$, i.e., $$a_f D_s \frac{d^2 C(z)}{d^2 z} = p_f \Gamma C(z) k_+ (1-\theta) \quad [6]$$

The schematic in FIG. 14A defines the positions z for Eqs. 6 through 8. The schematic in FIG. 14B provides dimensions. Also, the concentration at the substrate side of the boundary layer equals that at the top of the TSV, and the flux across the linear gradient of the boundary layer equals the sum of adsorption on the field around the TSV and that going down the TSV. Combined, these yield $$a_s D_s \frac{C_s^{\infty} - C(0)}{\delta} = (a_s - a_f)\Gamma C(0) k_+ (1-\theta) + a_f D_s \frac{dC}{dz}\Big|_{z=0} \quad [7]$$

where, for boundary layer thickness δ less than the spacing of TSVs as in the experiments, the mass balance is invoked over the square area $a_s=\delta^2$ around each TSV (FIG. 14C). Finally, mass balance at the bottom of the TSV includes equality of the suppressor flux and rate of suppressor adsorption $$\Gamma C(-h) k_+ (1-\theta) = D_s \frac{dC}{dz}\Big|_{z=-h} \quad [8]$$

Figure 15:
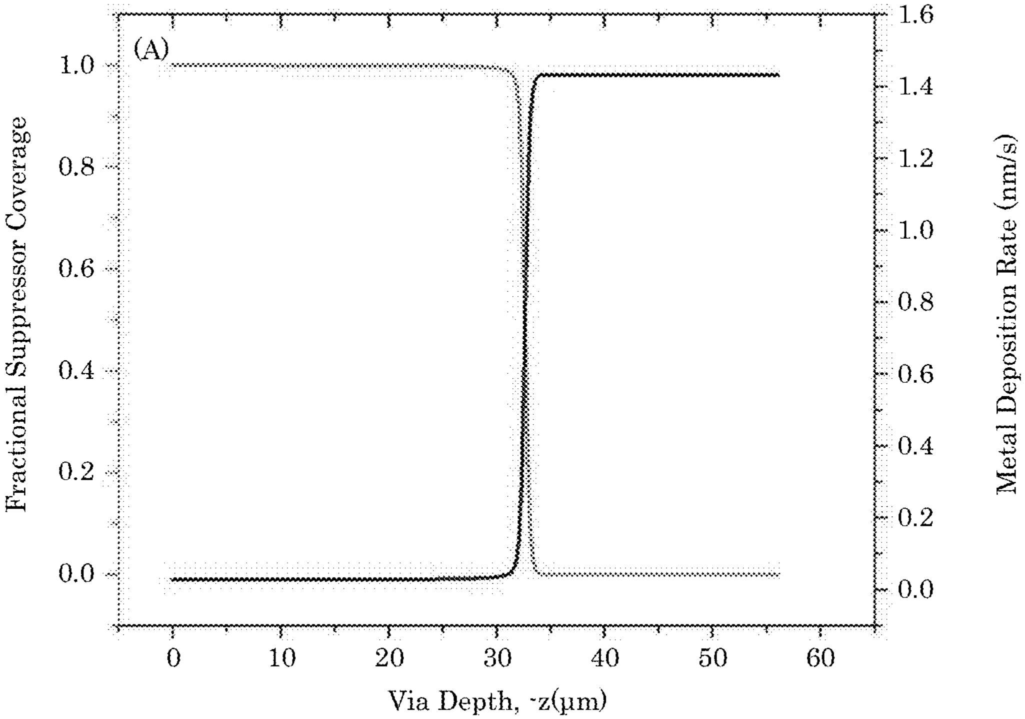
FIG. 15 shows simulations for 10 μmol/L PEI and −1.26 V including (panel A) deposition rate and adsorbate coverage and (panel B) suppressor concentration and consumption rate as functions of distance from the top of the TSV.
Figure 15:
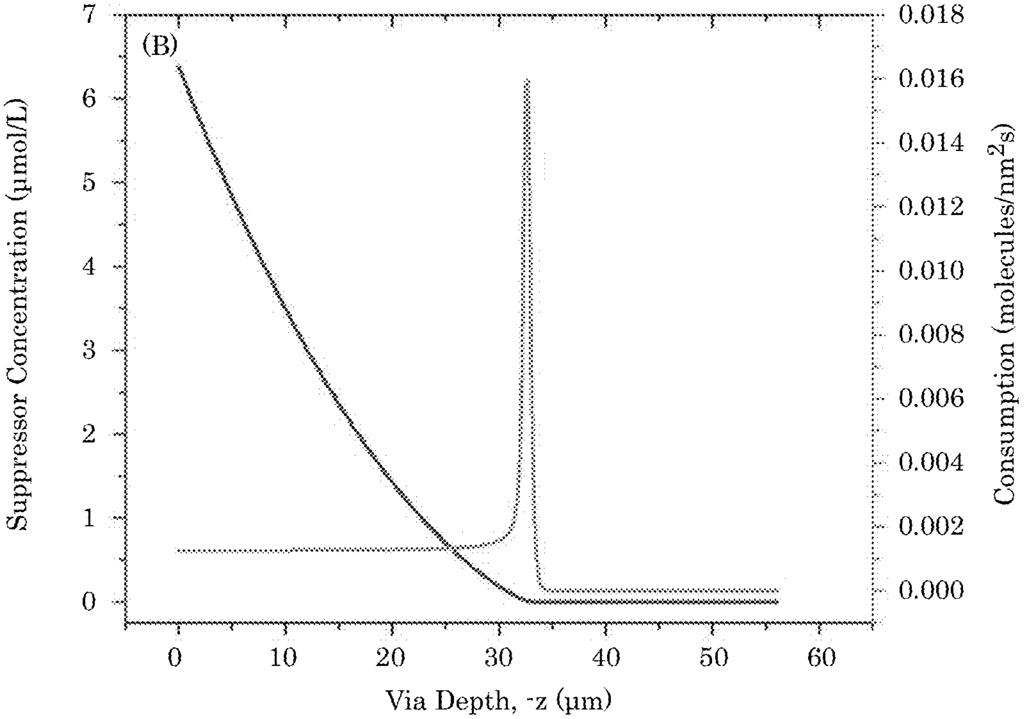

The differential equation and boundary conditions in Eqs. 6-8 and suppressor adsorption and metal deposition interactions defined by Eqs. 1-4 permit simulation of deposition profiles using the parameters determined by the RDE experiments (Table 1). Examples of predicted deposition profiles are shown in FIG. 15. Consistent with experimental observations, fully suppressed deposition is predicted in the upper portion of the TSV with a micrometer scale transition to fully unsuppressed deposition (FIG. 15A) in the lower portion of the TSV. The corresponding suppressor coverage is overlaid. FIG. 15B shows the corresponding variation of suppressor concentration down the TSV; the concentration has already decreased significantly across the boundary layer. The associated rate of suppressor consumption per area of deposit, Γk_νθ (the consumption term in Eq. 1 dimensionalized through multiplication by Γ), is also shown. The suppressor consumption peaks in the transition zone, no suppressor going further down the TSV. Suppressor consumption per unit volume of Ni deposit, equal to Γk_νθ divided by the rate of metal deposition ν, is Γk_θ, and thus scales with θ shown in FIG. 15A. Of the active Ni deposition, only the transition zone is predicted to have suppressor incorporation. The finer grained microstructure evident in the transition zone of the deposits in FIG. 12 is consistent with this prediction on the assumption that additive incorporation leads to enhanced grain refinement.

Figure 16:
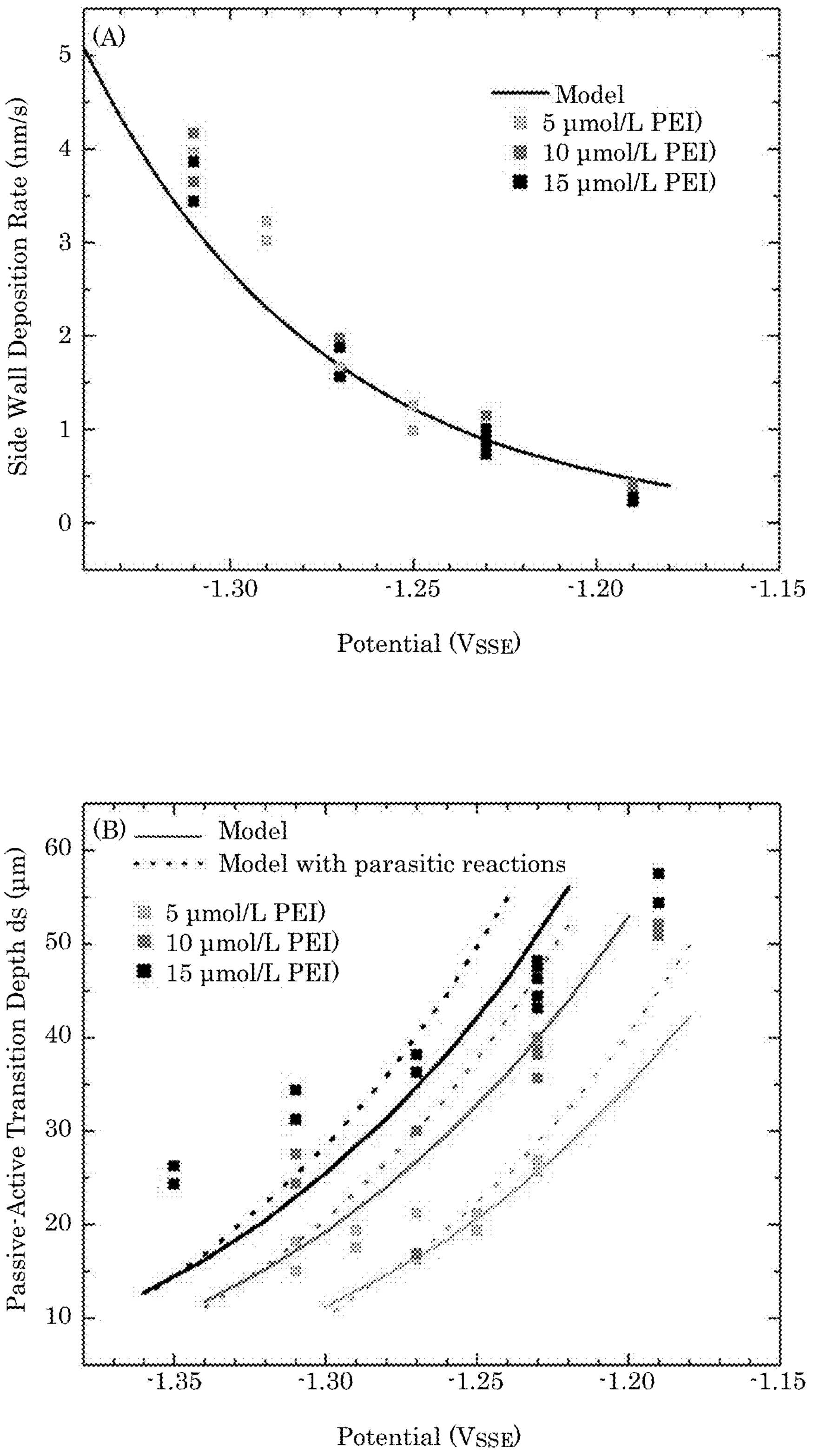
FIG. 16 shows a graphs of experimental values and model predictions for the indicated PEI concentrations as functions of applied potential in which (panel A) maximum and minimum deposition rates from each specimen determined from deposit thickness measured in the region of active deposition with predicted deposition rate $j_{\theta=0}{}^{o}\Omega/nF$ (where omega is the specific volume of the deposited metal or alloy and n the number of equivalents and F is Faraday's constant) and (panel B) maximum and minimum distance $d_s$ from each specimen measured from the field over the TSVs to where fully active deposition first occurs going down the TSVs with the predicted distance from the field to where the deposition rate achieved 99% of its maximum value, wherein predictions are shown in panel B for current efficiency 10% (dashed lines) and 100% (solid)

Predicted profiles can be directly compared to the experimental results for partial TSV filling (examples in FIG. 10 to FIG. 12). The experimental deposition rates (measured thickness divided by deposition time) of the actively growing regions and $d_s$ values for three PEI concentrations are shown in FIG. 16 as functions of the applied potential.

The (sub)micrometer deposit thicknesses used to evaluate the deposition rates in FIG. 16A were obtained using scanning electron microscopy. Maximum and minimum values are indicated for all the TSVs measured on each specimen. For specimens exhibiting a significant gradient of the deposit thickness below the transition zone (due to metal ion depletion in the higher aspect ratio regions of substantially filled features) values are given for the thickest regions. Good agreement between the experimental deposit thicknesses and the values derived from the additive-free RDE voltammetric data in FIG. 13A supports the absence of significant suppressor in the electrolyte below the transition regions in the TSVs. It also indicates that the actively growing Ni on the bifurcated surface is essentially adsorbate-free as suggested by the unsuppressed return sweeps of the voltammetric data in FIG. 9.

FIG. 16B compares the experimental and predicted values of the depth $d_s$ where the passive to active transition occurs within the TSV for three different suppressor concentrations as a function of applied potential. Predictions are shown based on simulations using parameters from Table 1 for suppressed deposition current that is 10% as well as 100% efficient. The deposition efficiency affects the predictions modestly. The model captures the observed increase of transition depth with suppressor concentration and potential in both cases, although it overestimates the latter dependence.

Prediction of the highly non-linear deposition profiles in the TSVs, using parameters determined from planar RDE studies, demonstrates the power of this simple 1-D pseudo steady state model based on the S-NDR mechanism for superconformal filling. Factors expected to impact the quality of fit over the potential range include incomplete understanding of suppressor consumption on the growing sidewalls, disturbance of the suppressor transport and adsorption within the feature during exchange of the wetting ethanolic solution and electrolyte, and uncertain parameterization of the suppressed state from the voltammetric leakage currents. As discussed above, the relevant metal deposition kinetics on the suppressed surface are not firmly established. This contrasts with the 100% efficiency used to obtain $j_{\theta=0}{}^{o}$ from the cyclic voltammetry for unsuppressed deposition in FIG. 13A, which successfully predicts deposition rates observed inside the TSVs (FIG. 16A).

The transition in fractional suppressor coverage from 0.99 to 0.5 is predicted to occur over ≈1 μm, with full breakdown thus predicted to occur over ≈2 μm down the TSVs. This is roughly half the lengths of the transition zones seen in several the cross-sectioned specimens. The difference is likely related to the ≈5 μm width of the annular vias, the sidewall consumption and the area expansion that accompanies deposition on the convex inner surface segments, all of which make the actual solution truly two-dimensional at the local scale. It is also worth reiterating that for consumption of the suppressor species given by k_vθ (Eq. 1), the increasing deposition rate and falling suppressor coverage in the transition zone (FIG. 15) can yield high suppressor consumption in this location and minimal consumption farther down the TSV, consistent with the local grain refinement observed in the transition zone.

Potentiostatic control determines the location where the electrode (or a surface of a recess) bifurcates into passive areas and regions of active metal deposition. Experiments and analysis indicate that the passive to active transition zone does not substantially progress up the feature with time. However, with time, conformal deposition within the active region often fails to produce void-free filling as the aspect ratio of the growth front, i.e., the height of the active region divided by the width of the unfilled volume within it, increases, leading to centerline voids through pinch-off of the colliding side-walls. A potential wave form or ramp that progressively moves the passive-active transition zone during metal deposition offers a means to develop superconformal growth fronts that favor void-free feature filling. Higher suppressor concentrations, characterized by larger voltammetric hysteresis, provide a wider potential range that facilitates the use of such potentiodynamic control for superfilling recessed surface feature. The higher concentrations also enable use of the higher deposition rates at more negative potentials, permitting faster filling.

Figure 17:
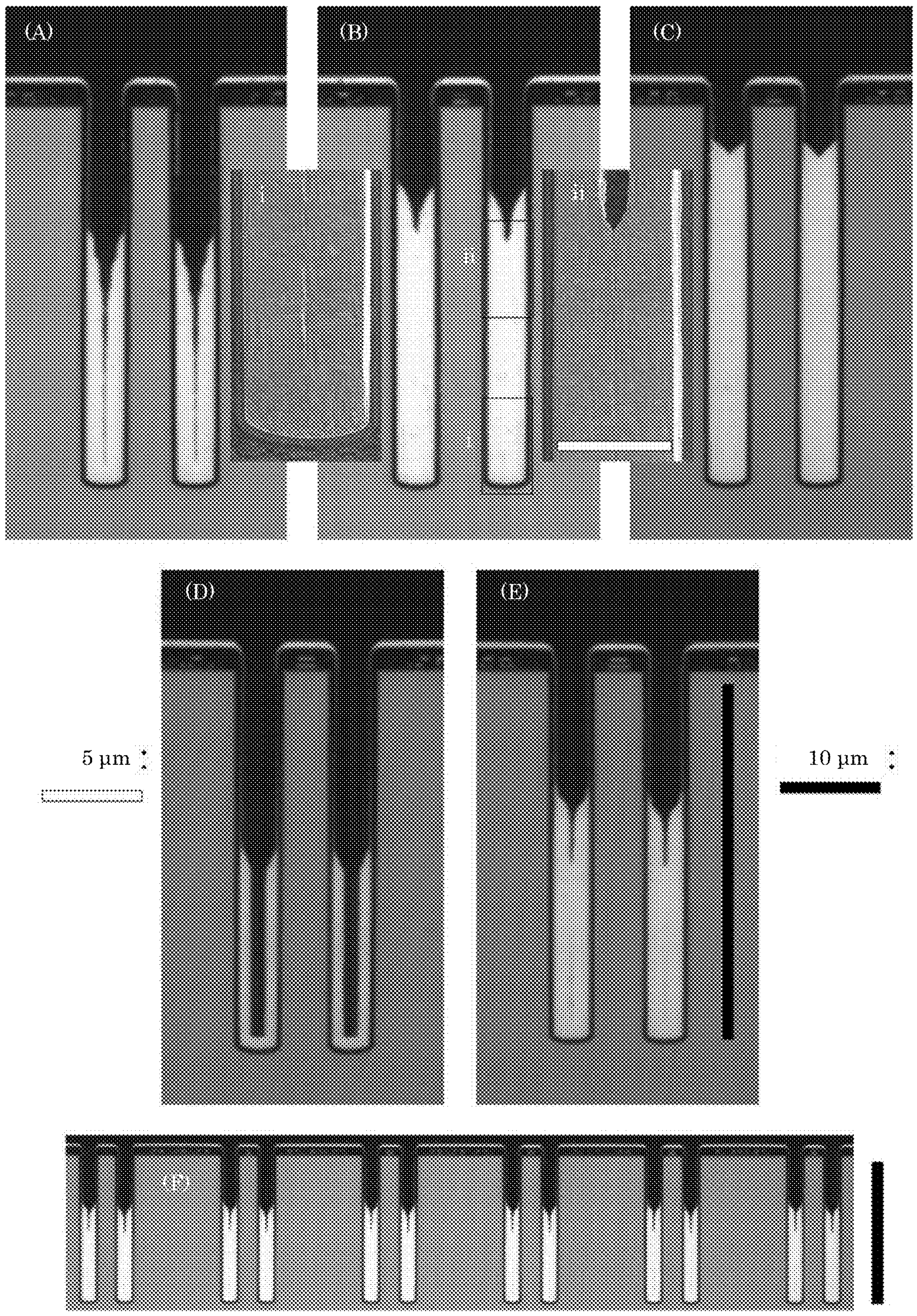
FIG. 17 shows cross-sectioned annular TSVs after Ni deposition in electrolyte containing 10 μmol/L PEI at a series of potentials: 10 min at potentials in −20 mV increments from −1.21 V to (panel A) −1.27 V, (panel B) −1.29 V, and (panel C) −1.31 V, (panel D) 30 min at −1.23 V and (panel E) and (panel F) 20 min at −1.23 V then −1.27 V, wherein inserts (i) and (ii) obtained by scanning electron microscope show a few small voids along the central seam of b), and a concavity above each void is an artifact of ion polishing used for surface preparation, wherein patterned wafer fragment substrates were rotating at 100 rpm.

The evolution of essentially void-free feature filling by use of a potential-step waveform is captured in FIG. 17A-C, the potential stepped −20 mV every 10 min from −1.21 V to −1.31 V to progressively advance the passive-active transition up the TSV. FIG. 17A captures the v-notch shaped growth front obtained after three potential step increments over 30 min. Close inspection reveals inflection points along the v-notch growth surface that mark the heights of the passive-active transitions at the more positive potentials. The v-notch profile provides a path for void-free via filling by "geometrical leveling" whereby the surface shape permits void-free filling even for conformal deposition. As captured in FIGS. 17B and C subsequent filling is practically void-free. The role of the potential increment is demonstrated in FIGS. 17A D and E where the larger shift of the passive-active transition for the −40 mV increments yields taller step than those obtained with the −20 mV increments of FIG. 17A-C. The result is a narrower growth front that will be more difficult to fill in a void-free manner. Examination of an array of features, FIG. 17F, demonstrates the uniformity of superconformal deposition between neighboring vias.

Figure 18:
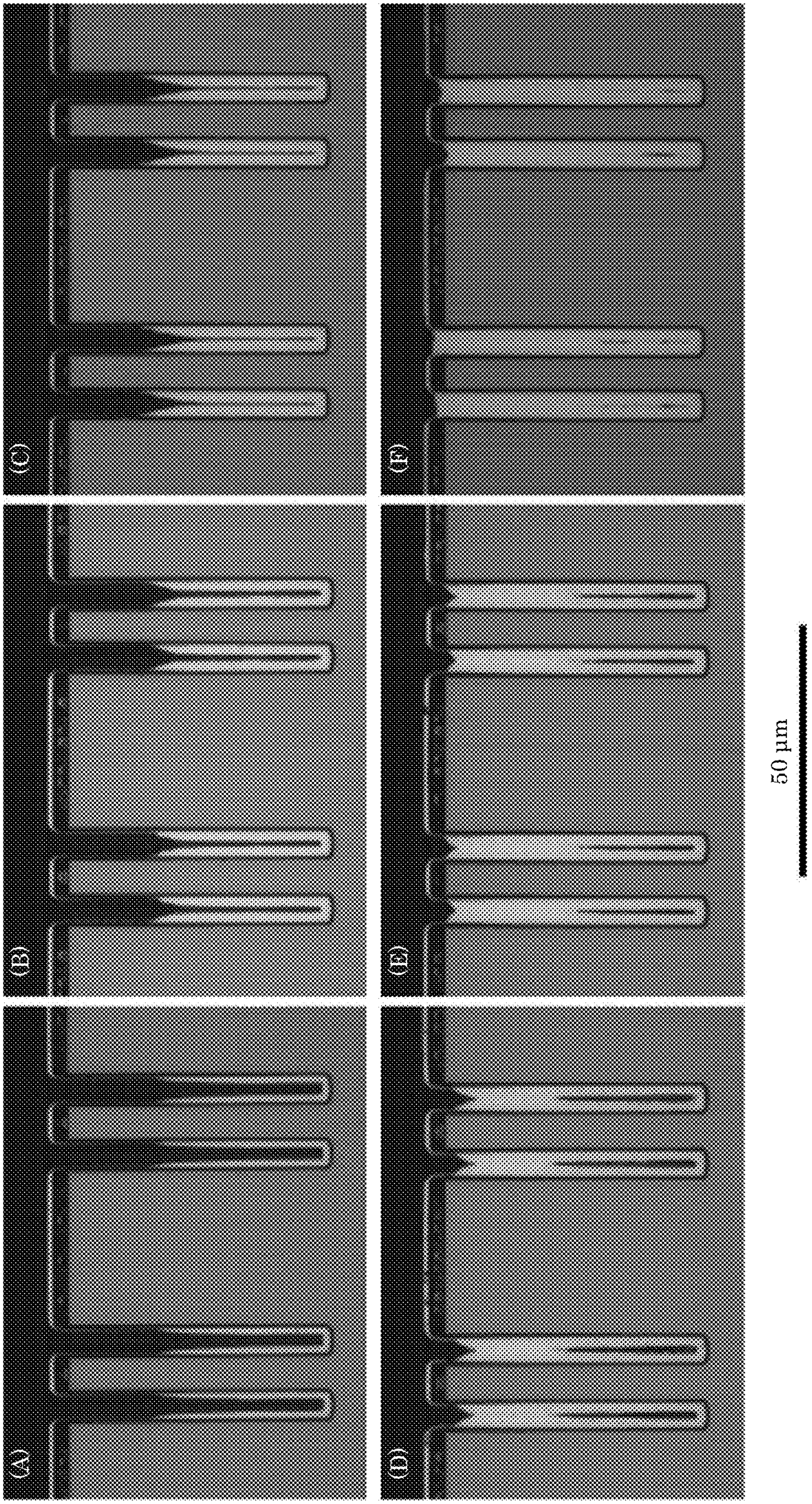
FIG. 18 shows cross-sectioned annular TSVs after Ni deposition in electrolyte containing 15 μmol/L PEI for a potential ramp from −1.19 V to −1.35 V at a rate of (panel A) 0.2 mV/s, (panel B) 0.133 mV/s, and (panel C) 0.1 mV/s and a potential ramp over the extended range −1.19 V to −1.43 V at the same rates of (panel D) 0.2 mV/s, (panel E) 0.133 mV/s, and (panel F) 0.1 mV/s, wherein patterned wafer fragment substrates were rotating at 100 rpm.

The shape and evolution of the growth front are closely related to the potential wave form. FIG. 18 shows TSVs filled using a linear ramp of the applied potential with time rather than potential steps. Both the growth front shape and the extent of filling are related to the scan rate and the potential limits, the depth $d_s$ of the final passive-active transition being mainly determined by the negative potential limit. Decreasing the ramp rate improves feature filling by decreasing the size of the internal voids. The improved filling derives from the increased deposition time available when the passive-active front is at a given height. Ramping quickly, by expanding the active region upward before the bottom region has fully filled, requires metal deposition in a taller, higher aspect ratio geometry that is subject to increased metal ion depletion. Slower ramps lead to improved filling as more of the volume toward the bottom of the TSV is filled with the minimal metal ion depletion provided by the limited active region at more positive potentials. Smaller voids form when the reentrant growth front is shallower and thereby results in reduced metal ion depletion. Nevertheless, voids are still evident even for the slowest sweep rate employed.

The use of equal deposition times at each potential in the potential step method (FIG. 17) is suboptimal for void-free feature filling: longer dwell times are involved at more positive potentials to obtain a high dihedral angle v-notch to enable void free growth through geometrical leveling. Once a suitable profile exists the potential could be stepped more rapidly through more negative potentials where faster deposition more quickly fills the remaining open volume of the TSV. Likewise, the use of a single ramp rate throughout the potential ramp (FIG. 18) is also suboptimal: ramp rates slow enough to eliminate void formation farther down the TSV waste time at the more negative potentials used to fill the upper region. In either case the process can be optimized by appropriate waveform design. However, galvanostatic control using a multistep current program can serve as an effective practical alternative.

Figure 19:
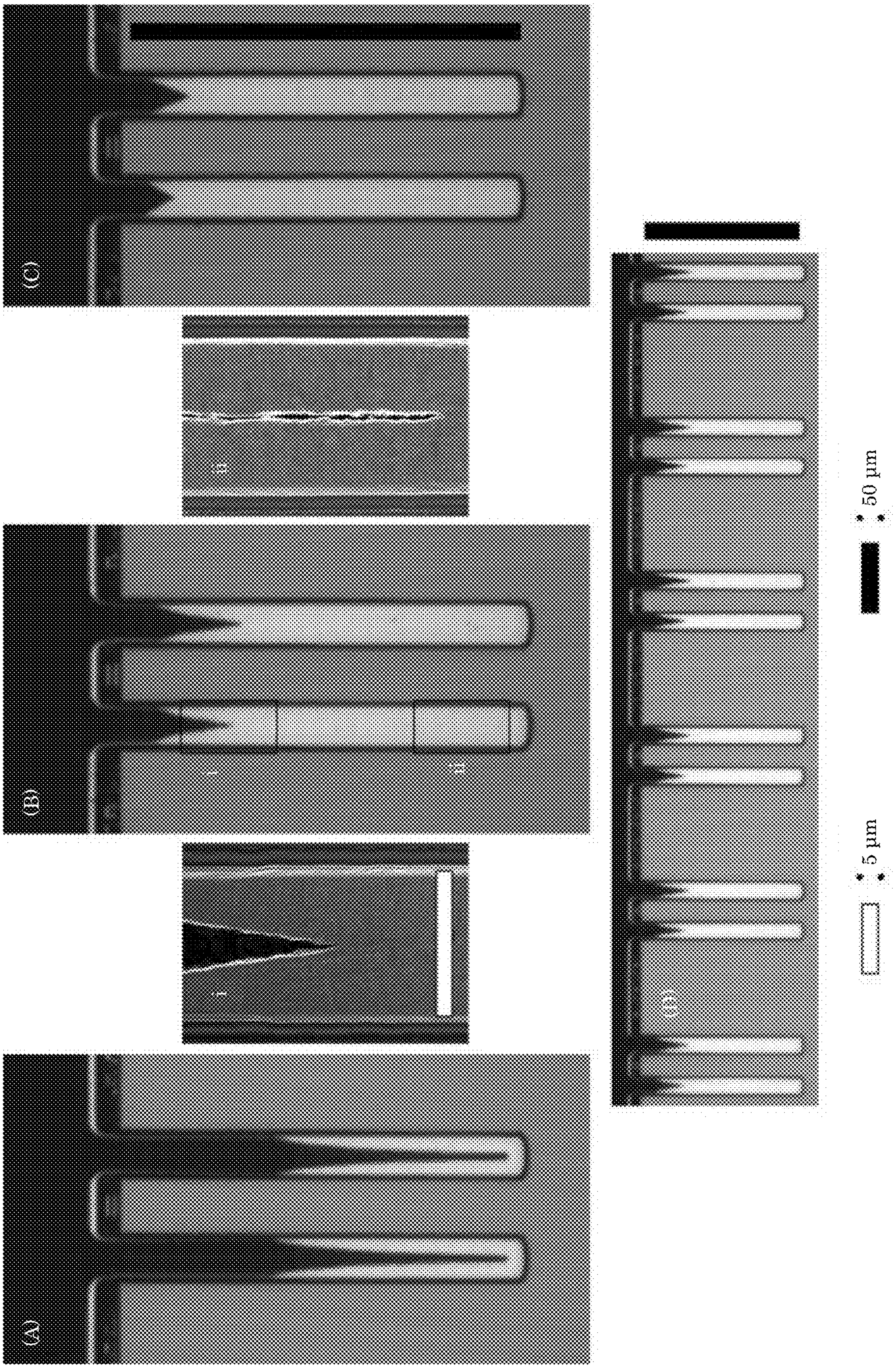
FIG. 19 shows. cross-sectioned annular TSVs after Ni deposition in electrolyte containing 15 μmol/L PEI and a potential ramp from (panel A) −1.19 V to −1.31 V with the initial 0.05 mV/s ramp rate doubled to 0.1 mV/s after 60 mV, (panel B) −1.19 V to −1.43 V with the initial 0.05 mV/s ramp rate doubled every 60 mV, and (panel C) −1.19 V to −1.43 V with the initial 0.05 mV/s ramp rate doubled only after the first two 60 mV intervals; scanning electron microscope (SEM) highlights in i) and ii) capture a seam and void too fine to be detected optically at the indicated locations in (panel B) while the optical image (panel D) captures filling uniformity at lower magnification, wherein patterned wafer fragment substrates were rotating at 100 rpm.

An approach whereby the ramp rate is adjusted over time to induce complete feature filling is demonstrated in FIG. 19 where the potential ramp rate was doubled every 60 mV. FIG. 19A shows the deposit obtained after ramping −120 mV from −1.19 V with the first 60 mV at 0.05 mV/s and the latter 60 mV at 0.1 mV/s (30 min total). FIG. 19B shows filling over the same −240 mV range used in FIG. 18D-F, the ramp rate progressively doubling every 60 mV from 0.05 mV/s to 0.1 mV/s, 0.2 mV/s and finally 0.4 mV/s. In contrast to the visible void in FIG. 18F, SEM is required to see the narrow void even as the deposition time has been reduced from 40 min to 37.5 min. Eliminating the final doubling of ramp rate in FIG. 19C yields the same filling, although with a larger dihedral notch angle, with the same 40 min deposition time of FIG. 18F and nearly the same fill height. The origin of the improved filling is clear in FIG. 19A; the smoothly increasing deposit thickness of the growth front down the TSV is compatible with void-free filling by geometrical leveling. Further optimization might integrate the position and potential dependent deposition rate for proposed potential histories over time to obtain the deposit thickness as a function of position and time. Void-free filling solutions provide that the deposit thickness increase monotonically down the feature throughout the filling process.

Ni deposition in the presence of PEI yields passive-active breakdown within the TSV with conformal metal deposition that initiates and remains at a potential-determined depth within the TSV. The potential-dependent suppression breakdown distance in the Ni system enables bottom-up filling through use of appropriate potential waveforms. The controlled filling from this engineered approach contrasts with the mushroom-like overshoot sometimes observed for Cu deposits beyond the mouths of bottom-up filled TSVs as well as through-hole printed circuit boards plated using processes that derive from the related "butterfly" deposition mechanism.

A Watts-based Ni electrolyte containing dilute PEI exhibited S-shaped NDR critical behavior associated with suppression-breakdown. The breakdown process shows the additive system provides bottom-up filling of recesses such as TSVs. Cyclic voltammetry measurements of the potential dependence of suppression breakdown on PEI concentration, transport and applied potential was analyzed based on the S-NDR model. The rate constants for suppressor adsorption and its subsequent potential driven breakdown were then used in simulations of Ni deposition in annular TSVs. In accord with the bifurcation evident in the voltammetric experiments, bottom-up Ni deposition in the TSVs exhibited a passive-active transition at depth $d_s$ within the TSVs. For fixed transport conditions, the value of $d_s$ was dictated by the applied potential and PEI concentration. S-NDR model predictions of TSV filling captured the trends and values of the experimental $d_s$ data as functions of suppressor concentration and applied potential. Void-free feature filling is not possible for fixed potential deposition. However, engineered potential waveforms based on potential steps and ramps taking advantage of the potential-derived control of $d_s$ combined with geometric leveling to produce superconformal filling. The recessed geometry stabilizes what is otherwise an unstable, critical system to achieve well-controlled, essentially void-free filling of the annular TSVs.

Example 2. Formation of Cobalt Transition Zone Terminated Superconformal Filling Equations and this Example start with Eq. 1.

Controlled bottom-up Co filling of TSVs was based on the coupling of suppressor breakdown and surface topography. Deposition was performed in a $CoSO_4$+$CoCl_2$+$H_3BO_3$ electrolyte with a branched polyethyleneimine (PEI) as a suppressing additive. Voltammetric measurements, including the impact of rotation rate and suppressor concentration on the rate of metal deposition, were used to quantify the interplay between metal deposition and suppressor adsorption. The derived kinetics were used in a model based on additive derived S-shaped negative differential resistance (S-NDR) to predict bottom-up filling of patterned features. The predictions, including the impact of deposition potential and additive concentration on the feature filling, are shown to match experimental results for filling of TSVs.

Depositions were conducted at room temperature in a cell containing 40 mL of 1 mol/L $CoSO_4$+0.2 mol/L $CoCl_2$+0.5 mol/L $H_3BO_3$ prepared using 18 MΩ·cm water. The pH of the electrolyte was 3.4 to 3.5, as measured using a pH sensor calibrated to buffer solution of pH 4.0. The additive was introduced to the electrolyte from a stock solution of 9.3 mmol/L PEI of 1800 g/mol in 18 MΩ·cm water. The electrolyte was sparged with Ar to remove dissolved $O_2$ prior to and during electrochemical measurements. A $Hg/Hg_2SO_4$/saturated $K_2SO_4$ reference electrode (SSE) was connected to the working electrode compartment via a fritted salt bridge filled with saturated solution of $K_2SO_4$. Experiments were conducted without compensation for cell resistance. A platinum counter electrode was held in a frit-separated cell immersed within the main cell.

Voltammetry was conducted on a Ag rotating disk electrode (RDE) of 1.0 cm diameter (area 0.78 $cm^2$) that was freshly coated with Co by deposition at −1.4 V in additive-free electrolyte immediately prior to each experiment. Currents in electroanalytical measurements are converted to current densities using the RDE area. However, it should be noted that the deposit area is generally ill-defined beyond suppression breakdown as deposition in the additive-containing electrolyte is not uniform.

Feature filling was performed using fragments of wafers patterned with ≈56 μm deep TSVs of annular cross-section having a 1 μm thick Cu seed in the field and a lesser amount on the side walls. To give definition to the metal ion and additive transport, the patterned substrates rotated about one end from a Pt spindle during deposition, like a helicopter blade, the patterned surface facing upwards. Based on the ≈1 cm distance between the features and rotational axis for most of the imaged TSVs, the 100 rpm rotation rate corresponds to an estimated 10 cm/s flow rate over the surface. Pre-wetting with ethyl alcohol was used to displace air bubbles that were otherwise trapped in the TSVs during Co deposition. Following immersion, the specimens were rotated at either open circuit potential or −0.9 V for 2 min prior to deposition to mix the electrolyte with the alcohol in the TSVs. Omission of this step resulted in visible Co deposition on the field around and downstream of each TSV, but TSV filling as detailed was not significantly changed.

Figure 20:
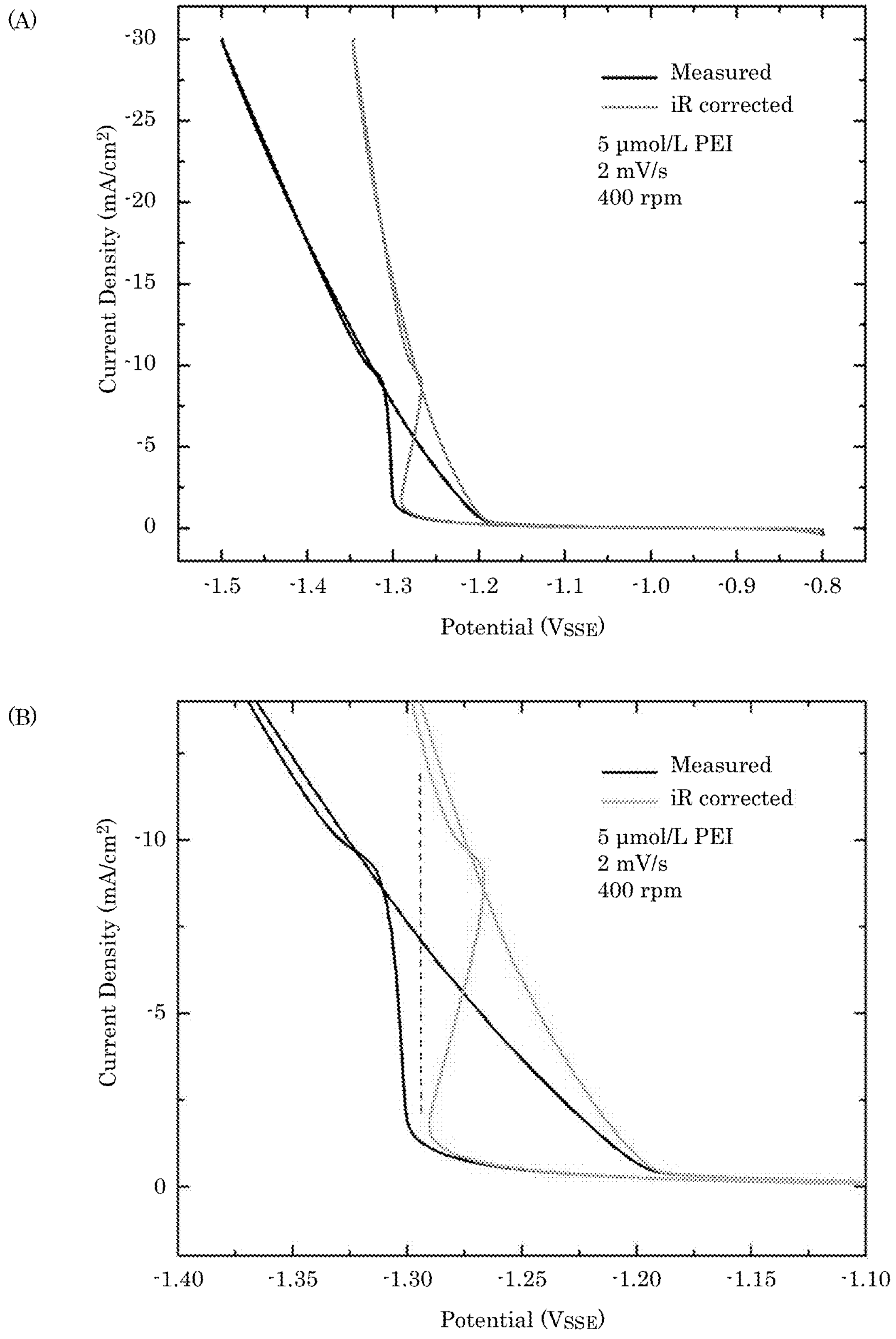
FIG. 20 shows cyclic voltammetry of Co deposition on an RDE in 1 mol/L $CoSO_4$+0.2 mol/L $CoCl_2$+0.5 mol/L $H_3BO_3$, pH=3.5, containing 5 μmol/L branched PEI (1800 g/mol) additive in which experimental currents are converted to current densities using the 0.78 $cm^2$ RDE area, wherein panel A shows an entire dataset collected without compensation for the dissipative iR potential drop associated with the R≈9Ω cell resistance that is plotted against both the applied potential and the potential corrected for the potential drop; panel B shows the same data replotted to emphasize the hysteretic range and S-shaped NDR, and the negative-going sweeps are suppressed in the hysteretic region.
Figure 21:
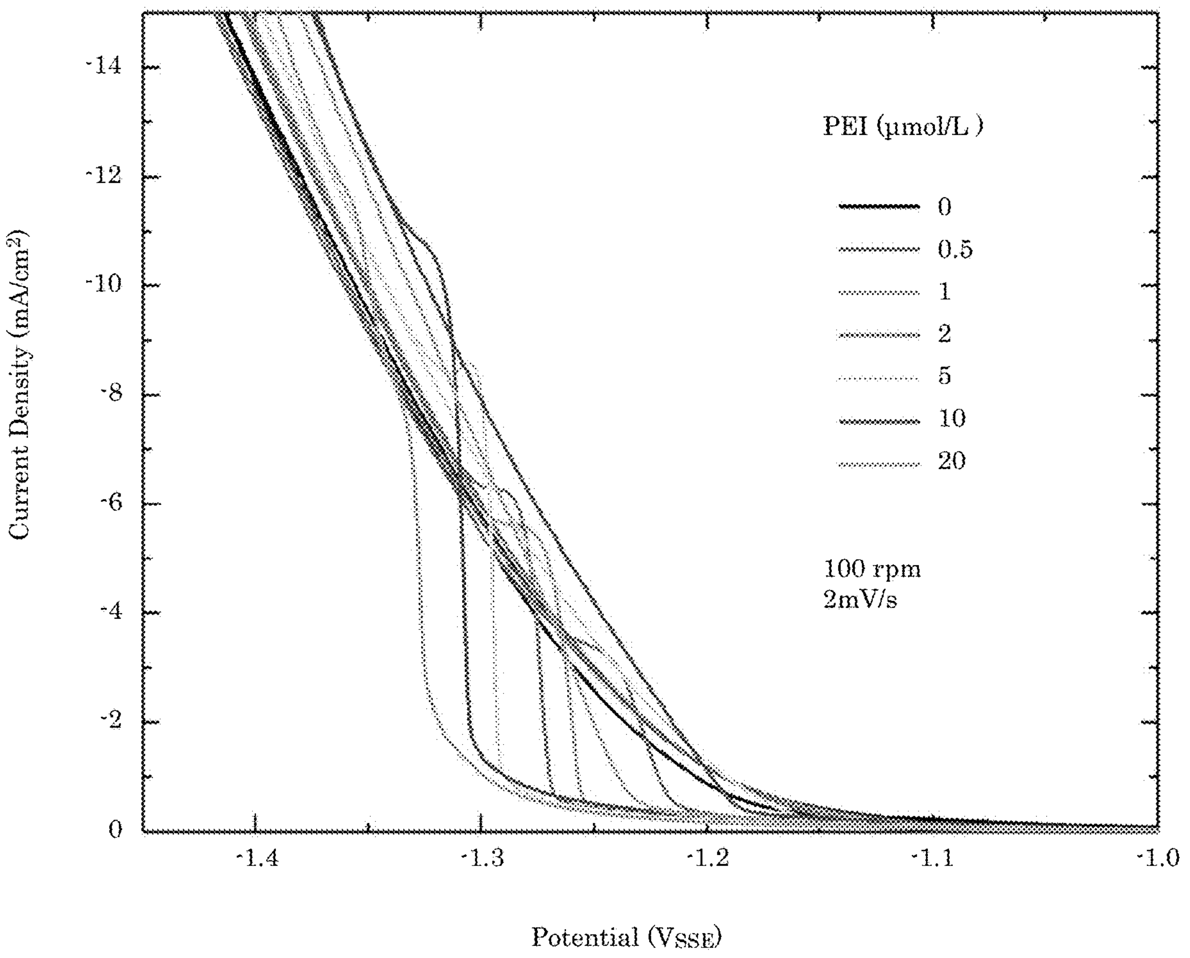
FIG. 21 shows cyclic voltammetry of Co deposition in electrolytes containing the indicated PEI concentrations, wherein experimental currents are converted to current densities using the 0.78 $cm^2$ RDE area, and the data was collected without iR compensation.

FIG. 20 shows the hysteretic voltammetric features that derive from the addition of the PEI suppressor. FIG. 20A shows the full potential range over which all voltammetric experiments reported herein were performed while FIG. 20B provides a closer view of the region of interest. Post experiment correction of the potential for the dissipative iR losses, due to uncompensated electrolyte resistance, 9Ω, reveals the critical nature of the suppression breakdown-derived S-NDR. The extent of inhibition provided by PEI increases with its concentration as seen in the monotonic-shift of the breakdown potential in FIG. 21. For the PEI concentrations shown, adsorption results in blockage of metal deposition with the threshold value of the potential for its subsequent breakdown being related to the flux of PEI to the surface as reflected in the dependence on PEI concentration. Following suppression breakdown, the current-voltage response matches the response of the additive-free electrolyte. At potentials positive of the suppression breakdown, the passive branch of the voltammogram exhibits a more gradual increase in current attributable to a leakage process associated with either metal deposition or parasitic electrolyte breakdown. Deposition currents on the return sweeps, the active branch, remain accelerated to more positive potentials than the suppression breakdown potentials, giving rise to the hysteretic responses. Quantitatively, PEI is a more effective suppressor for Ni deposition as suppression breakdown in a 1 μmol/L PEI containing electrolyte occurs approximately 50 mV more positive for Co (i.e., less suppressed) than for Ni, this potential difference increasing with PEI concentration.

Figure 22:
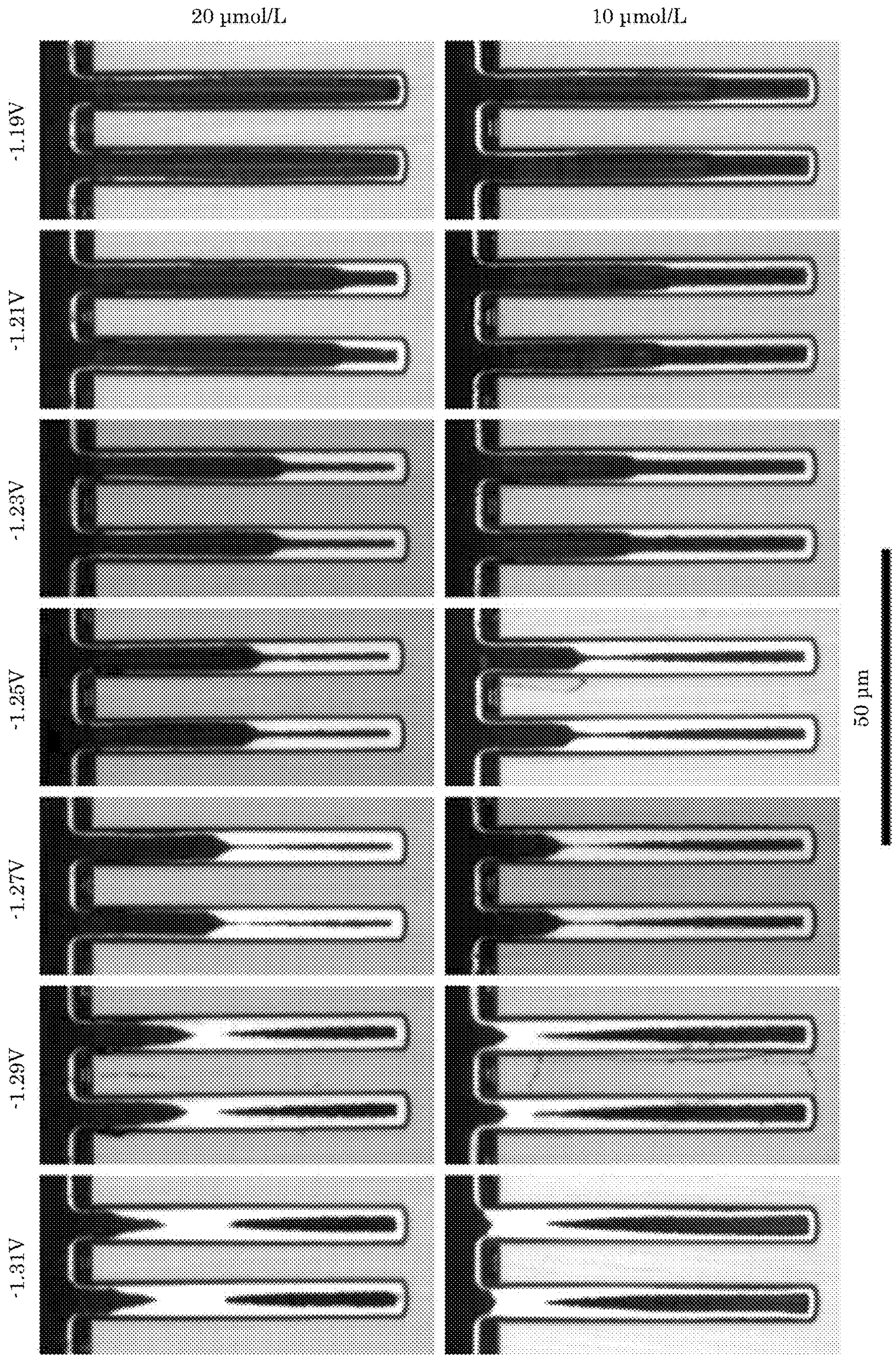
FIG. 22 shows cross-sectioned annular TSVs after 10 minutes of Co deposition for two different PEI concentrations at the indicated applied potentials, wherein the patterned wafer fragment substrates were rotating at 100 rpm during deposition.
Figure 23:
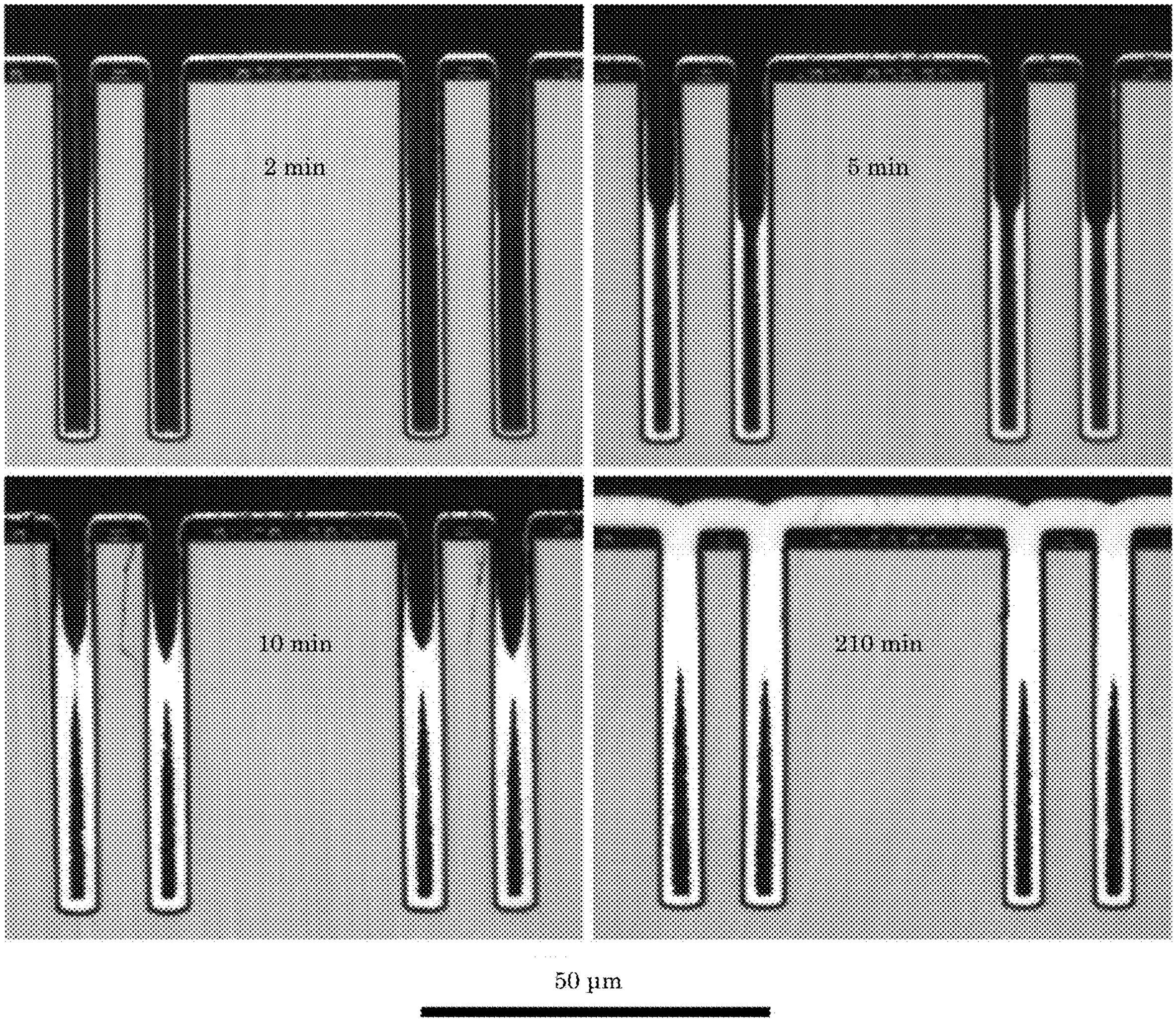
FIG. 23 shows cross-sectioned annular TSVs after Co deposition in electrolyte containing 20 μmol/L PEI at a potential of −1.29 V for the indicated times, wherein the patterned wafer fragment substrates were rotating at 100 rpm.

FIG. 22 shows cobalt deposition on TSV-patterned substrates in PEI-containing electrolyte at potentials within the hysteretic voltammetric loops for the indicated suppressor concentration and applied potential. Deposition rates in the lower portion of the TSVs are rapid, corresponding to the active branch, while higher up, the side wall and free surface remain in the passive state. The distance from the field to the passive-active transition where the maximum Co thickness is first achieved, $d_s$, increases at more positive potential and higher suppressor concentration, with very little Co deposition on the Cu-seeded field in all cases. Both the localization and trends of passivation distance with potential and suppressor concentration are analogous to the results detailed for Ni. At early times $d_s$ does not change with deposition time. However, FIG. 23 shows that filling can progress farther up the TSV, albeit at a much slower rate, after impingement of the actively growing sidewall deposits that results in keyhole void formation, also known as "pinch-off". The optical contrast of the deposit in the metallographic cross-section also changes from bright to matte at locations above the original passive-active transition. The much slower deposition rate of the matte Co, (note the long deposition time at which it is observed) is associated with the comparatively small leakage currents on the passive branch of the voltammogram.

Figure 24:
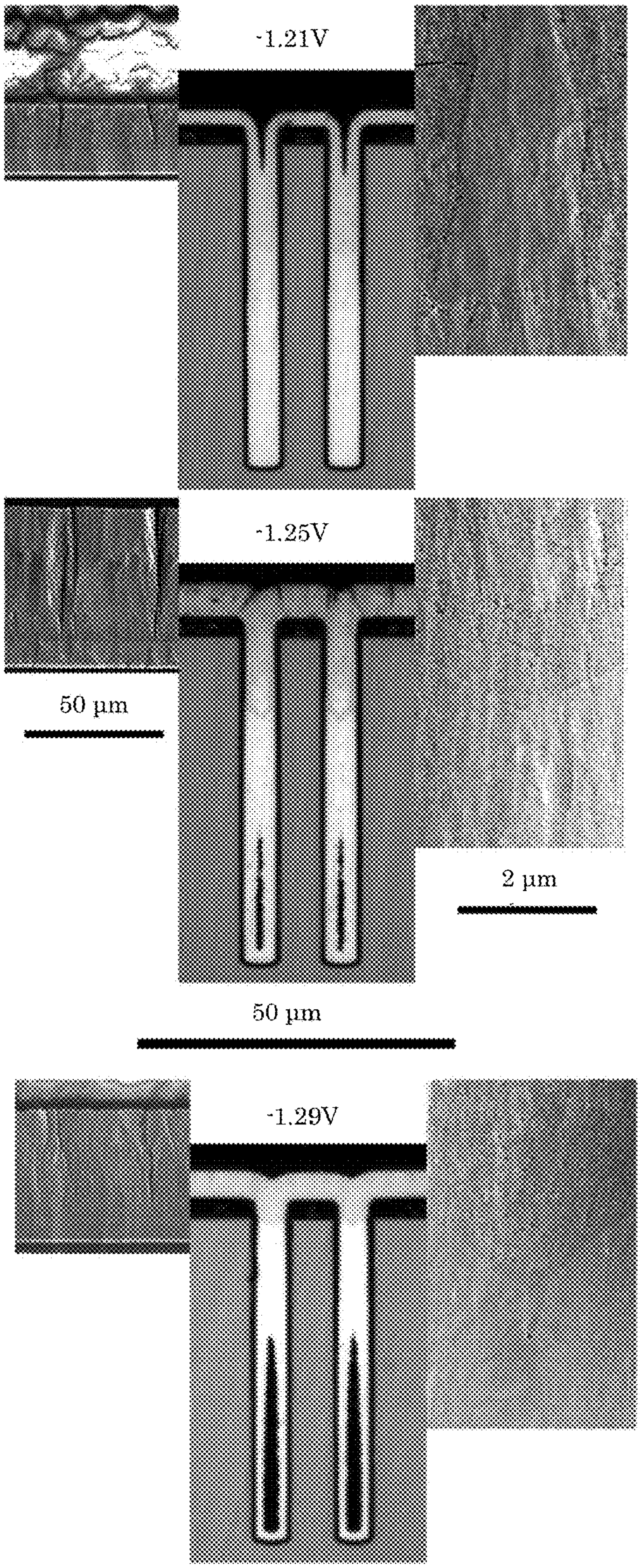
FIG. 24 shows TSVs after Ni deposition at three different applied potentials, all in electrolyte containing 20 μmol/L PEI in which the lower magnification optical images of each TSV show a transition from bright metallic deposits lower in the TSVs to matte deposits higher up (including on the field), wherein the transition shifts progressively down the TSV as potential increases from −1.29 V to −1.21 V such that the higher magnification SEM images adjacent to the optical images show a corresponding microstructural transition from dense deposits to porous deposits (right side of each TSV), with cracks visible in the porous deposit within the features and on the field (left side of each TSV), and deposition times are 3 hours (hrs) 30 minutes (min) for −1.29 V, 17 hrs 20 min at −1.25 V and 16 hrs 20 min at −1.21 V with patterned wafer fragment substrates rotating at 100 rpm.

As shown in FIG. 24, for a PEI concentration of 20 μmol/L, the bright-matte interface moves from just below the field to roughly one-third of the way down the TSV as deposition potential increases from −1.29 V to −1.21 V. The higher magnification scanning electron microscope (SEM) images indicate that the bright deposits are dense Co while the matte deposits are microporous and brittle. The transition from active to passive deposition is not one-way, as pockets of dense metal are seen in the porous region at both −1.25 V and −1.21 V. Deposits on the field also exhibited striations in experiments using substrates without alcohol prewetting in electrolyte that had not been previously exposed to alcohol. The striations are likely correlated to oscillations of the deposition currents on patterned specimens that occurred over a timescale of minutes.

To quantitatively explore the link between the voltammeteric S-NDR and feature filling requires a model for the suppressor breakdown that tracks the fractional suppressor coverage θ as it evolves through accumulation and deactivation according to $$\frac{d\theta}{dt} = k_+C_s(1-\theta) - k_-\theta v(\theta,\eta) \qquad [1]$$

where $C_s$ is the suppressor concentration at the electrolyte/deposit interface, $k_+$ is the suppressor adsorption rate constant and $k_-$ is the consumption rate constant. The metal deposition rate $v(\theta)$ is assumed to be a linear function of the suppressor coverage θ, $$v(\theta,\eta) = \frac{\Omega}{nF}(j_{\theta=0}(1-\theta) + j_{\theta=1}\theta) \equiv v_0(1-\theta) + v_1\theta \qquad [2]$$

The current densities on unsuppressed ($j_{\theta=0}$) and suppressed ($j_{\theta=1}$) surfaces are those associated with the metal deposition only, with Faraday's constant F=96485 C/mol, n the ionic charge and Ω the molar volume of solid Co. The deposition rate on the respective surface segments is assumed to exhibit standard exponential dependence on overpotential η.

$$j_{\theta=0,1} = j^o_{\theta=0,1}e^{-\frac{\alpha_{\theta=0,1}F\eta}{RT}} \qquad [3]$$

with $\eta=E_{applied}-E_{rev}$ and $E_{rev}\approx-0.85\ V_{SSE}$ as estimated from zero current crossing point on the reverse voltammetric sweep. The back reaction has been neglected in Eq. 3 as the feature filling experiments were performed at high overpotentials.

Figure 25:
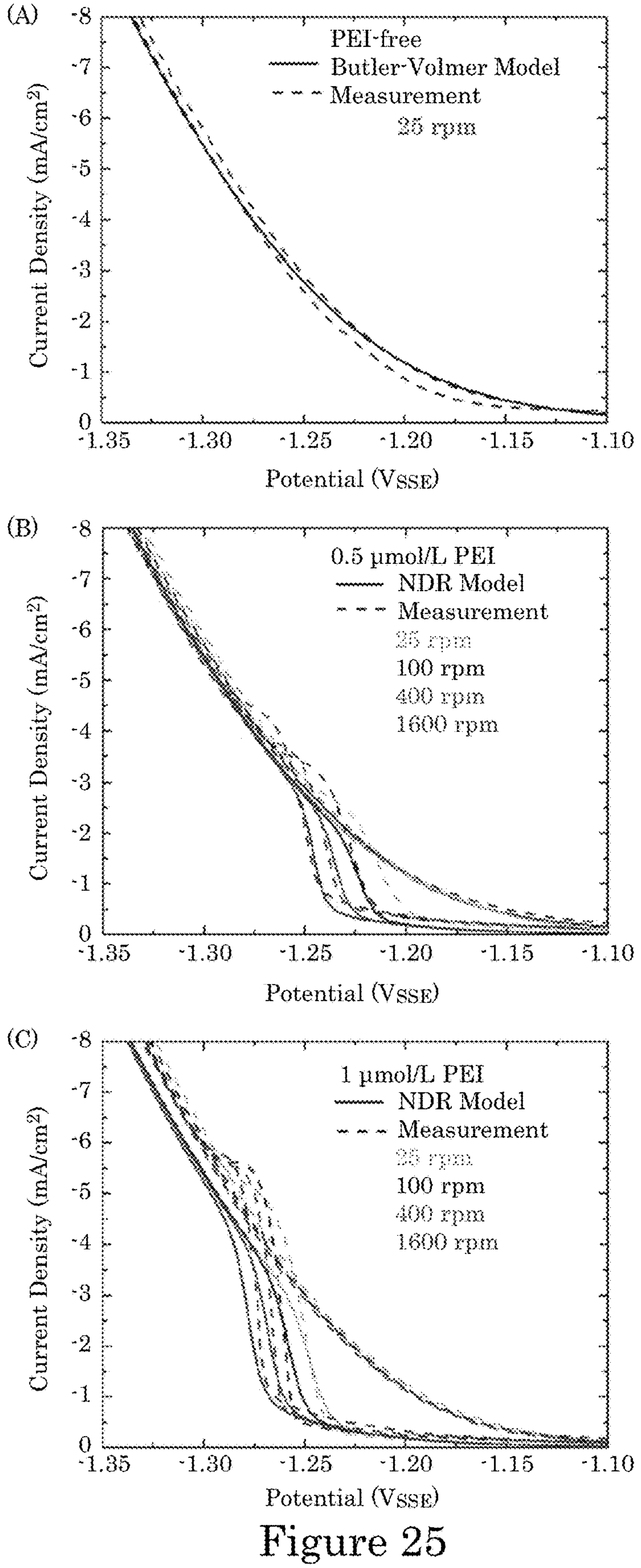
FIG. 25 shows experimental and simulated voltammetry of Co deposition in electrolytes with the indicated PEI additive concentrations at the indicated RDE rotation rates in which negative-going sweeps are simulated with experimental currents converted to current densities using the 0.78 $cm^2$ RDE area, wherein data was collected without compensation for iR potential drop across the measured cell resistance R≈9Ω; the simulations account for the associated deviation from the applied 2 mV/s potential scan rate, and experimental and simulated voltammetry are plotted against the applied potential.

Values for $j_{\theta=0}{}^o$ and $\alpha_{\theta=0}$ were determined from the additive-free voltammetric data shown in FIG. 25A. As the experimental data were not corrected for dissipative electrolyte iR losses, the voltammetric simulation includes the appropriate correction, $E_{applied}=\eta+E_{rev}+iR$. In the presence of PEI, the overlap evident in the inhibited voltammetric passive range shown in FIG. 21 indicates that the surfaces are saturated with PEI prior to suppression breakdown. This is consistent with the fact that all voltammograms were initiated at −0.8 $V_{SSE}$ (albeit not evident in FIG. 25 as plotted) after the RDE electrode was idled for 2 min prior to initiating the experiments, thereby allowing substantial time for PEI adsorption. Thus, the passive branch for the highest PEI concentration was used to define $j_{j=1}{}^o$ and $\alpha_{\theta=1}$. The leakage current measured over the passive range includes slow metal deposition accompanied by parasitic proton and water reduction to form $H_{ads}$ and $H_2$.

Metallographic examination of cross-sectioned planar specimens indicates the metal deposition current efficiency ε in the passive regime is substantially less than 100%; an order of magnitude estimate of 10% is used. The measured voltammetric current density, $j_{meas}$, therefore includes a third term for the parasitic current density that is most relevant to modelling the passive regime $$j_{meas} = j_{\theta=0}(1-\theta) + j_{\theta=1}\theta + \frac{1-\varepsilon}{\varepsilon}j_{\theta=1}\theta \qquad [4]$$

Following breakdown of the PEI blocking layer the voltammetry exhibits hysteresis reflecting the positive feedback associated with deactivation and consumption on the actively growing surface. The threshold potential for breakdown is used to estimate $k_+$ and $k_-$ by integrating Eq. 1 for θ(t), subject to Eqs. 2 to 4 and mass balance between suppressor diffusion across the boundary layer and its adsorption onto the surface $$D_s\frac{C_S^o - C_S}{\delta} = \Gamma k_+C_S(1-\theta) \qquad [5]$$

The areal density of sites Γ, suppressor diffusion coefficient $D_s$ and boundary layer thickness δ (scaling with the rotation rate as $\omega^{-0.5}$) were estimated.

Coverage evolution with time depends on four groupings of the parameters:

$$k_+C_o,\ D_sC_o/\delta\Gamma,\ k_-\frac{\Omega}{nF}j_{\theta=0} \text{ and } k_-\frac{\Omega}{nF}j_{\theta=1},$$

all having units $s^{-1}$. With the limiting active and passive current densities already determined, values for $k_+$ and $k_-$ were adjusted to obtain agreement between the suppression breakdown potentials in the simulations and the experiments as shown in FIGS. 25B and C and FIG. 26A-C. Simulations over a wide range of $k_+$ values can yield the same value of suppression breakdown potential for a particular rotation rate; specifically, larger $k_-$ can compensate for larger $k_+$ to maintain the same prediction for the suppression breakdown potential. However, such concurrent increase of $k_+$ and $k_-$ also increases the dependence of suppression breakdown potential on rotation rate. Simultaneous fitting of the suppression breakdown potentials at the four rotation rates examined at each suppressor concentration is therefore quite restrictive. Separate fits were done for each suppressor concentration in FIGS. 25 and 26, the emphasis being on capturing the suppression breakdown potentials at all rotation rates. The pairs of $k_+$ and $k_-$ values derived from fitting the data at each of the five suppressor concentrations along with the other parameters used in the simulations are given in Table 2.

TABLE 2

| Parameter | Name | Units | Value |
|---|---|---|---|
| TSV inner radius | $r_i$ | m | $4 \times 10^{-6}$ |
| TSV outer radius | $r_o$ | m | $9.5 \times 10^{-6}$ |
| TSV height | h | m | $56 \times 10^{-6}$ |
| Diffusion coefficient, suppressor | $D_s$ | $m^2/s$ | $9.2 \times 10^{-11}$ |
| Bulk concentration, Co | $C_{Co}{}^{o}$ | $mol/m^3$ | 1200 |
| Boundary layer thickness for rotation rate ω = 50π rad/min (25 rpm) | δ | m | $46 \times 10^{-6}$ |
| Saturation suppressor coverage | Γ | $mol/m^2$ | $2.5 \times 10^{-7}$ |
| Suppressor adsorption kinetics from (0.5, 1, 2, 5 and 10) μmol/L PEI | k+ | $m^3/mol \cdot s$ | $3 \times 10^3$; $1.1 \times 10^3$; $3 \times 10^2$; $3 \times 10^2$; $3 \times 10^3$ |
| Suppressor burial kinetics from (0.5, 1, 2, 5 and 10) μmol/L PEI | k− | 1/m | $7 \times 10^8$; $4 \times 10^8$; $2.5 \times 10^8$; $3 \times 10^8$; $1.4 \times 10^9$ |
| Unsuppressed Co exchange rate constant | $j_{\theta=0}{}^{o}$ | $A/m^2$ | $7 \times 10^{-4}$ |
| Suppressed Co exchange rate constant for 10% efficiency | $j_{\theta=1}{}^{o}$ | $A/m^2$ | $9 \times 10^{-6}$ |
| Unsuppressed charge transfer coefficient | $\alpha_{\theta=0}$ | — | 0.55 |
| Suppressed deposition charge transfer coefficient | $\alpha_{\theta=1}$ | — | 0.55 |
| Co ionic charge | n | — | 2 |
| Co molar volume | Ω | $m^3/mol$ | $6.62 \times 10^{-6}$ |

Behavior can be simulated by increasing the ratio, $D_s/\Gamma$, by approximately a factor of two or correspondingly reducing the boundary layer thickness; neither was done to limit the number of fitting parameters. Nearly identical suppression for both 25 rpm and 100 rpm with 10 μmol/L PEI (FIG. 26C) were fit to the data for the three higher rotation rates for this concentration. In contrast, to capture the impact on the feature fill predictions, analogous, although less extreme, compression of the data at lower rotation rates for 5 μmol/L PEI (FIG. 26B) was fit to the range of suppression breakdown potentials between 25 rpm and 1600 rpm.

Figure 26:
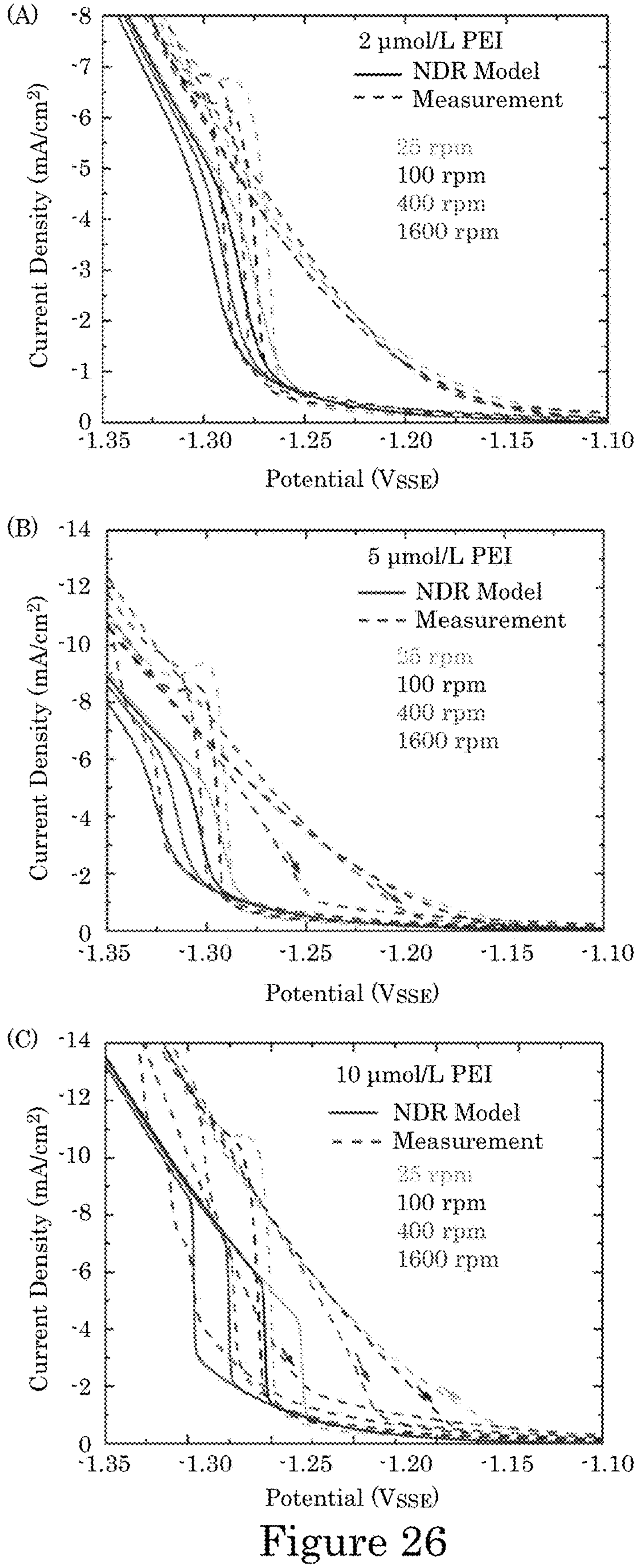
FIG. 26 shows experimental and simulated voltammetry of Co deposition in electrolytes with the indicated PEI additive concentrations at the indicated RDE rotation rates in which negative-going sweeps are simulated with experimental currents converted to current densities using the 0.78 $cm^2$ RDE area, wherein data was collected without compensation for iR potential drop across the measured cell resistance R≈9Ω; the simulations account for the associated deviation from the applied 2 mV/s potential scan rate, and experimental and simulated voltammetry are plotted against the applied potential.

FIG. 27A compares the deposition rates on the active sidewall within the TSV (in the presence of PEI) and on the free-surface (in the absence of PEI), with the growth rates predicted by Eq. 2 using the metal deposition kinetics obtained from the cyclic voltammetry (Table 2). Scanning electron microscopy was used to determine the (sub)-micrometer deposit thicknesses from the metallographic cross-sections. Deposition rates in additive-free electrolyte measured on the field are consistent with expectations from cyclic voltammetry at more positive potentials but fall below the predictions at more negative potentials. The deviation is attributed to dissipative potential losses associated with the ohmic drop in the electrolyte that, in contrast to the voltammetric simulations in FIGS. 25 and 26, are not properly accounted for in FIG. 27A (i.e., the predicted rates are straight lines on the log plot). Table 3 gives the average currents on the patterned substrates/Pt holder at the applied potentials used in the deposition experiments. The associated iR loss for the approximate cell resistance of 11Ω (the impedance R of the rotating, rectangular "helicopter blade" substrates ranged from 10Ω to 13Ω depending on their orientation) is particularly significant at the more negative applied potentials due to the higher currents. Arrows marking these potential offsets in FIG. 27A indicate the deposition rates in additive-free electrolyte are more broadly consistent with the predictions for additive-free electrolyte. The agreement is evident in FIG. 27B, where each data point has been shifted from the applied potential by the iR drop arising from its own deposition current i. The variation of iR with position of the helicopter blade specimen amounts to a small periodic perturbation of the overpotential at the RDE rotation frequency.

TABLE 3

| Applied Potential (V) | Deposition Current (mA) | iR offset (mV) |
|---|---|---|
| −1.19 | 0.4 | 4 |
| −1.21 | 0.7 | 8 |
| −1.23 | 1.0 | 11 |
| −1.25 | 1.2 | 13 |
| −1.27 | 2.2 | 24 |
| −1.29 | 2.9 | 32 |
| −1.31 | 3.4 | 37 |

In PEI-containing electrolytes deposition proceeds via bifurcation of the patterned electrode into a passive upper surface while more active deposition occurs within the TSV's as shown in FIG. 22. Growth rates derived from thickness measurements summarized in FIG. 27A indicate an almost two orders of magnitude difference between deposition rates on the passive and active regions. The deposit thicknesses on the free surfaces of the specimens shown in FIG. 24 are only ≈40% of the values expected from the suppressed kinetics in Table 2 (assuming fully dense deposits). This might indicate greater suppression with 20 μmol/L suppressor than at the lower concentrations used to derive the kinetics, or it might indicate less than 100% deposition efficiency. The previously noted striations in the deposits on the field as well as oscillations during the depositions also raise the possibility that these "suppressed" deposit thicknesses reflect periods of both active and passive deposition. The order of magnitude estimate of ε≈0.1 used to determine $k^+$ and $k^-$ in the voltammetric fit is used in lieu of 0.4, which is considered an upper bound for the above reasons. The value of $j_{\theta=1}{}^{o}$ was thus obtained from the fit to the negative-going sweeps multiplied by 0.1, the charge transfer coefficient $\alpha_{\theta=1}$ having been equated to $\alpha_{\theta=0}$ assuming suppression through a simple site blocking mechanism.

Figure 27:
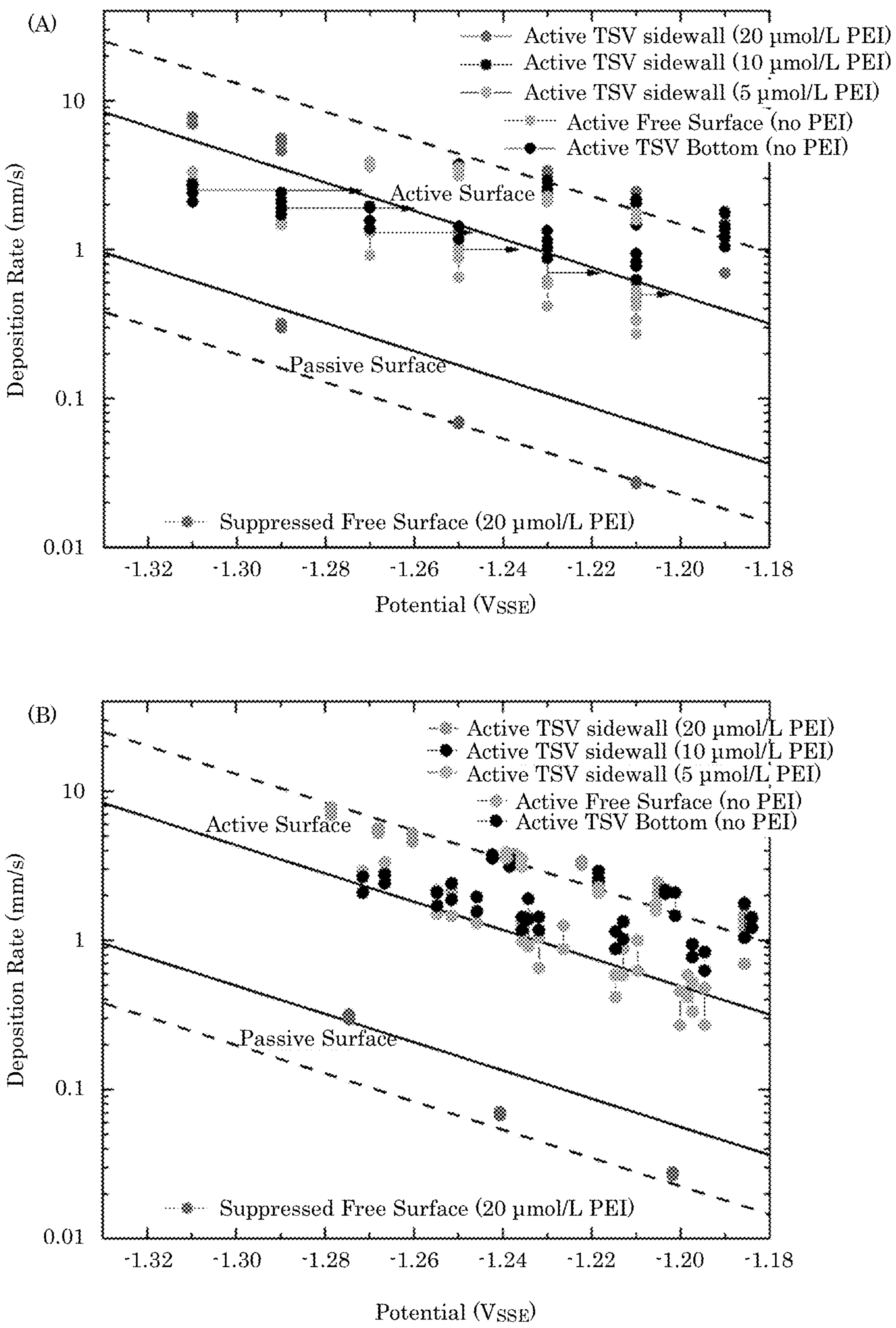
FIG. 27 shows solid lines that are predicted deposition rates associated with cyclic voltammetry-derived kinetics for suppressed and unsuppressed deposition (1 nm/s corresponding to 2.9 mA/cm$^2$) plotted against applied potential in which dashed lines indicated multiples of the cyclic voltammetry-derived predictions for data points that are experimental deposition rates obtained from measured thickness and deposition time, wherein panel A shows data plotted against applied potential—arrows indicate approximate potential drop across the 11Ω cell impedance based on average of deposition currents of all specimens at that applied potential, and panel B shows data plotted with each applied potential for each specimen corrected for iR potential drop using the measured current for that specimen; data pairs are experimental maximum and minimum values arising from roughness and variation between locations on each specimen, and with TSVs exhibiting a gradient of deposit thickness below the transition zone due to metal ion depletion, values represent those in the region with the thickest deposit.

As seen in FIG. 27, deposit thicknesses obtained from metallographic analysis indicate the active deposition rates below the passive-active transition within the TSVs are faster than those obtained in the additive-free system. A possible source for this difference is the lower iR drop associated with the distributed array of active microelectrodes, as opposed to fully actively plating surface, the reduced area and deposition current leaving a higher overpotential available to drive feature filling. However, the deviation is substantial even at the most positive potentials (where low deposition currents yield minimal iR correction) and remains so after correction for the measured specimen currents. Other possibilities were examined using control studies, specifically deposition with/without $C_2H_5OH$ and with/without 100 μmol/L $CuSO_4$ (a perturbation from seed layer corrosion); no consequential effect on Co deposition was observed in either case.

The sharp breakdown of inhibition marked by the critical potential captures the point of balance between the concentration-dependent rate of suppressor adsorption onto the surface and the potential-dependent rate of adsorbate deactivation as captured in Eq. 1. The decreasing suppressor concentration within recessed features thus introduces a position-dependent positive shift of the critical potential from that at the free-surface. The passive-to-active transition occurs at the location in the feature where the critical potential equals the actual potential.

This Example, like the Ni filling study in Example 1, uses the pseudo steady state approach, evaluating the depletion of the suppressor while neglecting the evolution of the current distribution and assuming minimal metal ion depletion. Thus, only depletion of the suppressor concentration $C_s$ is determined as a function of distance down the TSV. The limited goal of using the electrochemical measurements to predict only the position of the passive-to-active transition within the TSV permits use of the computationally simpler S-NDR based pseudo steady state model.

Figure 14:
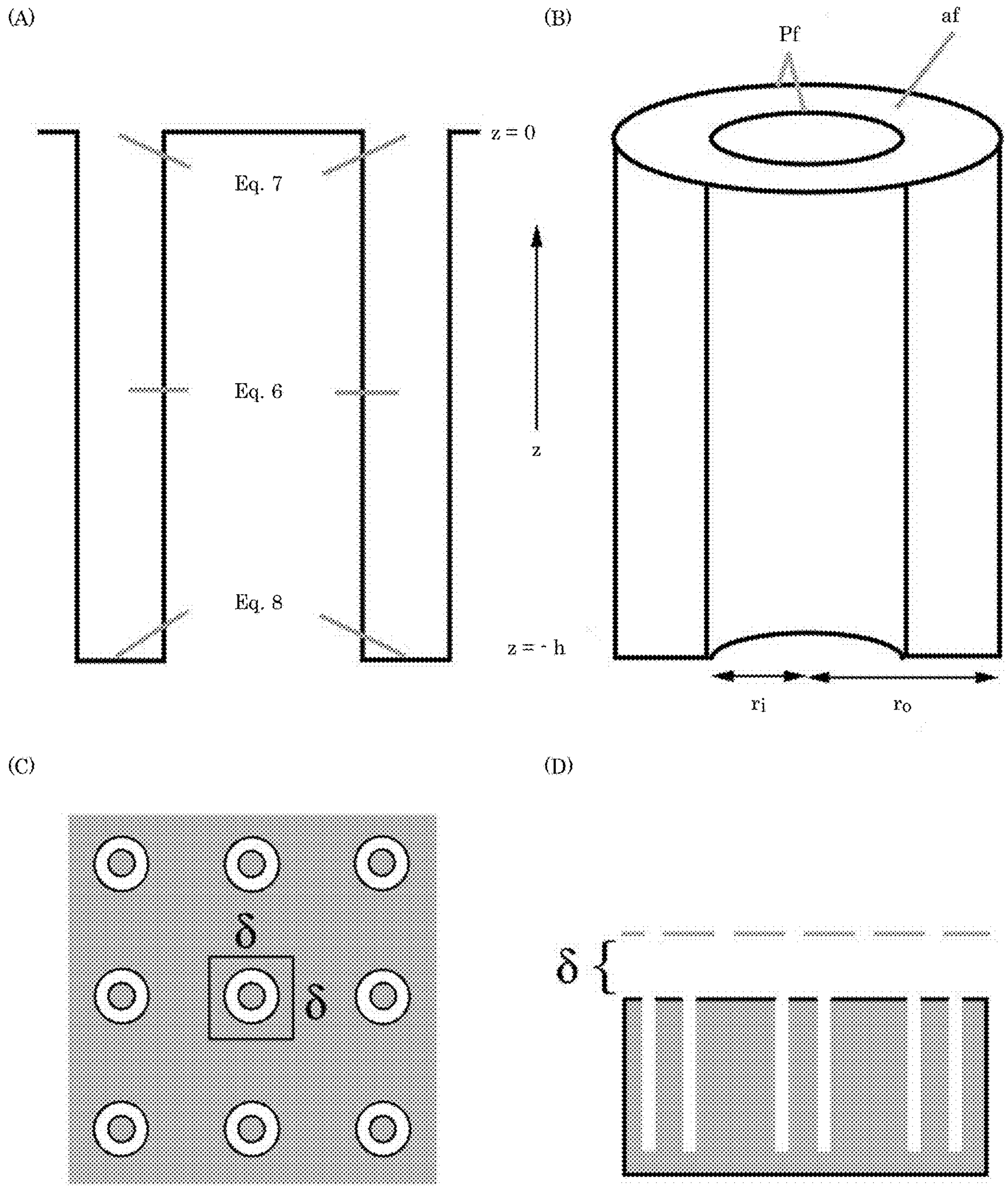
FIG. 14 shows a geometry used to model Ni deposition within the annular TSVs in which panel A shows a cross-section of a TSV for a domain for the simulations; panel B shows half TSV with full top indicating the inner and outer radii that define the perimeter $p_f$ and open area $a_f$; panel C shows a planview of TSV array with area $\delta^2$ supplying suppressor flux to underlying field and embedded TSV demarcated, and panel D shows a cross-section through a row of TSVs with the height of the boundary layer, δ, indicated.

Summarizing the relevant equations, as detailed previously, for inner radius $r_i$ and outer radius $r_o$ of the annular TSV, the geometry shown schematically in FIG. 14, mass balance of the divergence of suppressor flux down the cross sectional area $a_f=\pi(r_o^2-r_i^2)$ and the rate of suppressor adsorption on the surrounding sidewall perimeter $p_f=2\pi(r_o+r_i)$ yields $$a_f D_s \frac{d^2C(z)}{d^2z} = p_f \Gamma C(z) k_+ (1-\theta) \quad [6]$$

where z is the distance from the field down the TSV. Equating the flux across the linear gradient of the boundary layer equal and the sum of adsorption on the field around the TSV and that going down the TSV gives $$a_s D_s \frac{C_s^\infty - C(0)}{\delta} = (a_s - a_f)\Gamma C(0) k_+ (1-\theta) + a_f D_s \frac{dC}{dz}\bigg|_{z=0} \quad [7]$$

where the concentration at the boundary layer-substrate interface equals that at the top of the TSV. For boundary layer thickness δ that is less than the spacing of the TSVs as in the experiments, the mass balance is invoked over the square area $a_s=\delta^2$ around each TSV. Finally, mass balance at the bottom of the TSV requires the suppressor flux and rate of suppressor adsorption satisfy $$\Gamma C(-h) k_+ (1-\theta) = D_s \frac{dC}{dz}\bigg|_{z=-h} \quad [8]$$

The differential equation and boundary conditions in Eqs. 6-8 and suppressor adsorption and metal deposition interactions defined by Eqs. 1-4 permit simulation of the initial passive-active transition deposition profiles using the kinetic parameters obtained from the RDE experiments (Table 2). Suppressed deposition is predicted in the upper portion of the TSVs with a micrometer scale transition to unsuppressed deposition in the lower portion of the TSV at depth $d_s$ down the TSV consistent with experimental observations and analogous to model predictions detailed previously for Ni filling[9].

Figure 28:
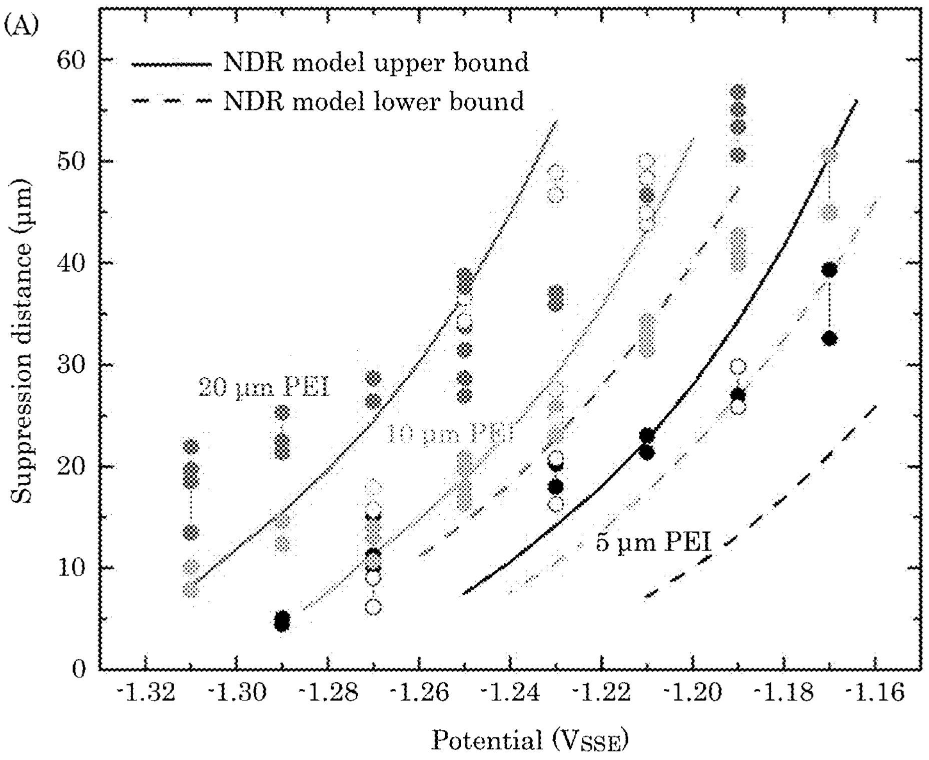
FIG. 28 shows graphs of suppression distance versus potential, wherein curves are the largest and smallest predictions from five pairs of $k_+$ and $k_-$ values for distance $d_s$ down the TSV from the field to where the deposition rate first achieves 99% of its unsuppressed value; data points are experimental distances from the field to the depth in the TSV where the maximum deposit thickness is first obtained; bars show the maximum and minimum values obtained from all TSVs examined on each specimen; solid circles indicate specimens where the sample was held for 2 min at open circuit potential prior to deposition for diffusion of electrolyte into the alcohol-filled TSVs; open circles indicate specimens that were instead held at −0.9 V; simulation and data point colors match the corresponding PEI concentration label; experimental data are plotted in panel A using applied potential and in panel B using applied potential corrected for iR potential drop with R=11Ω and the experimental deposition current i on that specimen.
Figure 28:
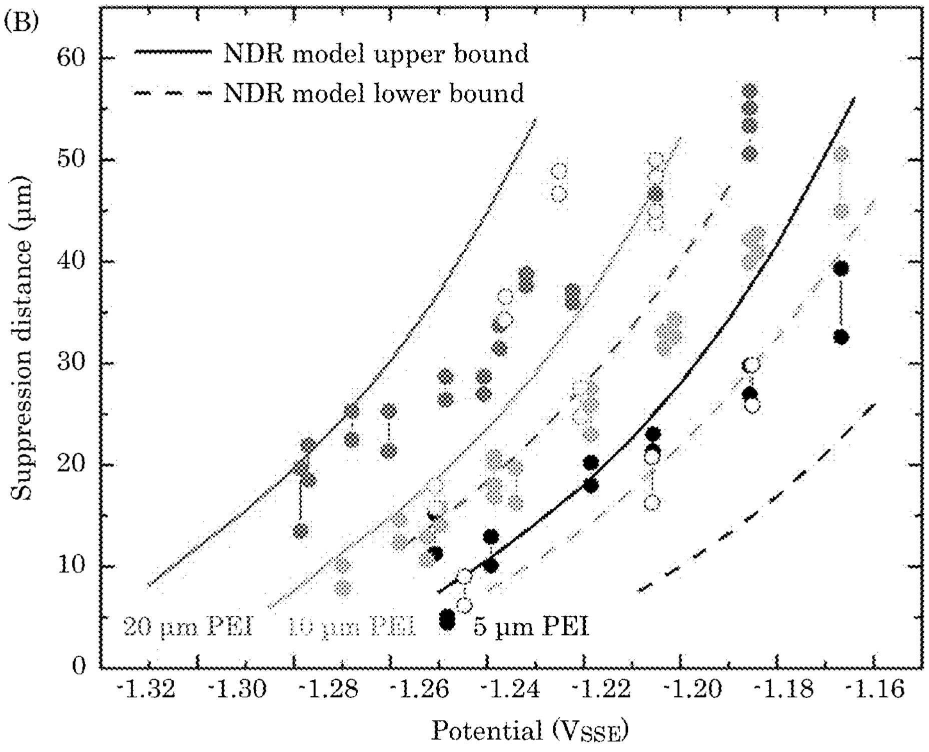

FIG. 28 compares the experimental and predicted values of the passive-active transition depth $d_s$ within the TSVs for three suppressor concentrations as functions of the applied potential. The bands cover the full range of simulations obtained using the parameters in Table 2 with each of the five $k_+$ and $k_-$ pairs. While $k_+$ values vary by a factor ten, the predicted deposition potentials for a given value of $d_s$ differ by only 40 mV. The predictions capture the increase of the depth of the passive-active transition, or equivalently the suppression distance, with both suppressor concentration and applied potential but overestimate the potential dependence. However, as with the deposit thickness measurements in FIG. 27A, the experimental data in FIG. 28A are plotted using the applied potentials. Because the simulations are plotted against deposition potential (i.e., at the substrate) it is more appropriate to plot the experimental results with an iR correction, obtained from the deposition current for each specimen and the measured cell resistance for the patterned substrates (R=11Ω), as is done in FIG. 28B. With the iR correction the experimental data fall within the bands of predicted values even at the more negative potentials (i.e., smaller values of $d_s$).

For a given PEI concentration, potentiostatic control determines the location where the electrode bifurcates into passive areas and regions of active metal deposition. As per FIG. 23, the location of the passive to active transition is relatively stable through pinch-off. Alternatively, use of a defined potential wave form to progressively move the transition point upward during metal deposition offers a means to develop a v-notch growth fronts that favors more rapid, void-free feature filling by taking advantage of the concept of "geometrical leveling". Higher suppressor concentrations that exhibit wider voltammetric hysteresis expand the potential range for such control, enabling faster filling using higher deposition rates at more negative potentials. This approach also avoids formation of the porous deposits that can occur during post-pinch-off filling associated with extended passive deposition as evident in FIG. 23 and FIG. 24.

Figure 29:
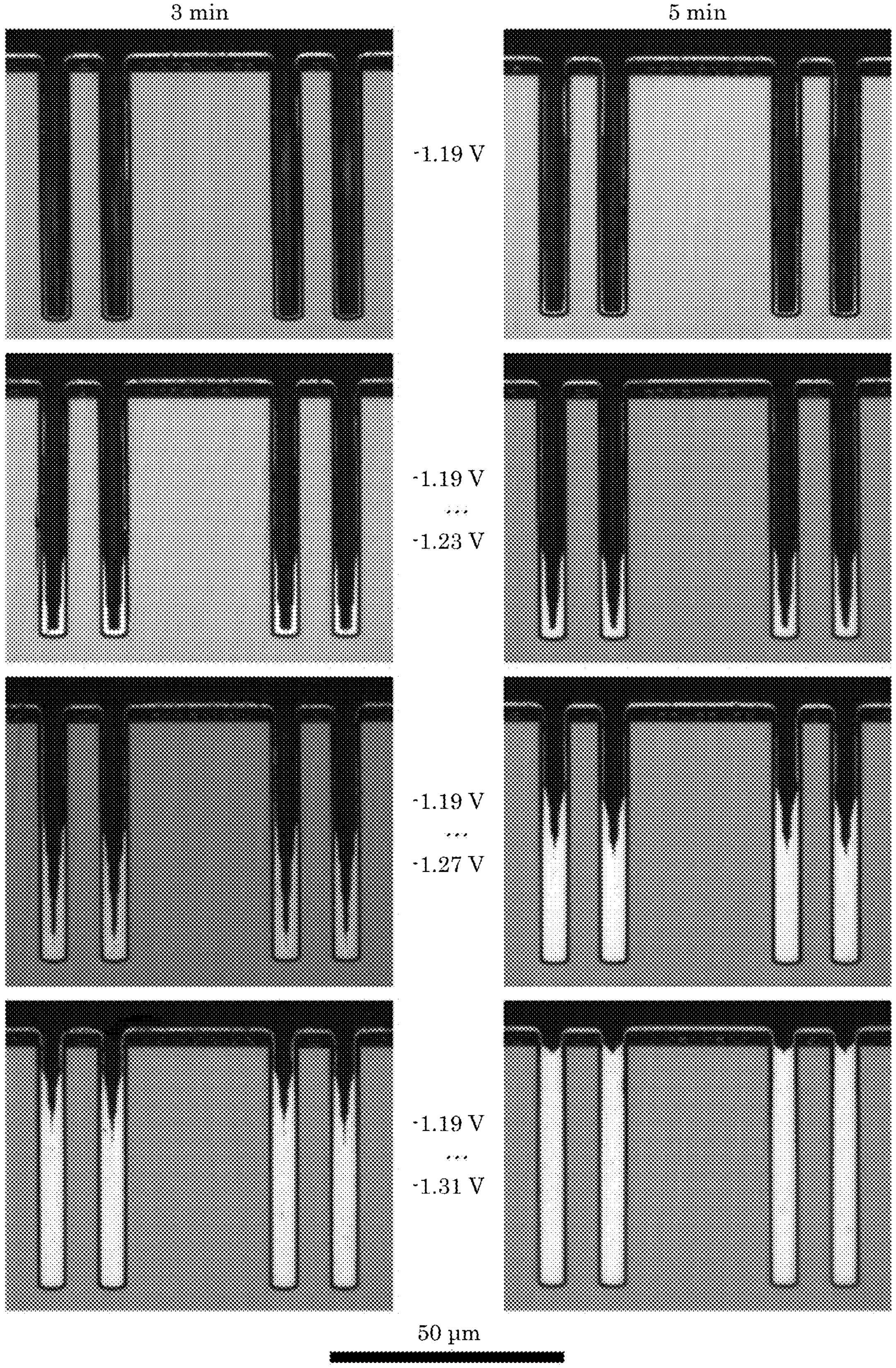
FIG. 29 shows cross-sectioned annular TSVs after Co deposition in electrolyte containing 20 μmol/L PEI, wherein start and stop potentials are indicated for deposition starting at −1.19 V in all cases and proceeding in −20 mV increments to the indicated stop potential; the dwell time increment at each potential step is indicated, and wafer fragment substrates were rotating at 100 rpm.
Figure 30:
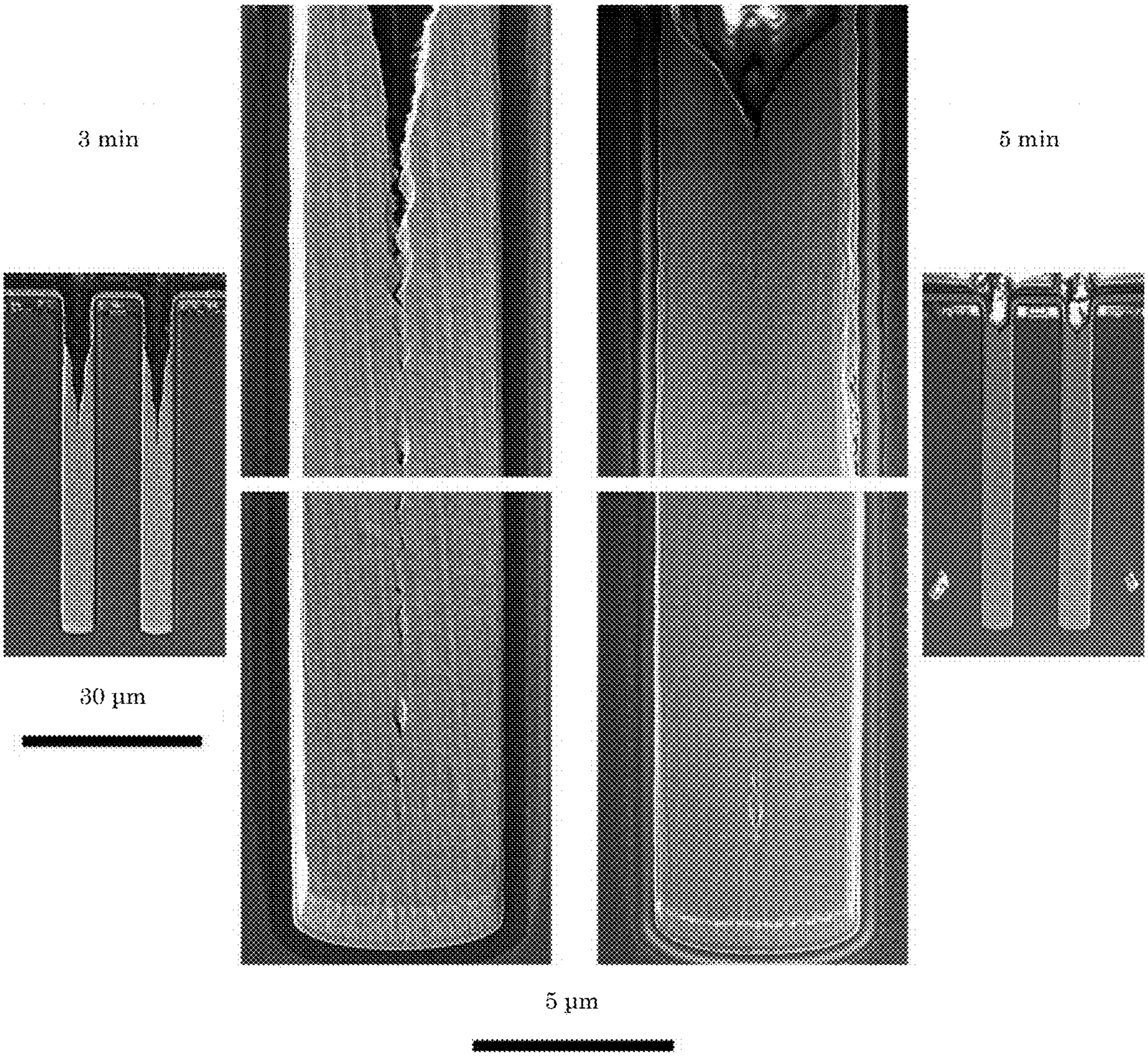
FIG. 30 shows SEM images of cross-sectioned annular TSVs after Co deposition at potentials spaced by −20 mV increments from −1.19 V to −1.31 V in electrolyte containing 20 μmol/L PEI in which the dwell time increment at each potential step is indicated, wherein higher magnification images of the upper and lower regions of each TSV show a rougher surface and more and larger voids in the TSV filled using 3 min deposition times, with patterned wafer fragment substrates rotated at 100 rpm and concavity above each void is an artifact of ion polishing used for surface preparation.

The evolution of feature filling using a potential-step waveform to advance the passive-active transition up the TSV is captured in FIG. 29. Filling sequences are shown for two different waveform dwell times, namely 3 min and 5 min, as the potential was stepped in −20 mV increments over the indicated potential ranges, the sequences starting at −1.19 V. Inflection points along the v-notch growth surface mark the height of the passive-active transitions at the preceding potentials. FIG. 30 shows higher magnification views of TSVs after deposition through −1.31 V. Voids along the central seam of the TSV (incompletely) filled using 3 min deposition intervals are more numerous and larger than those in the TSV filled using 5 min deposition intervals. The surface profiles are consistent with the level of void entrapment; despite the cumulatively shorter deposition time, the 3 min deposition interval exhibits substantially greater surface roughness. This is likely because the shorter deposition interval increased the portion of the TSV in which filling was completed during the later intervals with their larger overpotentials. Importantly, use of the potential waveform with dwell time of 5 minutes enables nearly complete filling of the feature within 30 minutes. More rapid filling of similar quality is likely possible using shorter deposition intervals at these more negative potentials where deposition is faster.

Superconformal Co deposition exhibits localized deposition with unsuppressed metal deposition rate starting at a distance down the filling feature defined by the suppressor concentration and applied potential. The geometry is analogous to that seen previously with Ni deposition in TSVs using the same PEI additive described in Example 1. The accuracy of the feature filling predictions improves when correction for iR potential drop during feature filling is included. Filling geometries for the Co, like similar active-passive transitions in TSV filling during Ni deposition, are well predicted by the simple S-NDR model for electrolytes containing rate-suppressing additive. As was also previously demonstrated with Ni, waveforms that progressively move the active region further up the feature enabled void-free feature filling.

It is informative to compare the geometry of the Co TSV filling in FIG. 23 and FIG. 24 with simulations of TSV filling that include full temporal and spatial evaluation of metal ion and suppressor concentrations for different values of the suppressor adsorption ($k_+$) and adsorbate deactivation ($k_-$) kinetic factors.

The transition from fixed, localized deposition to subsequent upward moving deposition of porous material following pinch-off of the impinging sidewall deposits during extended Co deposition at fixed applied potential shows the limits of the simple model. However, the deposition associated with leakage current on the "passive" surface does not contradict the central two state tenet of the S-NDR based mechanism. Rather, the results further demonstrate the broad applicability of the S-NDR concept for explaining bottom-up feature filling as well as guiding its extension to new chemical systems.

Example 3. Formation of Gold Transition Zone Terminated Superconformal Filling Equations and this Example start with Eq. 1.

This Example presents superconformal, bottom-up Au filling of high aspect ratio through silicon vias (TSVs) along with a predictive framework based on the coupling of suppression breakdown and surface topography. Deposition was performed in a $Na_3Au(SO_3)_2$ electrolyte containing a branched polyethyleneimine (PEI) deposition-rate suppressing additive. Voltammetric measurements using a rotating disk electrode (RDE) were used to assess the impact of the PEI suppressor concentration and transport on the rate of metal deposition, enabling the interplay between metal deposition and suppressor adsorption to be quantified. The positive feedback associated with suppression breakdown gives rise to an S-shaped negative differential resistance (S-NDR). The derived kinetics for suppressor adsorption and consumption were used in a mass conservation model to account for bottom-up filling of patterned features. Predictions, including the impact of deposition potential and additive concentration on feature filling, are shown to match experimental results for filling of TSVs. This further generalizes the utility of the additive derived S-NDR model as a predictive formalism for identifying additives capable of generating localized, void-free filling of TSVs by electrodeposition.

Depositions were conducted at room temperature in a cell containing 35 mL of 0.32 mol/L $Na_3Au(SO_3)_2$ electrolyte of pH 9.0. Additive was introduced to the electrolyte from a master solution of 10 mmol/L PEI of 10,000 molecular mass in 18 MΩ·cm water. The electrolyte was sparged with argon between electrochemical measurements to reduce the impact of dissolved oxygen. A $Hg/Hg_2SO_4$/saturated $K_2SO_4$ reference electrode (SSE) was connected to the working electrode compartment via a fritted salt bridge filled with saturated solution of $K_2SO_4$. All experiments were conducted without compensation for cell resistance, with all potentials relative to this reference. A platinum counter electrode was held in a frit-separated cell immersed within the main cell.

Voltammetry was conducted on an Au rotating disk electrode (RDE) of 1.0 cm diameter (area 0.78 $cm^2$). The RDE was polished with 1200 grade SiC paper and rinsed with 18 MΩ·cm water prior to each experiment. Voltammetry was performed at 2 mV/s at different RDE rotation rates: 25 rpm, 100 rpm, 400 rpm and 1600 rpm. Currents in electroanalytical measurements are converted to current densities using the projected RDE geometric area.

Feature filling was performed using fragments of wafers patterned with ≈56 μm deep TSVs of annular cross-section (courtesy of IBM) having a 1 μm thick Cu seed in the field and a lesser amount on the side walls. To give definition to the metal ion and additive transport, the patterned substrates rotated about one end from a Pt spindle during deposition, like a helicopter blade, the patterned surface facing upwards. Based on the ≈1 cm distance between the features and rotational axis for most of the imaged TSVs, the 100 rpm rotation rate corresponds to an estimated 10 cm/s flow rate over the surface. Pre-wetting with ethyl alcohol was used to displace air bubbles that were otherwise trapped in the TSVs during immersion in the electrolyte for Au deposition. Following immersion, the specimens were rotated at open circuit for 2 min prior to starting the metal deposition to displace the alcohol from the TSV by mixing with the bulk electrolyte. In most cases a 5 s voltage pulse at −1.5 V was then applied, just prior to feature filling, to improve nucleation on the Cu seeded TSVs.

The TSVs were imaged optically after embedding them in epoxy and then cross-sectioning and polishing them on diamond lapping films down to 0.1 μm grit size using standard techniques and equipment. A subset of specimens was also examined by scanning electron microscopy. These specimens were subjected to an additional cleaning of the surface using oblique 4 keV $Ar^+$ to remove residual surface damage from the mechanical polishing prior to imaging.

Figure 31:
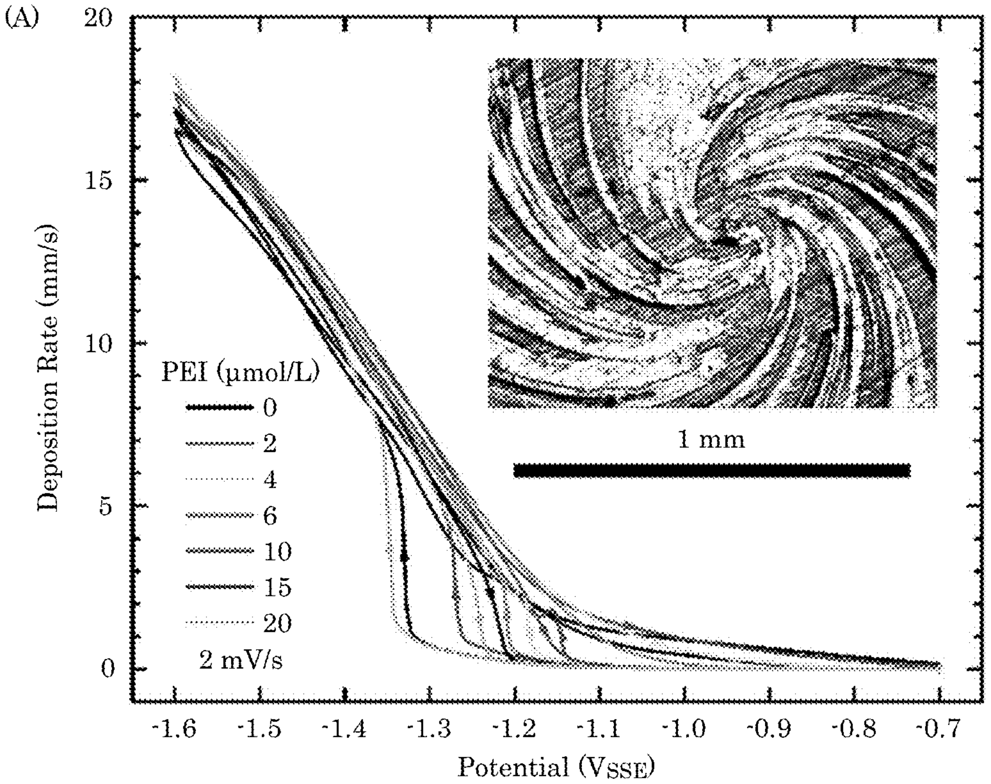
FIG. 31 shows graphs of current density versus potential for cyclic voltammetry of Au deposition (panel A) in electrolytes containing the indicated concentrations of PEI additive with RDE rotation rate 100 rpm and (panel B) in electrolyte containing 10 μmol/L PEI at the indicated RDE rotation rates in which experimental currents are converted to current densities using the 0.78 cm$^2$ RDE area, wherein data was collected without compensation for iR potential drop across the measured cell resistance R, measured values of which ranged between 6Ω and 9Ω, and data plotted against the applied potential; the insert shows an inhomogeneous swirled deposit on the RDE surface after cycling in electrolyte containing 20 μmol/L PEI for RDE rotation rate of 1600 rpm.
Figure 31:
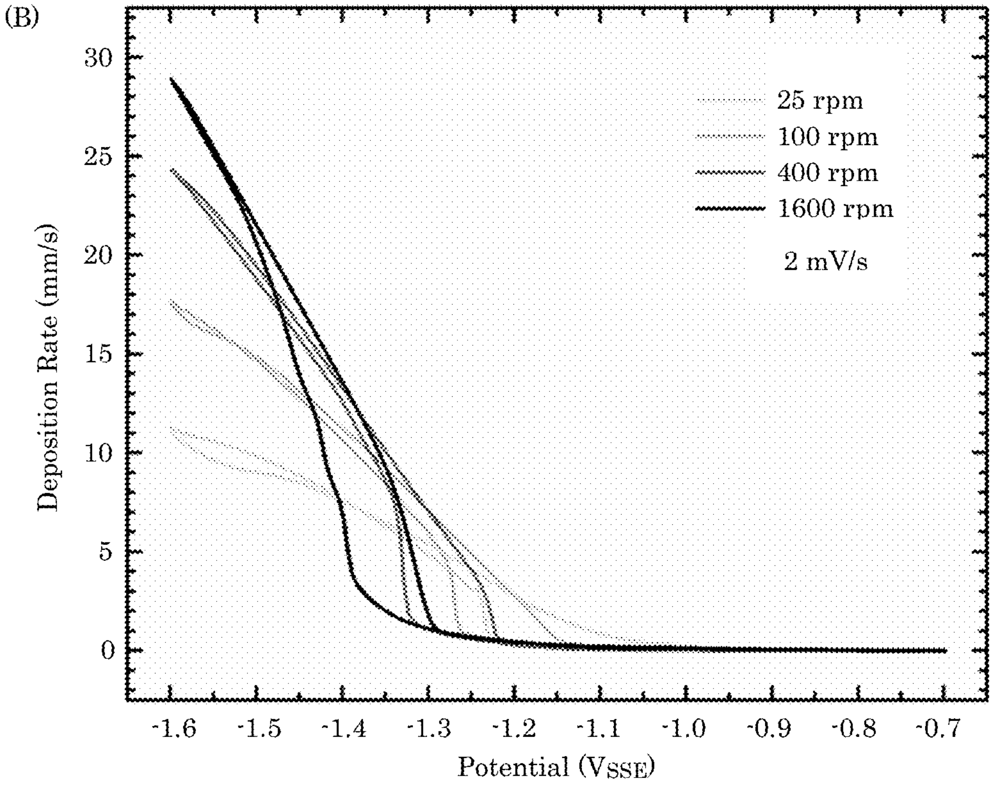

FIG. 31 shows cyclic voltammograms (CVs) that capture the suppression induced by the introduction of the PEI additive as well as the concentration-dependence (FIG. 31A) and the transport-dependence (FIG. 31B) of the potential at which suppression is lifted (i.e., suppression breakdown). Suppression is seen to lift at more negative potentials, the threshold value increasing with both PEI concentration and RDE rotation rate. Following suppression breakdown, the current-voltage response merges with the response of the additive-free electrolyte. The gradual increase of current in the passive region, i.e., at potentials positive of the suppression breakdown, suggests a leakage process associated with metal deposition and/or some parasitic contribution from water reduction. Deposition currents on the return sweeps remain accelerated to more positive potentials than the suppression breakdown potentials, leading to hysteretic responses. Analogous behavior has been seen for all the previously cited electrolytes exhibiting superconformal metal deposition in TSVs by the S-NDR mechanism. Examination of the electrode surface after cycling reveals a swirl pattern comprised of active and passive regions. For 20 μmol/L PEI the pattern is especially clear at higher rotation rates as shown in the optical micrograph of the RDE center that is inset in FIG. 31A.

Figure 32:
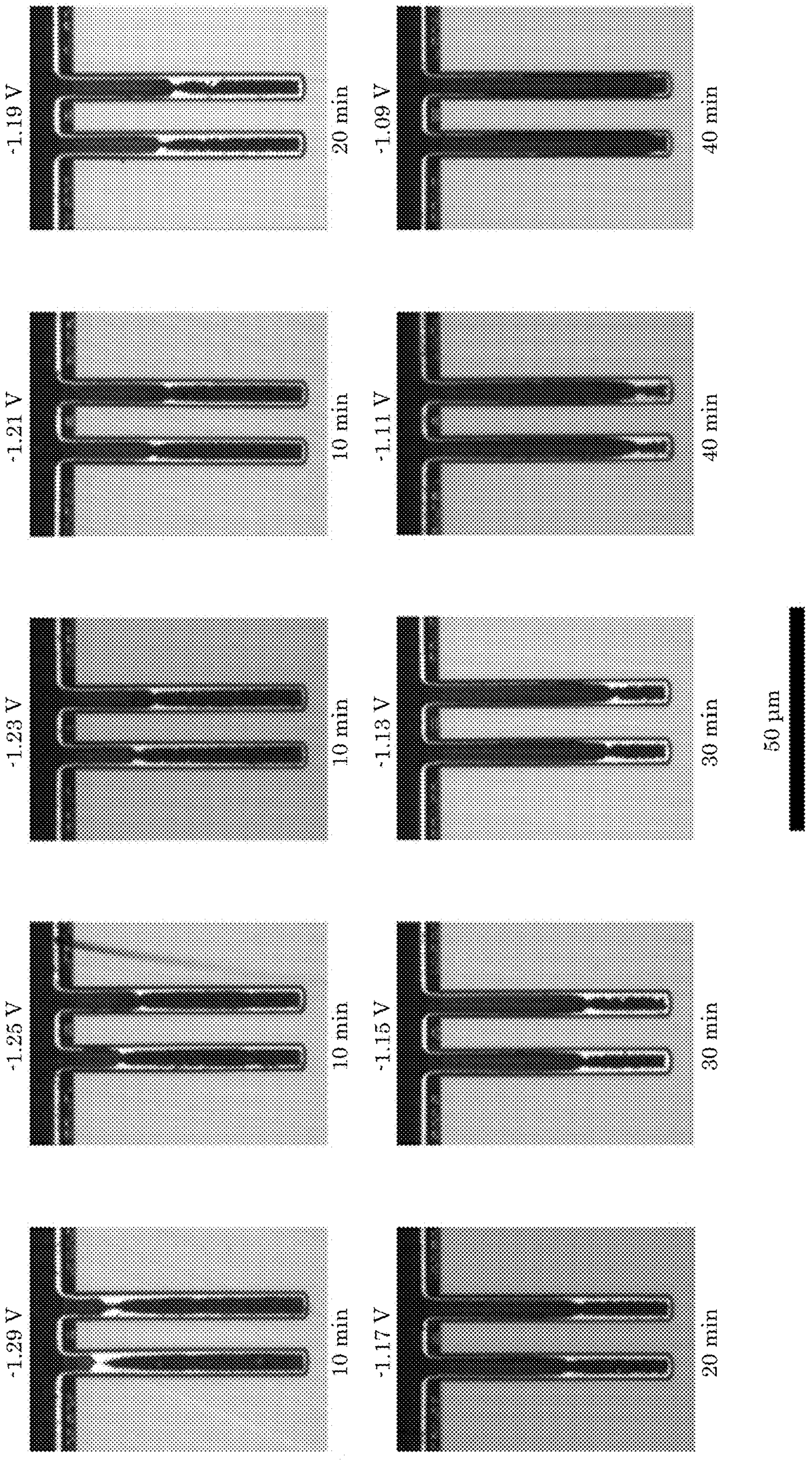
FIG. 32 shows optical images of cross-sectioned annular TSVs after Au deposition in electrolyte containing 20 μmol/L PEI concentrations for the indicated deposition times and applied potentials, wherein, except for the two most negative potentials, deposits were preceded by a 5 second (s) pulse at −1.5 V to improve nucleation on the Cu seeded surface, and patterned substrates were rotating at 100 rpm during deposition.

FIG. 32 shows cross sectioned annular TSV's following Au deposition from a 20 μmol/L PEI-containing electrolyte at the indicated applied potentials. The specified potentials are all positive of the critical potential that defines the hysteretic voltammetric loop for deposition on a planar electrode (FIG. 31). Accordingly, the free the surfaces of the TSV patterned work pieces are in the passive state while a transition to active metal deposition is evident within the recessed vias. The transition from the passive state to active deposition expressed as the distance from the field to the location where the maximum Au deposit thickness is first achieved, $d_s$, is seen to increase at more positive potentials. An analogous dependence, as well as an increase of $d_s$ with suppressor concentration, has been detailed with the Ni and Co systems exhibiting suppression breakdown induced S-NDR, respectively in Example 1 and Example 2. Longer deposition times at more positive potentials (see FIG. 32) provide visible deposits due to the slower potential activated deposition rate. The figure also implicitly captures the minimal impact of deposition time on the passive distance $d_s$, consistent with behavior observed with the Ni and Co systems from the onset of suppression breakdown all the way to impingement of the deposits on the opposing sidewall.

Both fitting of the electroanalytical measurements and feature fill prediction presume fractional suppressor coverage θ evolving through accumulation and deactivation according to $$\frac{d\theta}{dt} = k_+ C_s(1-\theta) - k_-\theta v(\theta, \eta) \qquad [1]$$

where $C_s$ is the suppressor concentration at the electrolyte/deposit interface. The deposition rate ν(θ) is assumed to be a linear function of the suppressor coverage θ and metal ion concentration at the interface, thus $$v(\theta, \eta) = \frac{\Omega}{nF}\frac{C_{Au}}{C^0_{Au}}(j_{\theta=0}(1-\theta) + j_{\theta=1}\theta) \equiv v_0(1-\theta) + v_1\theta \qquad [2]$$

The current densities on unsuppressed ($j_{\theta=0}$) and suppressed ($j_{\theta=1}$) surfaces are those associated with the metal deposition only and have been related to the metal deposition rate. The current densities are assumed to exhibit the conventional exponential dependence on overpotential η (relative to the reversible potential of ≈−0.37 V estimated from the CVs)

$$j_{\theta=0,1} = j^0_{\theta=0,1} e^{-\frac{\alpha_{\theta=0,1} F\eta}{RT}} \qquad [3]$$

where the back reaction has been neglected considering the high overpotentials used in the feature filling experiments. As defined using Eq. 2, the exchange rate constants $j_{\theta=0,1}{}^o$ for the bare, θ=0, and fully inhibited, θ=1, surface are for bulk metal ion concentration $C_{Au}{}^o$ at the interface.

Figure 33:
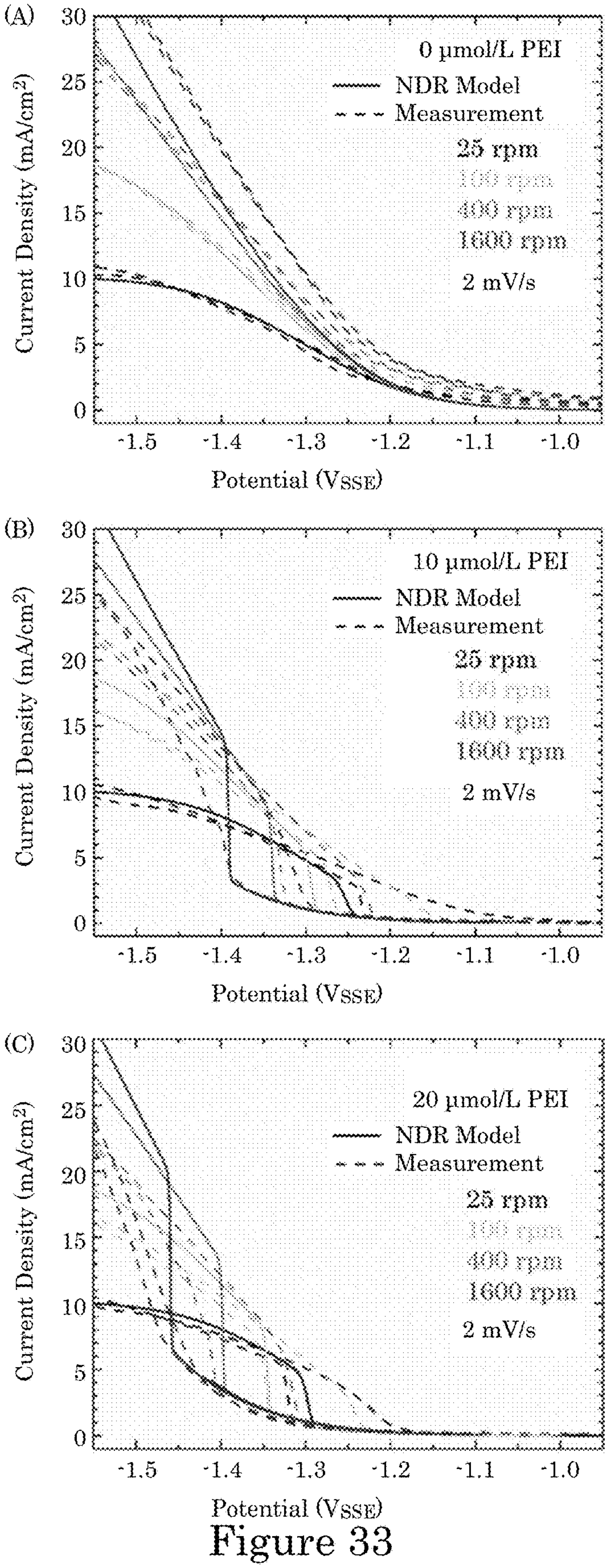
FIG. 33 shows graphs of current density versus potential for experimental and simulated voltammetry of Au deposition in electrolytes with additive concentrations (panel A) 0 μmol/L PEI, (panel B) 10 μmol/L PEI and (panel C) 20 μmol/L PEI at the indicated RDE rotation rates; lifting of suppression on the initial negative-going scans in PEI-containing electrolytes occurs at more negative potentials than the reassertion of suppression on the return scans; experimental currents are converted to current densities using the 0.78 cm$^2$ RDE area; data was collected without compensation for iR potential drop across the cell resistance R; simulations account for the associated deviation from the applied 2 mV/s potential scan rate, and experimental and simulated voltammetry are plotted against the applied potential.

Values for $j_{\theta=0}{}^o$ and $\alpha_{\theta=0}$ are given in Table 4 with other parameters that will be discussed. The values were determined by fitting voltammetric data from additive-free electrolyte; the fitted curves are overlaid on the experimental data in FIG. 33A; the CVs and fitted curves for non-zero suppressor concentrations in FIG. 33B-C are discussed later. The similar experimental current densities prior to suppression breakdown at the higher PEI concentrations in FIG. 31 suggest that the surfaces in these PEI-containing electrolytes are saturated with PEI prior to the suppression breakdown event.

TABLE 4

| Parameter | Name | Units | Value |
|---|---|---|---|
| TSV inner radius | $r_i$ | m | $4 \times 10^{-6}$ |
| TSV outer radius | $r_o$ | m | $9.5 \times 10^{-6}$ |
| TSV height | h | m | $56 \times 10^{-6}$ |
| Diffusion coefficient, suppressor | $D_s$ | $m^2/s$ | $9.2 \times 10^{-11}$ |
| Bulk concentration, Au | $C_{Au}{}^o$ | $mol/m^3$ | 320 |
| Boundary layer thickness for rotation rate ω = 50π rad/min (25 rpm) | δ | m | $80 \times 10^{-6}$ |
| Saturation suppressor coverage | Γ | $mol/m^2$ | $2.5 \times 10^{-7}$ |
| Suppressor adsorption kinetics | k+ | $m^3/mol \cdot s$ | $8 \times 10^4$ |
| Suppressor burial kinetics | k− | 1/m | $1 \times 10^8$ |
| Unsuppressed Au exchange rate constant | $j_{\theta=0}{}^o$ | $A/m^2$ | $1 \times 10^{-5}$ |
| Suppressed Au exchange rate constant | $j_{\theta=1}{}^o$ | $A/m^2$ | $3 \times 10^{-5}$ |
| Unsuppressed charge transfer coefficient | $\alpha_{\theta=0}$ | — | 0.45 |
| Suppressed deposition charge transfer coefficient | $\alpha_{\theta=1}$ | — | 0.35 |
| Au ionic charge | n | — | 1 |
| Au molar volume | Ω | $m^3/mol$ | $10.21 \times 10^{-6}$ |

Parasitic processes such as water reduction that can reduce the current density associated with the metal deposition below the measured current density are taken to be negligible in this system. The values of $j_{\theta=1}{}^o$ and $\alpha_{\theta=1}$ were therefore obtained directly from the fit to the negative-going sweeps up to the critical potential. The difference of $\alpha_{\theta=1}$ from $\alpha_{\theta=0}$ is not expected from a simple blocking mechanism.

Fitting of the CVs to obtain the remaining kinetic parameters $k_+$ and $k_-$ involves integrating Eq. 1 for θ(t), subject to Eqs. 2 and 3, and mass balance between suppressor diffusion across the boundary layer and its adsorption onto the surface expressed as $$D_s\frac{C_S^o - C_S}{\delta} = \Gamma k_+ C_S(1-\theta) \qquad [4]$$

Values for the areal density of sites Γ, suppressor diffusion coefficient $D_s$ and boundary layer thickness δ (scaling with the rotation rate co as $\omega^{-0.5}$) were estimated (see Table 4). Metal ion depletion across the boundary layer, more significant here than Ni and Co studies in Example 1 and Example 2 with higher metal ions concentrations, was accounted for by balancing the molar volume weighted ion flux across the boundary layer with the deposition rate $$\Omega D_{Au}\frac{C^o_{Au} - C_{Au}}{\delta} = v_{\theta=0}(1-\theta) + v_{\theta=1}\theta \qquad [5]$$

where the right side of Eq. 5 also depends on the metal ion concentration at the surface, $C_{Au}$, through Eq. 2. This balance is most relevant when deposition approaches the metal ion transport limit with $C_{Au} \rightarrow 0$.

Evolution of current density and adsorbate coverage through Eqs. 1-5 depends on several parameters. However, with values for the other parameters either known or otherwise estimated, $k_+$ and $k_-$ were adjusted to capture the dependence of the suppressor breakdown potential on the suppressor flux to the interface, as manifest in the concentration and RDE rotation rate dependences. Significantly, simulations over a wide range of $k_+$ values can exhibit similar suppression breakdown potential if $k_-$ is scaled appropriately. This is clearest for the case of near ideal suppression (i.e., $v_{\theta=0} \gg v_{\theta=1} \to 0$) for which the unsaturated steady state suppressor coverage, obtained from solution of Eqs. 1 and 3 with $$\frac{d\theta}{dt} = 0, \text{ is } \theta = \frac{k_+}{k_-}\frac{C_S}{v_{\theta=0}},$$

so that $k_+$ and $k_-$ enter explicitly only in the ratio $$\frac{k_+}{k_-}.$$

However, the coverage also depends on the suppressor and metal ion concentrations at the electrolyte/metal interface ($C_S$ and $v_{\theta=0}$, respectively) and thus the boundary layer thickness through Eqs. 4 and 5. Simultaneous fitting of the suppression breakdown potentials at the four rotation rates therefore further restricts the range of $k_+$ and $k_-$ values.

Fitting of the suppression breakdown observed in the cyclic voltammetry for two different suppressor concentrations and four different rotation rates is shown in FIGS. 33B and C. The emphasis was on capturing the suppression breakdown potentials, with no effort to fit the slope of the data at more negative potentials considering the evolving and unquantified surface area, and thereby current density, associated with active regions of the bifurcating electrode. The $k_+$ and $k_-$ values, derived from the simultaneous fitting of all eight curves, are indicated in Table 4. As the data acquisition was performed without iR compensation, a corresponding −iR potential offset is included in the overlaid simulations. Both the cell resistance and metal ion transport limit have only a modest impact on fitting of the suppression breakdown due to the low currents, well below the transport limit, prior to suppression breakdown. At potentials negative of suppression breakdown, the current densities generally fall below the predicted values, consistent with incomplete activation of the RDE surface (FIG. 31A, inset).

The distinct breakdown of inhibition in the voltammetric curves reflects the emergence of a two-state active-passive system, the critical potential representing the limiting condition for balance between the concentration-dependent rate of suppressor adsorption onto the uniform, planar surface and the potential-dependent rate of adsorbate deactivation (Eq. 1). Decrease of the suppressor concentration within recessed features effectively introduces a position-dependent positive shift of the critical potential from that at the free-surface. For experiments of most interest the passive-to-active transition occurs at the location within the feature where the value of the critical potential for the suppressor concentration at that location equals the actual applied potential.

For the Au electrolyte here, metal ion depletion is neglected in the simulations yielding the location of the passive-to-active transition. The general uniformity of the metal deposited with the TSV at less negative potentials (FIG. 32) indicates that this is good approximation for the less negative applied potentials in the study. Thus, simple evaluation of the suppressor concentration c as a function of distance down the TSV permits the position of the passive-to-active transition within TSV to be predicted as a function of applied potential (and suppressor concentration) using only the voltammetrically measured critical potential.

FIG. 14 shows schematic representations of the geometry utilized in the simulations. Summarizing the relevant equations, for inner radius $r_i$ and outer radius $r_o$ of the annular TSV, mass balance of the divergence of suppressor flux down the cross-sectional area $a_f = \pi(r_o^2 - r_i^2)$ and the rate of suppressor adsorption on the surrounding sidewall perimeter $p_f = 2\pi(r_o + r_i)$ yields $$a_f D_s \frac{d^2C(z)}{d^2z} = p_f \Gamma C(z) k_+ (1-\theta) \quad [6]$$

where z is the distance from the field down the TSV. Equating the flux across the linear gradient of the boundary layer to the sum of adsorption on the field around the TSV and that going down the TSV gives $$a_s D_s \frac{C_S^\infty - C(0)}{\delta} = (a_s - a_f)\Gamma C(0) k_+ (1-\theta) + a_f D_s \frac{dC}{dz}\bigg|_{z=0} \quad [7]$$

where the concentration at the boundary layer-substrate interface equals that at the top of the TSV. For boundary layer thickness δ that is less than the spacing of the TSVs as in the experiments, the mass balance is invoked over the square area $a_s = \delta^2$ around each TSV. Finally, mass balance at the bottom of the TSV requires the suppressor flux and rate of suppressor adsorption satisfy $$\Gamma C(-h) k_+ (1-\theta) = D_s \frac{dC}{dz}\bigg|_{z=-h} \quad [8]$$

The differential equation and boundary conditions in Eqs. 6-8 and suppressor adsorption and metal deposition interactions defined by Eqs. 1-4 permit simulation of deposition profiles using the kinetic parameters obtained from the RDE experiments (Table 4). Suppressed deposition is predicted in the upper portion of the TSVs with a micrometer scale transition to unsuppressed deposition in the lower portion of the TSV at depth $d_s$ down the TSV that is consistent with experimental observations (and analogous to model predictions detailed previously with Ni and Co filling).

Figure 34:
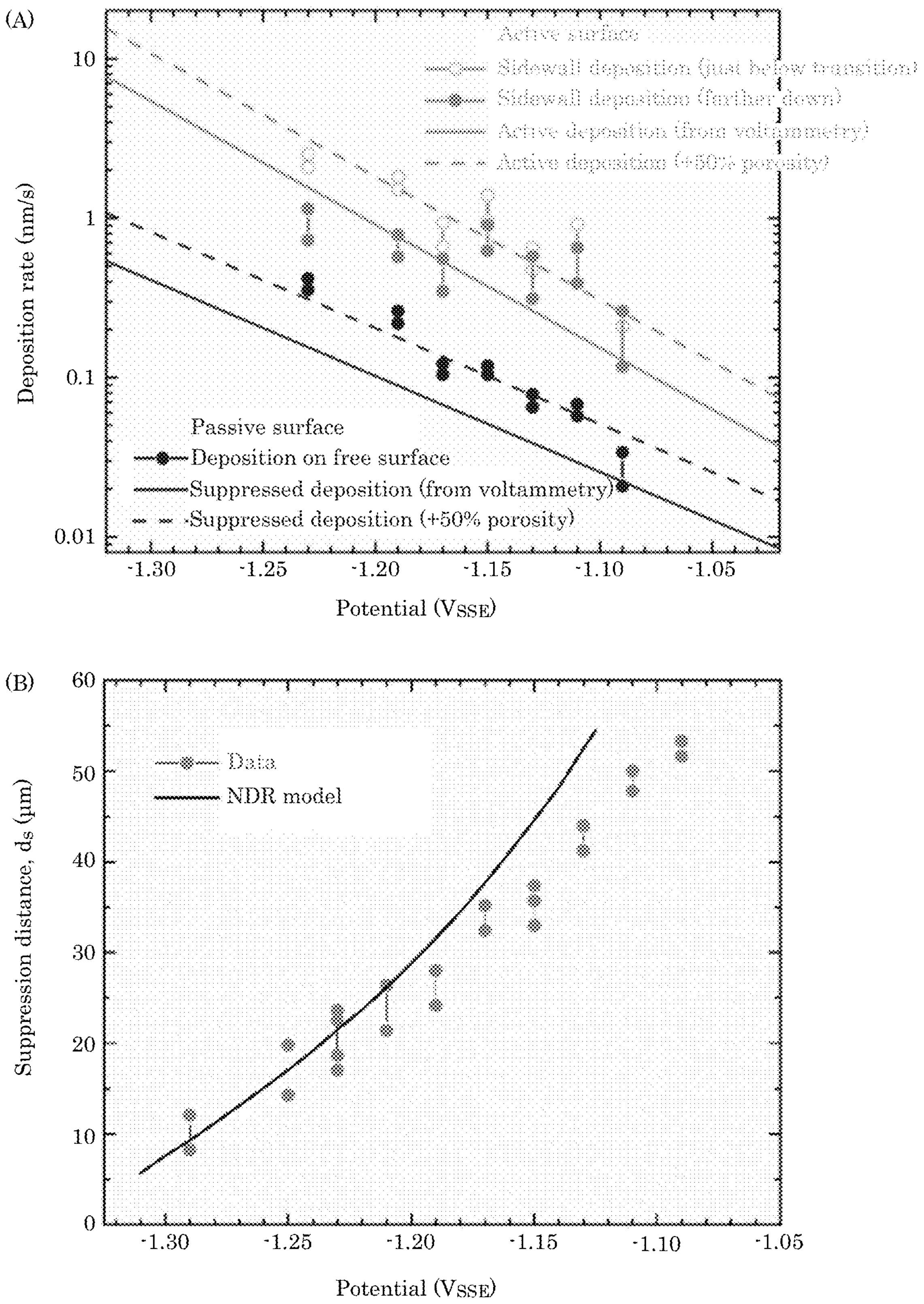
FIG. 34 shows (panel A) passive deposition rate on the field and the active deposition rate from the deposit thickness just below the passive-to-active transition as well as farther down the TSV, wherein all are nominal rates determined from the deposit thickness and deposition time without consideration of the deposit density; solid lines represent predicted rates based on the deposition kinetics obtained from the cyclic voltammetry for a fully dense deposit; dashed lines represent rates accounting for the indicated volume fractions of porosity; panel B shows a graph of suppression distance versus potential for distance $d_s$ from the field down the TSV to where the maximum deposition rate is achieved, and experimental distances from the field to the depth in the TSV where the maximum deposit thickness is first obtained are plotted versus the applied potential, wherein bars show the maximum and minimum values obtained from all TSVs examined on each specimen.

FIG. 34A compares deposition rates obtained from the specimens shown in FIG. 32 with values predicted using the CV-derived kinetics in Table 4, both as functions of the applied potential. The nominal deposit rate of the porous deposits is significantly faster than that predicted from the current density in the voltammetry. However, the data is consistent with predictions assuming 50% volume of incorporated porosity. The thickness of the deposits immediately below the passive-to-active transition indicates deposition faster than that expected from the voltammetry (as seen by favorable comparison to another prediction for 50% porosity). However, just a few micrometers below the bulging deposits (see FIG. 32) that yielded these high rates, thicknesses vary minimally with depth and the measured deposition rates are consistent with expectations.

FIG. 34B compares the experimental and predicted values of the passive-to-active transition depth $d_s$ as functions of the applied potential. The predictions of the simple, 1D, single component model do a good job anticipating the experimental dependence of the transition depth on applied potential. The iR drop across the ≈11Ω cell resistance, based on measured deposition currents on the small patterned substrates, ranges from 2 mV at −1.09 V to less than 7 mV at −1.29 V and is ignored in both figures.

Because the applied potential determines the location where suppression fails within the filling feature, metal deposition can be localized toward the bottom of the TSV and run at the transport limit without risk of pinch-off from deposition higher up. As demonstrated previously with Ni and Co, void-free filling can be accomplished by adjusting the applied potential over time to progressively actuate deposition higher in the TSV as appropriate for the evolution of filling farther down. As in the ferrous metal studies, both stepped and ramped potentials are examined here.

Figure 35:
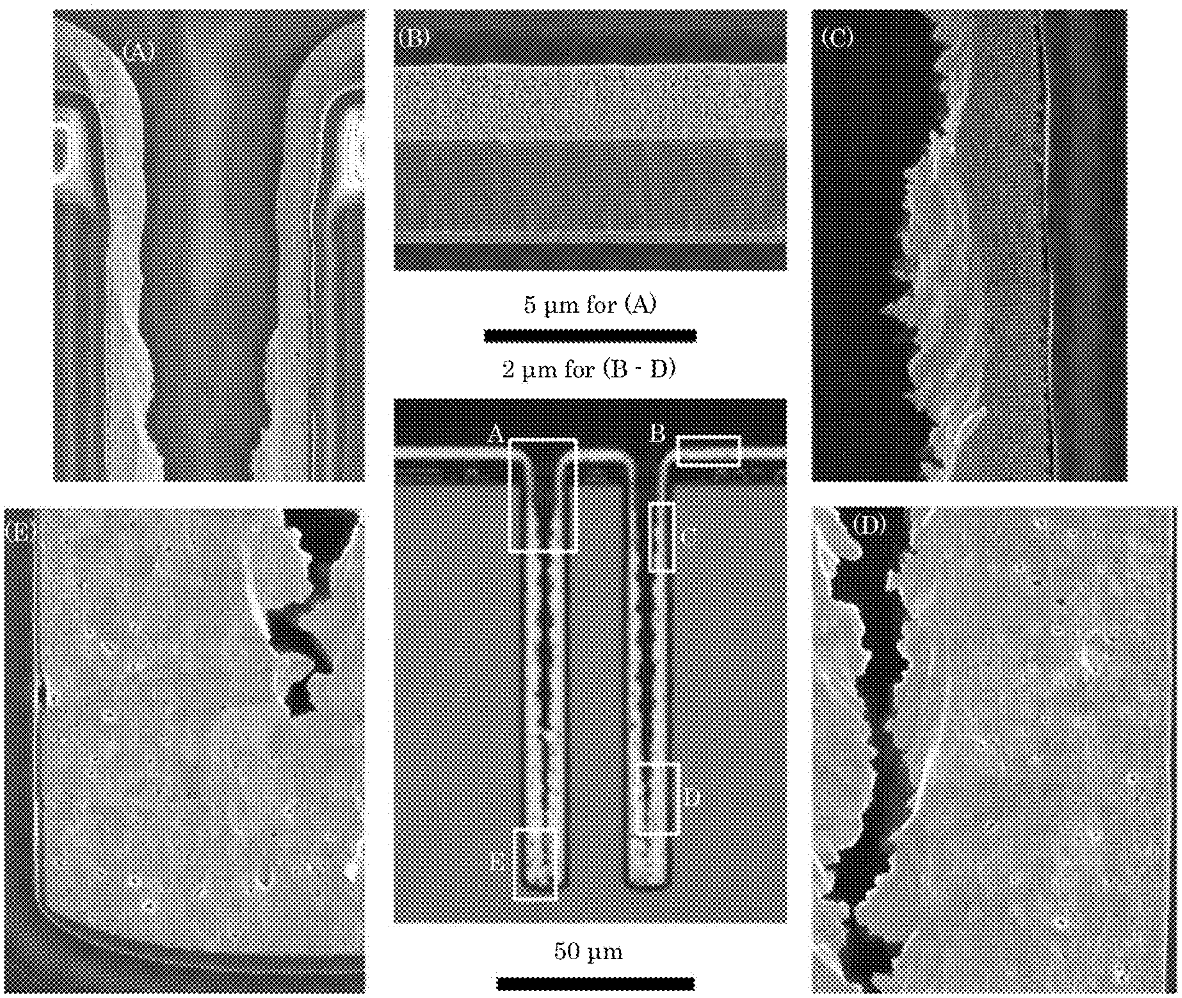
FIG. 35 shows cross-sectioned annular TSV after Au deposition; the dark spots on the Au in the optical image are diamond particles pulled from the lapping paper by the ductile metal; deposition was conducted in electrolyte containing 20 μmol/L PEI concentrations; the applied potential was stepped in 20 mV increments from −1.09 V to −1.29 V in which deposition times were 10 min at the first three potentials and decreasing by 1 min for each step thereafter to end at −1.31 V for 1 min; deposition was preceded by a 5 s pulse at −1.5 V to improve nucleation on the Cu seeded surface; representative regions of the central optical image were imaged by scanning by electron microscope; the length scale above the central image is indexed for these electron micrographs, and the patterned wafer fragment substrate was rotating at 100 rpm during deposition.

FIG. 35 shows partial filling obtained using a stepped potential where deposition times were progressively shortened as the potential was stepped to more negative values. While an overall v-shaped profile is evident, the Au deposition differs from that detailed with both Co and Ni in three significant aspects. First, while the surface of the passive deposit is smooth (FIG. 35B), that of the active deposit is quite rough (FIG. 35C). Second, there is an especially pronounced build-up of deposit immediately below the passive-to-active transition (see FIG. 32) that substantially exceeds the thickness only a few micrometers farther down the feature; potential stepping thus yields the observed wavy deposit on the sidewalls Third, substantial passive deposit on the sidewalls higher in the feature accumulates during sequential filling of the lower regions, similar to that on the field and consistent with the relatively large leakage currents as compared to the active deposition rates (FIG. 31).

These three differences have significant impact on the nature of filling and the deposit itself. The deposit roughness is a source of nanoscale voids within the deposit and where the sidewall deposits impinge (FIGS. 35D and E). The waviness serves as a potent source of more substantial voids where impingement of the sidewall deposits occurs. The passive deposit, while not expected to prevent superconformal filling, e.g., through keyhole void entrapment, is highly porous and likely the cause of deposit cracks in an earlier Au TSV filling study. Significantly, analogous porosity and cracking in passive deposits was also detailed in the study of S-NDR Co filling of TSVs. The porosity in both systems suggests suppressor deactivation occurs through incorporation whereby a substantial quantity of organic suppressor is embedded in the slowly growing metal deposit.

Figure 36:
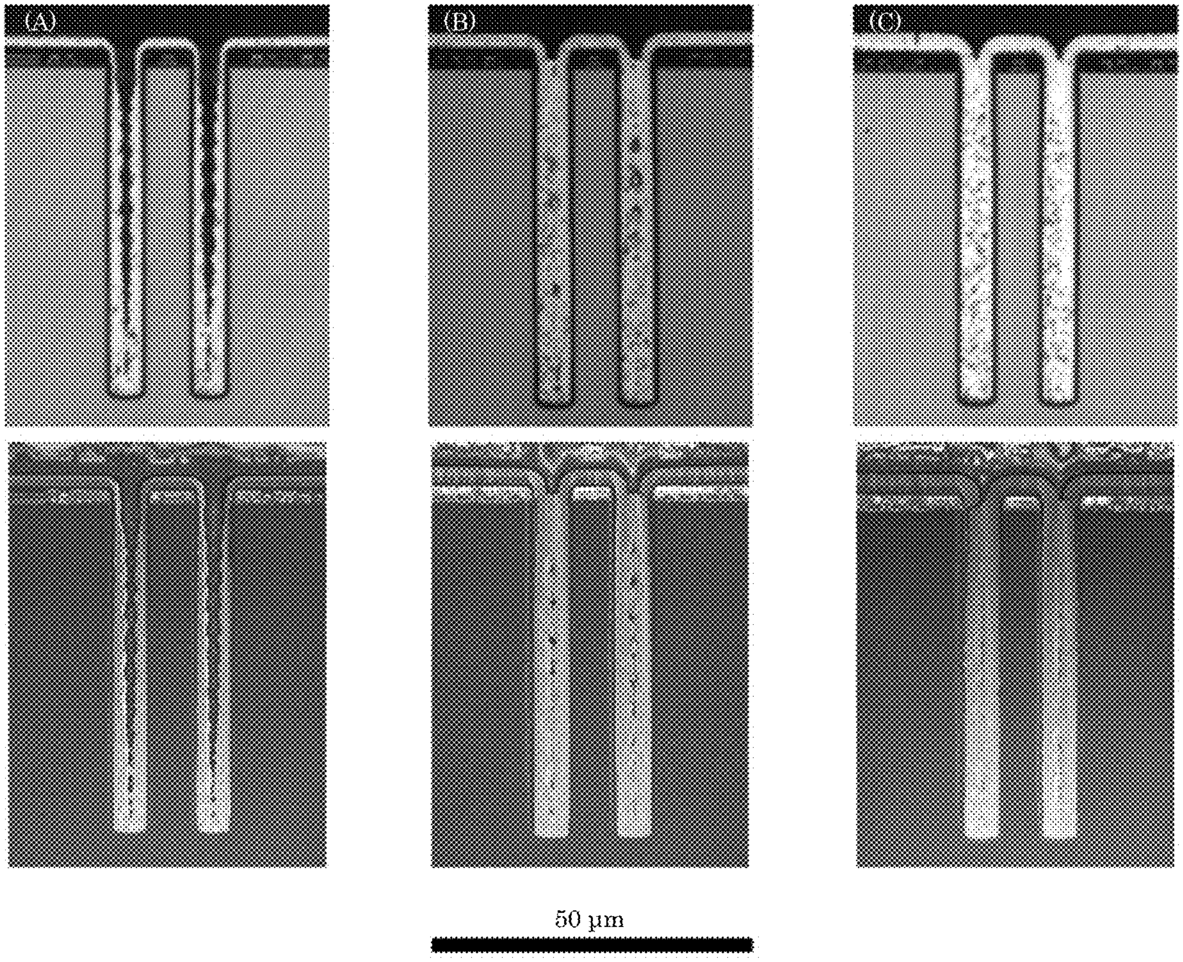
FIG. 36 shows cross-sectioned annular TSV after Au deposition in electrolyte containing 20 μmol/L PEI concentrations showing superconformal filling for three progressively longer stepped sequences of applied potential; top row shows optical images with the corresponding SEM images shown below, wherein (panel A) deposition time 75 min total: stepped in 20 mV increments from −1.09 V to −1.31 V with 10 min at each of the first three potentials and decreasing by 1 min at each potential thereafter; (panel B) deposition time 116 min total: stepped in 20 mV increments from −1.09 V to −1.33 V with 12 min at each of the first seven potentials followed by (10, 8, 5, 4, 3, 2) min at the subsequent potentials; and (panel C) deposition time 161 min total: stepped in 10 mV increments from −1.09 to −1.33 V with 8 min at each of the first fourteen potentials then 7 min at the next three potentials followed by (5, 4, 3, 2, 1) min each at two sequential potentials, and deposition was preceded by a 5 s pulse at −1.5 V to improve nucleation on the Cu seeded surface with patterned wafer fragment substrate rotating at 100 rpm during deposition.

FIG. 36A contrasts the partial filling already shown in FIG. 35 with that obtained using longer deposition times at the potential steps (FIG. 36B). While the TSV is nominally filled in less than 2 hr, voids along the center line are evident. A more smoothly graded potential step waveform should reduce the incremental region that is activated with each potential step and thus the amplitude and impact of the previously noted undulations of deposit thickness underlying these voids. Halving the size of the potential steps, as well as using longer deposition time at each step to more fully fill the lower regions prior to activating deposition higher up, yields a center-line seam that can only be seen in the electron microscope (FIG. 36C).

FIG. 37 shows the evolution of filling when the applied potential is ramped rather than stepped. The apparently smooth increase of deposit thickness with depth throughout filling (FIG. 37D-F) eliminates the large voids seen along the center line in FIG. 36. The higher magnification images in FIG. 37A-C show micrometer size grains in the regions filled by active deposition, with only a small fraction of nanoscale porosity incorporated during growth due to the dendritic deposit surface. A well-defined layer of darker, highly porous material is evident adjacent to the sidewalls in FIGS. 37B and C. The images capture the sharply defined interface between this passive deposit and the overlying active deposit, as well as its increasing thickness toward the TSV top. The passive deposit manifests the significant leakage current (FIG. 31), its variation with position and deposition time reflecting the increasingly long period of (passive) deposition the farther the deposit has moved up from the TSV bottom. Images of the free surface at yet higher magnification in FIGS. 37G and H highlight the highly porous passive deposit without overlying active deposits.

The superconformal Au deposition in the PEI-containing sulfite electrolyte shows localized deposition exhibiting a passive-to-active transition going down the TSVs. Unsuppressed "active" metal deposition starts at a distance down the filling feature that is defined by the suppressor concentration and applied potential, metal deposition associated with a slower leakage through the suppressor layer occurring at the slower "passive" rate above this location. The geometry is analogous to that noted during Au deposition in lower aspect ratio square TSVs as well as Ni and Co deposition in similar annular TSVs, all using a smaller PEI suppressor. The S-NDR model previously applied to both the Ni and Co systems once again provides reasonably accurate prediction of the position of the passive-to-active transition as a function of the applied potential. Also as previously demonstrated with those systems, waveforms that progressively move the active region further up the feature enable filling of the TSVs without the keyhole voids that would otherwise result from filling near the metal-ion transport limit. It is expected that filling times can be reduced below those shown for both the stepped and ramped cases by further optimization of the waveforms.

Example 4. Comparative Structures

Metal can be deposited in various conventional ways that completely cover exposed surfaces of a material. Thin-film metallic microstructures have been produced by through-mask electroplating (also known as the LIGA). Through-mask deposition has been applied to a wide variety of metallic materials, including applications in both passive and active devices. LIGA combines template production (e.g., lithography) with electrodeposition whereby metal deposition proceeds on exposed surfaces of an underlying conductive seed layer. Additionally, damascene processes include metallizing a patterned dielectric with a thin seed layer across the entire surface followed by metal electrodeposition across the entire surface.

In this regard, with reference to FIG. 38, FIG. 39, FIG. 40, and FIG. 41, substrate 42 is exposed to the electrolyte 40. As shown in FIG. 38, metal 44 is electrochemically deposited under constant electric potential on all exposed surfaces of substrate 42 including field 10. As shown in FIG. 39, metal 44 is electrochemically deposited under constant electric potential at the bottom of substrate 42 and strictly fills the feature from the bottom to the top of the feature and onto field 10 such that metal 44 is disposed on all exposed surfaces of substrate 42 including field 10. As shown in FIG. 40, metal 44 is electrochemically deposited under constant electric potential on all exposed surfaces of substrate 42 including field 10.

FIG. 41 show comparative filling trench or via 50 with metal 44 on substrate 42. Panel A of FIG. 41 shows comparative subconformal filling of metal 44 in trench or via 50 and planar region 10 of substrate 42. The subconformal filling of metal 44 has a greater deposition rate at pattern features such as at the top edges 52 of trench or via 50. The subconformal growth shown in panel A of FIG. 41 leads to void 54 as shown in panel B of FIG. 41. As electrodeposition of metal 44 continues, growth of metal 44 at top edge 52 continues until the metal 44 meets in a central location, forming and enclosing void 54 therein as shown in panel B of FIG. 41.

Panel C of FIG. 41 shows comparative conformal growth wherein metal 44 grows at a consistent rate on planar region 10 of substrate 42, within trench or via 50, and at top edges 52 of trench or via 50. Conformal growth as shown in panel C can form seam 54 as shown in panel D of FIG. 41. Seam 54 can be formed with continued growth of metal 44 inward from sidewalls of trench or via 50.

Panel E of FIG. 41 shows comparative superconformal filling wherein metal 44 forms a V-notch 56 centrally oriented within trench or via 50. Although conventionally referred to as bottom-up filling, this comparative super conformal super filling produces a substantially uniform filling of trench or via 50 with metal 44 as shown in panel F of FIG. 41. Here, trench filling is characterized by uniform growth on field 10 and feature 50 as shown in panel B followed by development of V-notch 56 geometry with the deposition of metal 44 on field 10 as shown in panel E and panel F of FIG. 41.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A process for forming a transition zone terminated superconformal filling in a recess of a substrate by electrodepositing metal, the process comprising:
- providing an electrodeposition composition comprising:
  - a metal electrolyte comprising a plurality of metal ions and a solvent; and
  - a suppressor disposed in the solvent;
- providing the substrate comprising:
  - a field surface; and
  - the recess disposed in the substrate, the recess comprising a distal position and a proximate position relative to the field surface of the substrate;
- exposing the recess to the electrodeposition composition;
- potentiodynamically controlling an electric potential of the recess with a potential wave form;
- bifurcating the recess into an active metal deposition region and a passive region in response to potentiodynamically controlling the electric potential;
- forming, in response to bifurcating the recess, a transition zone at an interface of the active metal deposition region and the passive region;
- decreasing the electric potential of the recess by the potential wave form;
- progressively moving the transition zone closer to the field surface and away from the distal position in response to decreasing the electric potential; and
- reducing the metal ions to form metal and depositing the metal in the active metal deposition region and not in the passive region to form the transition zone terminated superconformal filling in the recess of the substrate, the transition zone terminated superconformal filling being:
  - void-free,
  - disposed in the recess in the active metal deposition region from the distal position to the transition zone, comprising a v-notch, and
  - absent in the passive region between the proximate position and the transition zone,
- wherein the electrodeposition composition has an S-shaped negative differential resistance cyclic voltammogram.

2. The process of claim 1, further comprising wherein the transition zone terminated superconformal filling is absent on the field surface.

3. The process of claim 1, further comprising:
terminating the depositing the metal before completely filling the recess to the field surface.

4. The process of claim 1, further comprising:
terminating depositing the metal after completely filling the recess to the field surface.

5. The process of claim 1, wherein the metal ions comprise $Co^{2+}$, $Ni^{2+}$, $Fe^{2+}$, $Au^{3+}$, $Ag^{+}$, $Zn^{2+}$, $Sn^{2+}$, $Pb^{2+}$, or a combination comprising at least one of the foregoing metal ions.

6. The process of claim 1, wherein the electrodeposition composition further comprises anions for the metal ions, the anions comprising sulfate, chloride, sulfite, or a combination comprising at least one of the foregoing anions.

7. The process of claim 5, wherein the metal comprises cobalt, iron, nickel, gold, lead, tin, or a combination comprising at least one of the foregoing metals.

8. The process of claim 1, wherein the suppressor comprises a polyethyleneimine, a phenolphthalein, a polyether, benzimidazole and its derivatives, or a combination comprising at least one of the foregoing suppressors.

9. The process of claim 1, wherein the solvent comprises water, an alcohol, or a combination comprising at least one of the foregoing solvents.

10. The process of claim 1, wherein the recess comprises:
a depth from the field surface to the distal position that is from 10 nm to 900 μm, and
an aspect ratio from 1 to 50.

11. The process of claim 1, wherein the recess comprises a through hole, a blind hole, or a combination comprising at least one of the foregoing recesses.

12. The process of claim 1, wherein the potential wave form comprises a potential-step wave form comprising:
a first potential with a first dwell time; and
a second potential with a second dwell time,
wherein the second potential is more negative than the first potential.

13. The process of claim 12, wherein the first dwell time is longer than the second dwell time.

14. The process of claim 1, wherein the potential wave form comprises a potential ramp.

15. The process of claim 14, wherein the potential ramp comprises a plurality of ramp rates.

16. A process for forming a transition zone terminated superconformal filling in a recess of a substrate by electrodepositing metal, the process comprising:
providing an electrodeposition composition comprising:
a metal electrolyte comprising a plurality of metal ions and a solvent; and
a suppressor disposed in the solvent;
providing the substrate comprising:
a field surface; and
the recess disposed in the substrate, the recess comprising a distal position and a proximate position relative to the field surface of the substrate;
exposing the recess to the electrodeposition composition;
galvanodynamically controlling an electric current between the recess and a counter electrode with a current wave form;
bifurcating the recess into an active metal deposition region and a passive region in response to galvanodynamically controlling the electric current;
forming, in response to bifurcating the recess, a transition zone at an interface of the active metal deposition region and the passive region;
changing the electric current at the recess by the current wave form;
progressively moving the transition zone closer to the field surface and away from the distal position in response to changing the electric current; and
reducing the metal ions to form metal and depositing the metal in the active metal deposition region and not in the passive region to form the transition zone terminated superconformal filling in the recess of the substrate, the transition zone terminated superconformal filling being:
void-free,
disposed in the recess in the active metal deposition region from the distal position to the transition zone,
comprising a v-notch, and
absent in the passive region between the proximate position and the transition zone,
wherein the electrodeposition composition has an S-shaped negative differential resistance cyclic voltammogram.

17. The process of claim 16, wherein the metal ions comprise $Co^{2+}$, $Ni^{2+}$, $Fe^{2+}$, $Au^{3+}$, $Ag^{+}$, $Sn^{2+}$, $Pb^{2+}$ or a combination comprising at least one of the foregoing metal ions, and
the metal comprises cobalt, gold, nickel, or a combination comprising at least one of the foregoing metals.

18. The process of claim 16, wherein the current wave form comprises a current ramp wave form.

* * * * *